(12) United States Patent
Sato et al.

(10) Patent No.: US 7,322,019 B2
(45) Date of Patent: Jan. 22, 2008

(54) ELECTRONIC CIRCUIT DESIGNING METHOD AND APPARATUS, AND STORAGE MEDIUM

(75) Inventors: Toshiro Sato, Kawasaki (JP); Kazumasa Kobayashi, Kawasaki (JP); Shogo Fujimori, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/190,721

(22) Filed: Jul. 9, 2002

(65) Prior Publication Data

US 2003/0014725 A1  Jan. 16, 2003

(30) Foreign Application Priority Data

Jul. 11, 2001 (JP) ............................. 2001-210671
Apr. 3, 2002 (JP) ............................. 2002-101646

(51) Int. Cl.
G06F 17/50 (2006.01)

(52) U.S. Cl. ......................................... 716/10; 716/11
(58) Field of Classification Search ................ 716/1–2, 716/5–18, 6
See application file for complete search history.

(56) References Cited

U.S. PATENT DOCUMENTS

| | | | | |
|---|---|---|---|---|
| 5,402,357 A | * | 3/1995 | Schaefer et al. | 716/12 |
| 5,559,997 A | | 9/1996 | Tsuchida et al. | |
| 5,572,717 A | * | 11/1996 | Pedersen | 713/500 |
| 5,610,833 A | * | 3/1997 | Chang et al. | 716/11 |
| 5,778,216 A | * | 7/1998 | Venkatesh | 713/503 |
| 6,058,252 A | * | 5/2000 | Noll et al. | 716/10 |
| 6,185,518 B1 | * | 2/2001 | Chen | 703/19 |
| 6,311,316 B1 | * | 10/2001 | Huggins et al. | 716/12 |
| 6,311,317 B1 | * | 10/2001 | Khoche et al. | 716/18 |
| 6,327,692 B1 | * | 12/2001 | Brown | 716/1 |
| 6,449,761 B1 | * | 9/2002 | Greidinger et al. | 716/11 |
| 6,457,167 B1 | * | 9/2002 | Kitahara | 716/18 |
| 6,539,531 B2 | * | 3/2003 | Miller et al. | 716/15 |
| 6,550,046 B1 | * | 4/2003 | Balasa et al. | 716/8 |
| 6,578,183 B2 | * | 6/2003 | Cheong et al. | 716/7 |
| 6,845,494 B2 | * | 1/2005 | Burks et al. | 716/6 |
| 2003/0088843 A1 | * | 5/2003 | Mehrotra et al. | 716/12 |

FOREIGN PATENT DOCUMENTS

| | | |
|---|---|---|
| JP | 2-136913 | 5/1990 |
| JP | 5-282225 | 10/1993 |
| JP | 5-334339 | 12/1993 |

(Continued)

OTHER PUBLICATIONS

Internet URL "NEONLINE Advanced Device News"; http://techon.nikkeibp.cojp/device/000627fujitsu_ signaladviser.html, Jun. 27, 2000.

(Continued)

Primary Examiner—Paul Dinh
(74) Attorney, Agent, or Firm—Staas & Halsey LLP

(57) ABSTRACT

An electronic circuit designing method and apparatus designs an electronic circuit by CAD, by generating design constraints with respect to the electronic circuit based on at least one of general layout and wiring information related to devices and wirings included in the electronic circuit, user requirements defined by a user, and user resources defined by the user, and urging an input to the user by displaying the design constraints.

24 Claims, 41 Drawing Sheets

FOREIGN PATENT DOCUMENTS

| | | |
|---|---|---|
| JP | 7-14927 | 1/1995 |
| JP | 11-182460 | 7/1995 |
| JP | 08-297689 | 11/1996 |
| JP | 10-247027 | 9/1998 |
| JP | 10-320219 | 12/1998 |
| JP | 11-008309 | 1/1999 |
| JP | 11-73444 | 3/1999 |
| JP | 11-184908 | 7/1999 |
| JP | 2000-207269 | 7/2000 |

OTHER PUBLICATIONS

Japanese Office Action issued priority Japanese Application No. 2002-101646 dated Jul. 17, 2007.

Internet URL "NEONLINE advanced Device News"; http://techon.nikkeibp.cojp/device/000627fujitsu_ signaladviser.html, Jun. 27, 2000.

* cited by examiner

FIG.7

| SUBSTRATE TECHNOLOGY | DEVICES USED | JUNCTION TEMPERATURES | | PRIORITY |
|---|---|---|---|---|

◉ STANDARD MULTI-LAYER   [DETAILED DEFINITION]   [1]

◉ IVH MULTI-LAYER   [DETAILED DEFINITION]   [2]

○ BUILD-UP

| RS=53Ω | | WIRING SPECIFICATIONS | | |
|---|---|---|---|---|
| 3cm≦la≦10cm | | seg.a | seg.b | seg.c |
| | WIRING LAYER | Layer 1 | Layer 2 | Layer 3 |
| 2cm≦lb≦4cm | WIRING WIDTH | 100 μm | 80 μm | 100 μm |
| 2cm≦lc≦4cm | | | | |
| \|lb−lc\|≦1cm | | | | |

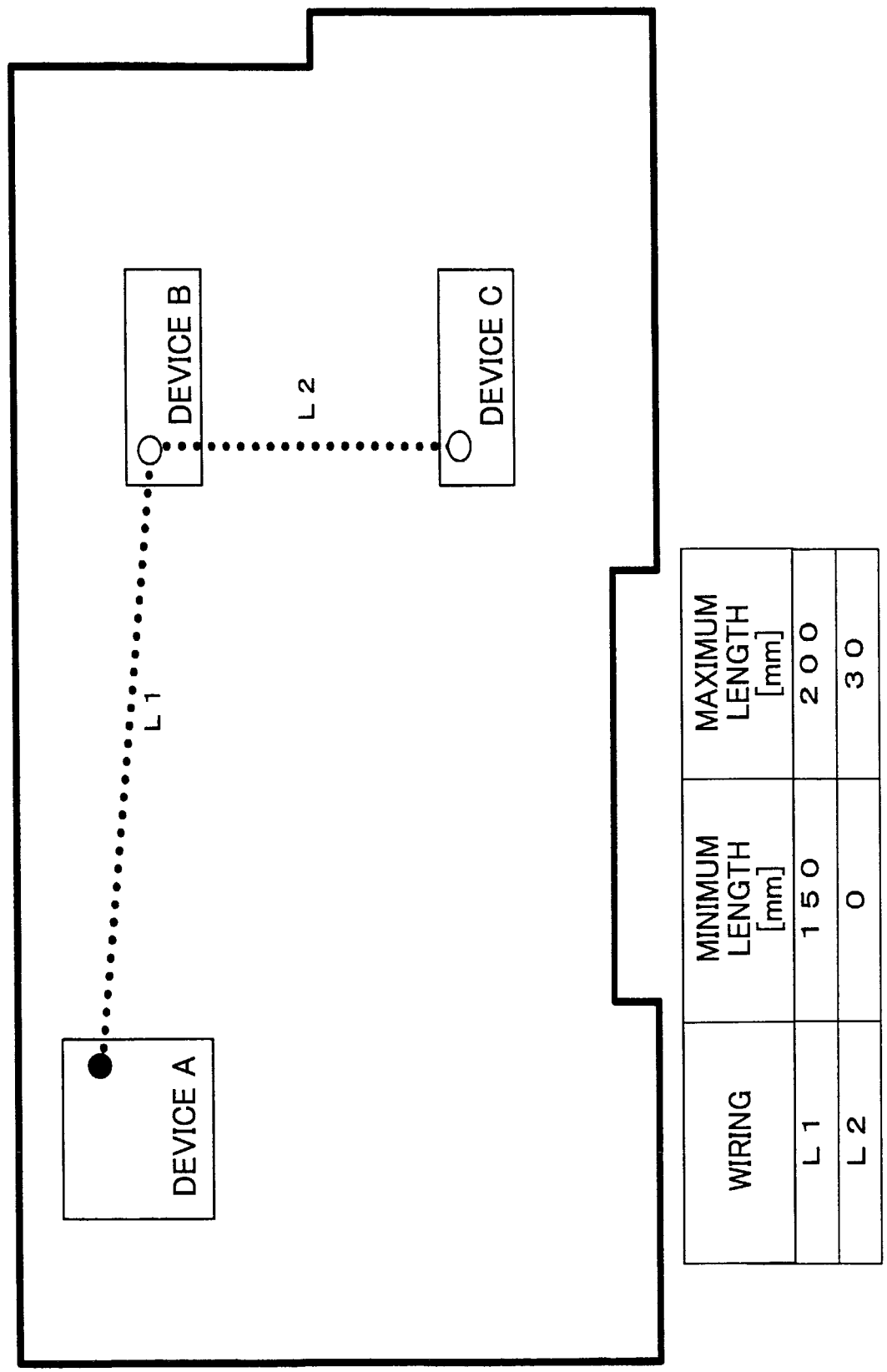

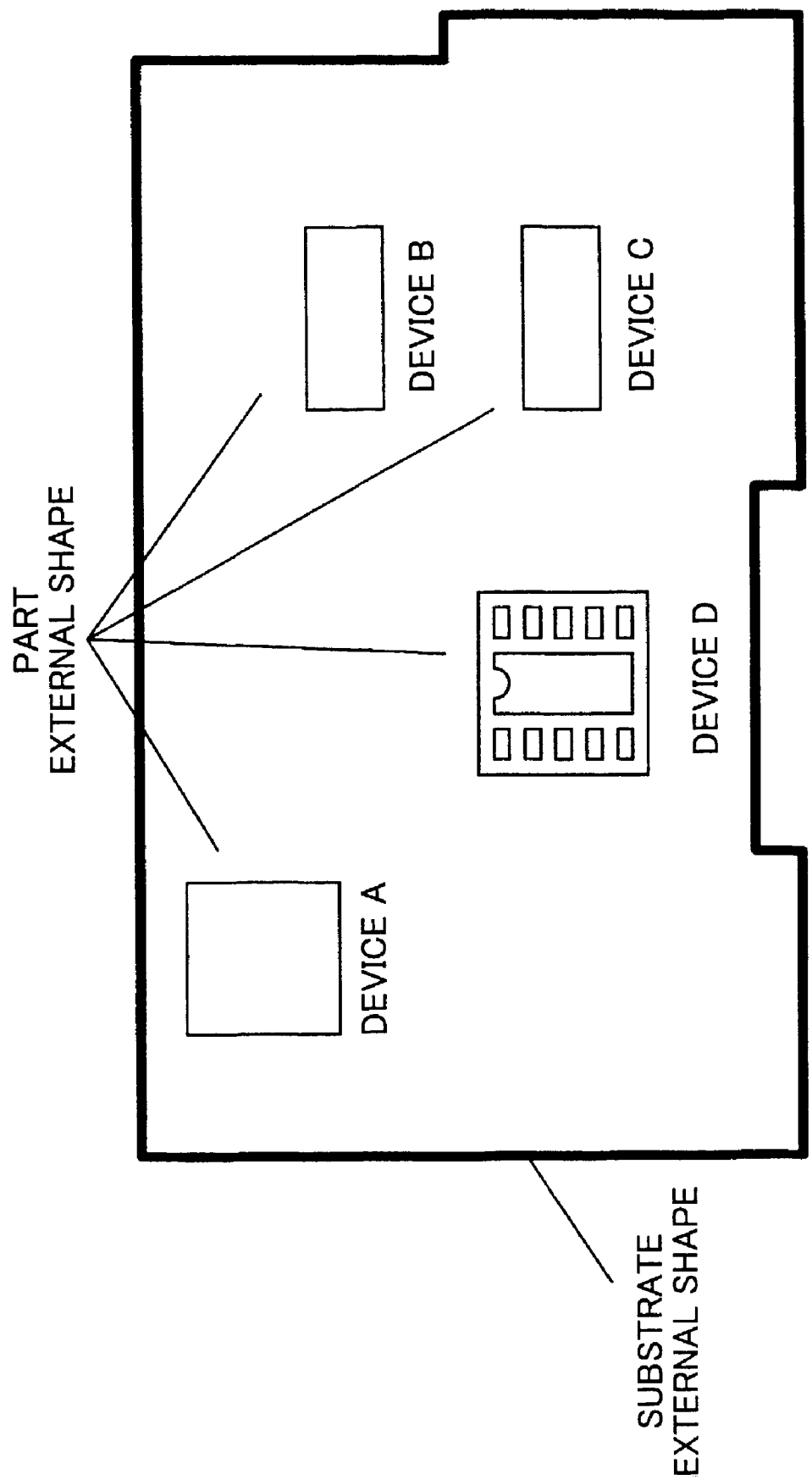

SECTIONING INTO 8

505

504

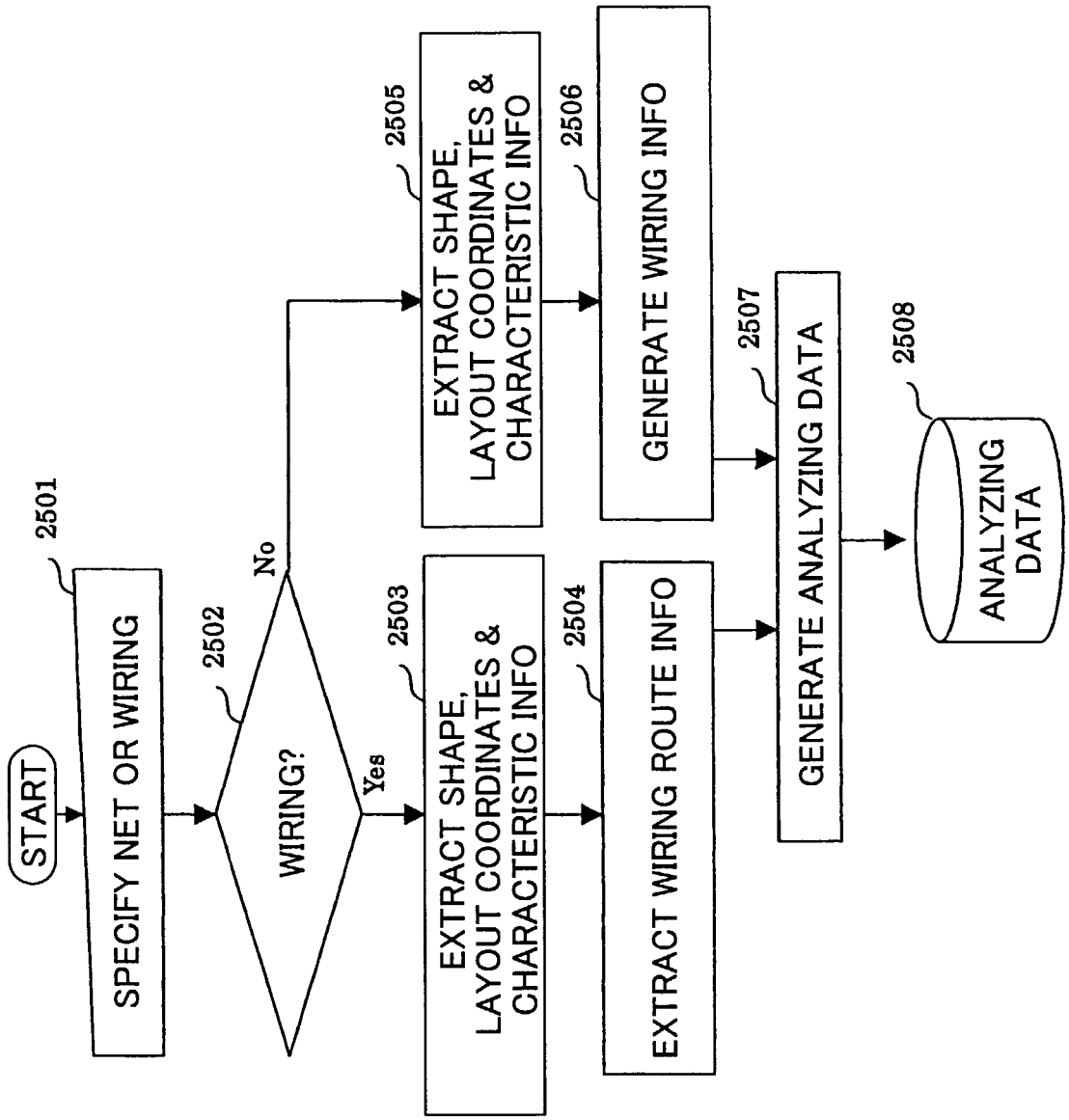

ELECTRONIC CIRCUIT DESIGNING METHOD AND APPARATUS, AND STORAGE MEDIUM

BACKGROUND OF THE INVENTION

This application claims the benefit of Japanese Patent Applications No.2001-210671 filed Jul. 11, 2001 and No.2002-101646 filed Apr. 3, 2002, in the Japanese Patent Office, the disclosures of which are hereby incorporated by reference.

1. Field of the Invention

The present invention generally relates to electronic circuit designing methods and apparatuses and storage media, and more particularly to an electronic circuit designing method and an electronic circuit designing apparatus for designing an electronic circuit such as large scale integrated circuits (LSIs), multi chip modules (MCMs) and printed circuit boards (PCBs), and to a computer-readable storage medium which stores a program for causing a computer to carry out such a designing of the electronic circuit.

2. Description of the Related Art

When designing an electronic circuit using computer-aided design (CAD), the design procedure includes a first step which determines the general layout and general wiring, a second step which inserts logic circuits into the circuit, a third step which edits the layout and wiring of the circuit, and a fourth step which analyzes the characteristics of the circuit and the wiring. The second and third steps are carried out based on design constraints related to the layout and the wiring. The design constraints are created by a skilled circuit designer (person) using various analyzing tools.

According to the conventional electronic circuit designing method, the design constraints are created by the circuit designer, as described above. For this reason, there is a first problem in that the design quality of the circuit is greatly dependent on the skill of the circuit designer. In other words, the design quality becomes inconsistent depending on the skilled level of the circuit designers, and the design time increases due to design corrections which need to be made depending on the skilled level of the circuit designer.

On the other hand, the circuit designer and the layout designer may be different. For this reason, when a circuit which satisfies the design constraints cannot be designed in the third step, the circuit designer and the layout designer must consult with each other and look over the design constraints again. However, such an operation of looking over the design constraints needs to be repeated many times in most cases, and there is a second problem in that the deign time is considerably increased thereby.

SUMMARY OF THE INVENTION

Accordingly, it is a general object of the present invention to provide a novel and useful electronic circuit designing method, electronic circuit designing apparatus and computer-readable storage medium, in which the problems described above are eliminated.

Another and more specific object of the present invention is to provide an electronic circuit designing method, an electronic circuit designing apparatus and computer-readable storage medium, which can eliminate the first problem and/or the second problem described above.

Still another object of the present invention is to provide an electronic circuit designing method for designing an electronic circuit by CAD, comprising the steps of (a) generating design constraints with respect to the electronic circuit based on at least one of general layout and wiring information related to devices and wirings included in the electronic circuit, user requirements defined by a user, and user resources defined by the user; and (b) urging an input to the user by displaying the design constraints.

The user requirements may include at least one of requirements selected from a group consisting of signal integrity and delay, electromagnetic interference and/or electromagnetic compatibility limitations, junction temperature, cost and reliability.

The user resources may include at least one of resources selected from a group consisting of substrate specifications, device specifications and junction temperatures.

The step (a) may include setting initial values of the design constraints or listing candidates of a rule-based solution on a display; making an analysis using an analyzing tool by changing parameter values in a predetermined range, and enlarging a search range by searching a solution space satisfying the user requirements or, carrying out a simulation using the analyzing tool so as to narrow the solution satisfying the user requirements; and generating and displaying a plurality of candidates of the design constraints on the display with respect to the user.

A further object of the present invention is to provide an electronic circuit designing apparatus for designing an electronic circuit by CAD, comprising generating means for generating design constraints with respect to the electronic circuit based on at least one of general layout and wiring information related to devices and wirings included in the electronic circuit, user requirements defined by a user, and user resources defined by the user; and urging means for urging an input to the user by displaying the design constraints.

Another object of the present invention is to provide a computer-readable storage medium which stores a program for causing a computer to design an electronic circuit by CAD, where the program comprises a generating procedure causing the computer to generate design constraints with respect to the electronic circuit based on at least one of general layout and wiring information related to devices and wirings included in the electronic circuit, user requirements defined by a user, and user resources defined by the user; and an urging procedure causing the computer to urge an input to the user by displaying the design constraints.

Still another object of the present invention is to provide an electronic circuit designing method for designing an electronic circuit by CAD, comprising the steps of (a) obtaining initial values of design constraints with respect to the electronic circuit; (b) making an analysis by changing parameter values in a predetermined range, so as to enlarge or reduce the initial values of the design constraints; and (c) generating the design constraints by automatically enlarging or reducing the initial values of the design constraints by automatically changing the parameter values, based on device layout constraint definitions including at least one of definitions related to a device layout prohibited region and a movable region of each device.

A further object of the present invention is to provide an electronic circuit designing apparatus for designing an electronic circuit by CAD, comprising means for obtaining initial values of design constraints with respect to the electronic circuit; means for making an analysis by changing parameter values in a predetermined range, so as to enlarge or reduce the initial values of the design constraints; and means for generating the design constraints by automatically enlarging or reducing the initial values of the design constraints by automatically changing the parameter values, based on device layout constraint definitions including at least one of definitions related to a device layout prohibited region and a movable region of each device.

Another object of the present invention is to provide a computer-readable storage medium which stores a program for causing a computer to design an electronic circuit by CAD, where the program comprises a procedure causing the computer to obtain initial values of design constraints with respect to the electronic circuit; a procedure causing the computer to make an analysis by changing parameter values in a predetermined range, so as to enlarge or reduce the initial values of the design constraints; and a procedure causing the computer to generate the design constraints by automatically enlarging or reducing the initial values of the design constraints by automatically changing the parameter values, based on device layout constraint definitions including at least one of definitions related to a device layout prohibited region and a movable region of each device.

Still another object of the present invention is to provide a computer-readable storage medium which stores a program for causing a computer to design an electronic circuit by CAD, where the program comprises a procedure causing the computer to display general layout and wiring information related to devices and wirings included in the electronic circuit; and a procedure causing the computer to wire, edit and display a plurality of wiring patterns forming a bus as a region, when displaying the general layout and wiring information.

A further object of the present invention is to provide a computer-readable storage medium which stores a program for causing a computer to design an electronic circuit by CAD, where the program comprises a procedure causing the computer to display general layout and wiring information related to devices and wirings included in the electronic circuit; and a procedure causing the computer to display a plurality of nets forming a bus as a region, in a net display which represents a connection relationship of pins of parts included in the electronic circuit, when displaying the general layout and wiring information.

Still another object of the present invention is to provide a computer-readable storage medium which stores a program for causing a computer to design an electronic circuit by CAD, where the program comprises a procedure causing the computer to display general layout and wiring information related to devices and wirings included in the electronic circuit; a procedure causing the computer to specify values of a number of patterns forming a bus, a pattern pitch and a pattern width, when displaying the general layout and wiring information; and a procedure causing the computer to display a region with a width based on the specified values.

A further object of the present invention is to provide a computer-readable storage medium which stores a program for causing a computer to design an electronic circuit by CAD, where the program comprises a procedure causing the computer to display general layout and wiring information related to devices and wirings included in the electronic circuit; and a procedure causing the computer to display at least one pattern as a representative pattern within a bus region which represents a wiring pattern as a region, when displaying the general layout and wiring information.

Another object of the present invention is to provide a computer-readable storage medium which stores a program for causing a computer to design an electronic circuit by CAD, where the program comprises a procedure causing the computer to display general layout and wiring information related to devices and wirings included in the electronic circuit; and a procedure causing the computer to display at least one net as a representative net within a bus region which represents a connecting net as a region, when displaying the general layout and wiring information.

Still another object of the present invention is to provide a computer-readable storage medium which stores a program for causing a computer to design an electronic circuit by CAD, where the program comprises a procedure causing the computer to display general layout and wiring information related to devices and wirings included in the electronic circuit; and a procedure causing the computer to create and display a plurality of pins within a part included in the electronic circuit as a region, when displaying the general layout and wiring information.

A further object of the present invention is to provide a computer-readable storage medium which stores a program for causing a computer to design an electronic circuit by CAD, where the program comprises a procedure causing the computer to display general layout and wiring information related to devices and wirings included in the electronic circuit; and a procedure causing the computer to generate, when creating a pin region included in the electronic circuit, the pin region by identifying a range where a region is definable by specifying a pin region layout type of a part, when displaying the general layout and wiring information.

Another object of the present invention is to provide a computer-readable storage medium which stores a program for causing a computer to design an electronic circuit by CAD, where the program comprises a procedure causing the computer to display general layout and wiring information related to devices and wirings included in the electronic circuit; and a procedure causing the computer to display at least one pin as a representative pin within a pin region included in the electronic circuit, when displaying the general layout and wiring information.

Still another object of the present invention is to provide a computer-readable storage medium which stores a program for causing a computer to design an electronic circuit by CAD, where the program comprises a procedure causing the computer to display general layout and wiring information related to devices and wirings included in the electronic circuit; and a procedure causing the computer to create and display a via, which connects to each of a plurality of wiring patterns forming a bus, as a region, when displaying the general layout and wiring information.

A further object of the present invention is to provide a computer-readable storage medium which stores a program for causing a computer to design an electronic circuit by CAD, where the program comprises a procedure causing the computer to display general layout and wiring information related to devices and wirings included in the electronic circuit; and a procedure causing the computer to display at least one via as a representative via within a via region included in the electronic circuit, when displaying the general layout and wiring pattern.

Another object of the present invention is to provide a computer-readable storage medium which stores a program for causing a computer to design an electronic circuit by CAD, where the program comprises a procedure causing the computer to display general layout and wiring information related to devices and wirings included in the electronic circuit; and a procedure causing the computer to specify and change a shape of a via region which is included in the electronic circuit by taking into consideration a diameter, layout pitch and layout position of vias, when displaying the general layout and wiring pattern.

Still another object of the present invention is to provide a computer-readable storage medium which stores a program for causing a computer to design an electronic circuit by CAD, where the program comprises a procedure causing the computer to display general layout and wiring information related to devices and wirings included in the electronic circuit; and a procedure causing the computer to create and display, when inserting the same part in each of a plurality of wiring patterns forming a bus or a connecting net, a part which is to be connected, as a region, when displaying the general layout and wiring information.

A further object of the present invention is to provide a computer-readable storage medium which stores a program for causing a computer to design an electronic circuit by CAD, where the program comprises a procedure causing the computer to display general layout and wiring information related to devices and wirings included in the electronic circuit; and a procedure causing the computer to specify and change a shape of a part region which is included in the electronic circuit by taking into consideration a part external shape, layout pitch and layout position, when displaying the general layout and wiring information.

Another object of the present invention is to provide a computer-readable storage medium which stores a program for causing a computer to design an electronic circuit by CAD, where the program comprises a procedure causing the computer to display general layout and wiring information related to devices and wirings included in the electronic circuit; and a procedure causing the computer to display at least one part shape as a representative part within a part region which is included in the electronic circuit, when displaying the general layout and wiring information.

Still another object of the present invention is to provide a computer-readable storage medium which stores a program for causing a computer to design an electronic circuit by CAD, where the program comprises a procedure causing the computer to display general layout and wiring information related to devices and wirings included in the electronic circuit; and a procedure causing the computer to connect a via region, a bus region, a pin region and a part region included in the electronic circuit, when displaying the general layout and wiring information.

A further object of the present invention is to provide a computer-readable storage medium which stores a program for causing a computer to design an electronic circuit by CAD, where the program comprises a procedure causing the computer to display general layout and wiring information related to devices and wirings included in the electronic circuit; a procedure causing the computer to make an analysis using an analyzing tool based on information related to a representative pin, a representative pattern or representative net, a representative via and a representative part included in the electronic circuit, when displaying the general layout and wiring information; and a procedure causing the computer to create design constraints of wirings forming a bus based on a result of the analysis.

Another object of the present invention is to provide a computer-readable storage medium which stores a program for causing a computer to design an electronic circuit by CAD, where the program comprises a procedure causing the computer to display general layout and wiring information related to devices and wirings included in the electronic circuit; and a procedure causing the computer to make a crosstalk noise analysis based on data related to layout and wiring using a bus region, a part pin region and a via region included in the electronic circuit and information related to a wiring pitch set for the bus region, and to create design constraints of a bus based on a result of the crosstalk noise analysis.

According to the present invention, it is possible to design the electronic circuit so that the quality of the circuit design is not greatly dependent upon the degree of skill of the circuit designer and/or to prevent the design time from increasing due to repetition of the operation of reviewing the design constraints.

Other objects and further features of the present invention will be apparent from the following detailed description when read in conjunction with the accompanying drawings.

BRIEF DESCRIPTION OF THE DRAWINGS

FIG. 7 is a diagram showing a user resource setting screen;

FIG. 20 is a diagram for explaining generated design constraints;

FIG. 21 is a diagram showing a state where substrate external shape and part external shape are created by the general floor planner;

FIG. 44 is a flow chart for explaining an analyzing data generating process;

DESCRIPTION OF THE PREFERRED EMBODIMENTS

Figure 1:
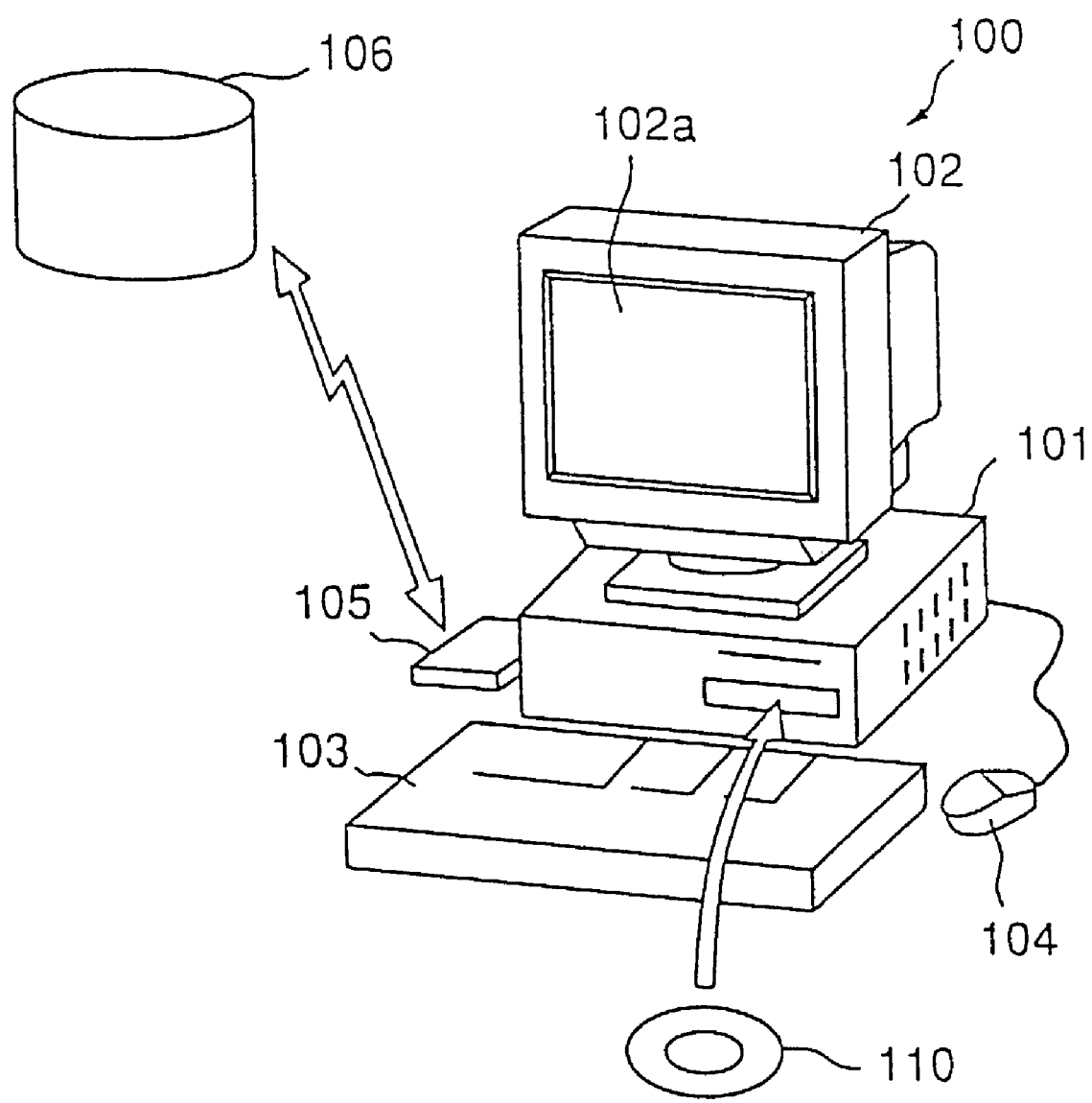
FIG. 1 is a perspective view showing a computer system applied with an embodiment of the present invention.

A description will be given of various embodiments of an electronic circuit designing method according to the present invention, an electronic circuit designing apparatus according to the present invention, and a computer-readable storage medium according to the present invention, by referring to the drawings.

First, a description will be given of an embodiment of the electronic circuit designing apparatus according to the present invention. This embodiment of the electronic circuit designing apparatus employs an embodiment of the electronic circuit designing method according to the present invention and an embodiment of the computer-readable storage medium according to the present invention. In this embodiment, the present invention is applied to a computer system. FIG. 1 is a perspective view showing the computer system applied with the present invention in this embodiment.

A computer system 100 shown in FIG. 1 generally includes a main body 101 which includes a CPU, a disk drive and the like, a display 102 having a display screen 102a which displays an image in response to an instruction from the main body 101, a keyboard 103 for inputting various information to the computer system 100, a mouse 104 for specifying an arbitrary position on the display screen 102a of the display 102, and a modem 105 for accessing an external database or the like and downloading a computer program or the like stored in another computer system.

A computer program (electronic circuit designing software) for causing the computer system 100 to have an electronic circuit designing function is stored in a portable recording medium such as a disk 110 or, is downloaded from a recording medium 106 of another computer system using a communication apparatus such as the modem 105. This computer program is input to the computer system 100 and compiled. The computer-readable storage medium according to the present invention is formed by a recording medium such as the disk 110 which stores the computer program (hereinafter simply referred to as a program). The recording medium forming the computer-readable storage medium according to the present invention is not limited to a portable recording medium such as the disk 110, IC card memory, floppy disk, magneto-optical disk and CD-ROM, and various kinds of recording media accessible by a computer system which is connected via a communication means or a communication apparatus such as the modem 105 or LAN, may be used.

Figure 2:
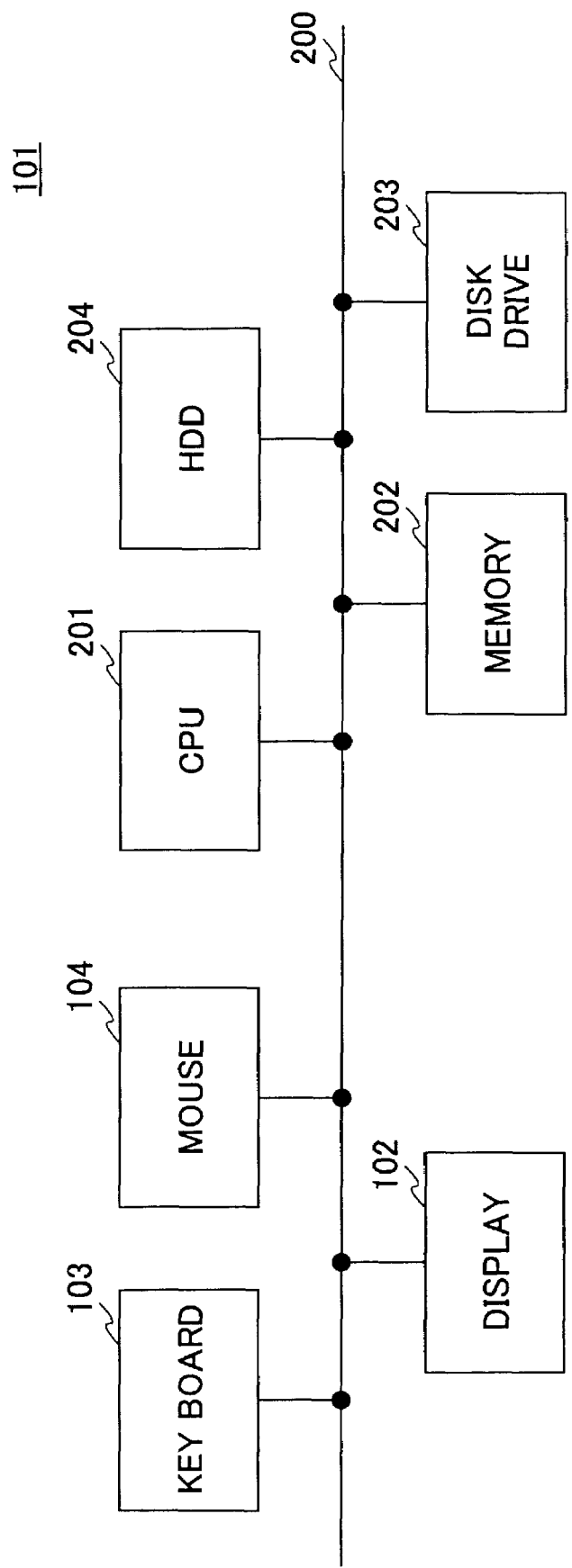
FIG. 2 is a system block diagram for explaining the structure of an important part within a main body of the computer system.

FIG. 2 is a system block diagram for explaining the structure of an important part within the main body 101 of the computer system 100. The main body 101 shown in FIG. 2 generally includes a CPU 201, a memory section 202 including a RAM, a ROM or the like, a disk drive 203 for the disk 110, and a hard disk drive (HDD) 204 which are connected via a bus 200. In this embodiment, the display 102, the keyboard 103 and the mouse 104 are connected to the CPU 201 via the bus 200 as shown in FIG. 2, but the display 102, the keyboard 103 and the mouse 104 may be connected directly to the CPU 201. In addition, the display 102 may be connected to the CPU 201 via a known graphic interface (not shown) which processes input and output image data.

Of course, the structure of the computer system 100 is not limited to that shown in FIGS. 1 and 2, and various other known structures may be used instead.

Figure 3:
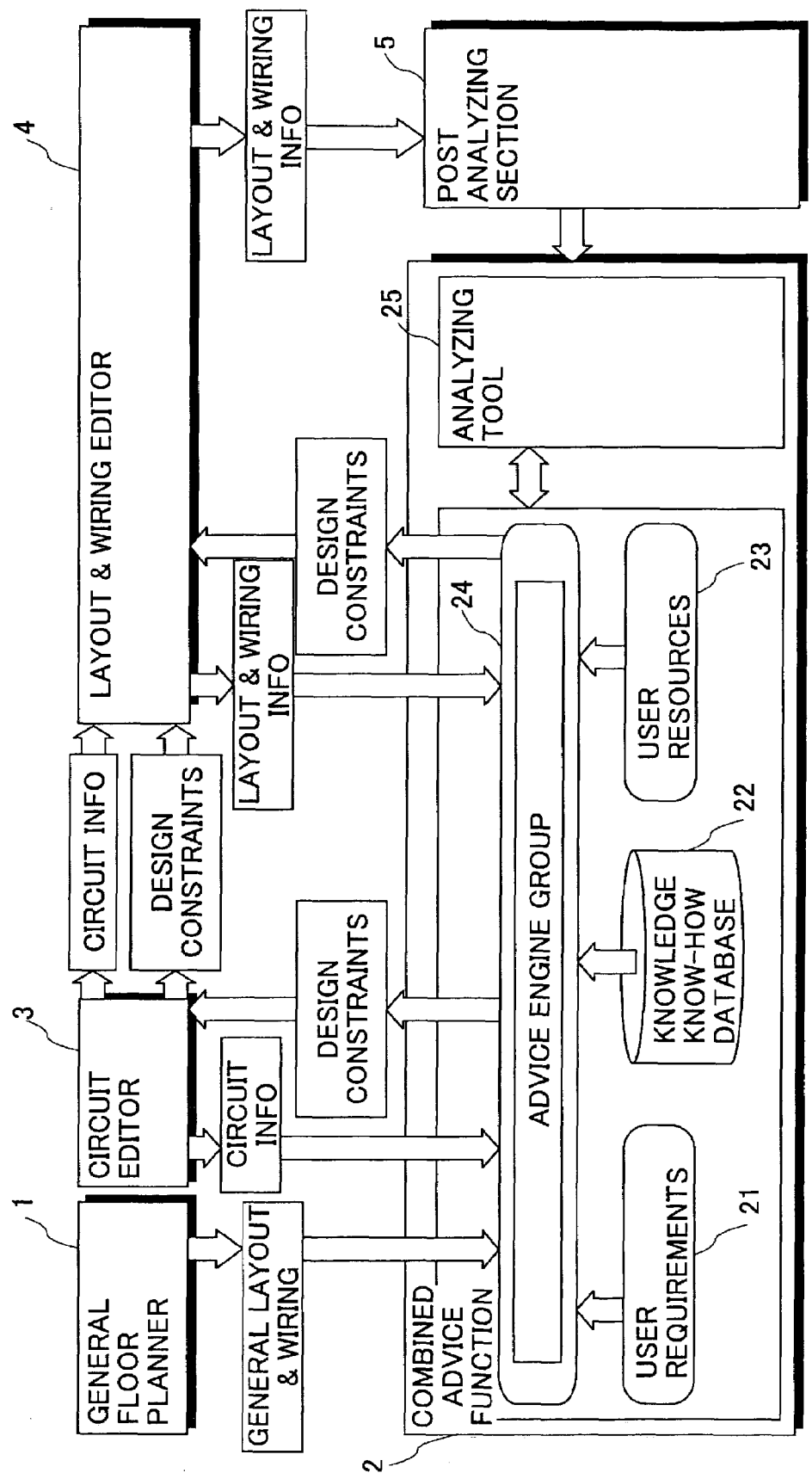
FIG. 3 is a functional block diagram showing an electronic circuit designing apparatus formed by the computer system.

FIG. 3 is a functional block diagram showing an electronic circuit designing apparatus formed by the computer system 100. The electronic circuit designing apparatus shown in FIG. 3 generally includes a general floor planner 1, a combined advice function 2, a circuit editor 3, a layout and wiring editor 4, and a post analyzing section 5.

The general floor planner 1 has a function of inputting or displaying general layout and wiring information related to devices and wirings, and a function of outputting the general layout and wiring information to the combined advice function 2. The general layout and wiring information includes simple registration information related to substrate external shapes and device external shapes registered by the user, a device mounting position definition defined by the user, and the like. The simple registration information which is related to the substrate external shapes and the device external shapes and registered by the user, is a general external dimension definition which represents by approximation the substrate external shapes and the device external shapes with an operation ease similar to a general drawing software such as PowerPoint (product name) of Microsoft. In addition, the device mounting position definition defined by the user, is a general layout (coordinate) definition. It is possible to position the device external shapes by using a simple moving function of PowerPoint, for example, based on the device mounting position definition defined by the user. The general layout and wiring information may coexist with detailed external shape information for the layout and wiring editor 4 which will be described later.

When determining the layout and wiring constraints which will be described layer, coordinates of input and output terminals (I/O pins) of the electronic circuit are necessary, but a strict coordinate definition is not always required. Accordingly, in this embodiment, the coordinates of each I/O pin is determined using the simple moving function of PowerPoint or the like.

Figure 4:
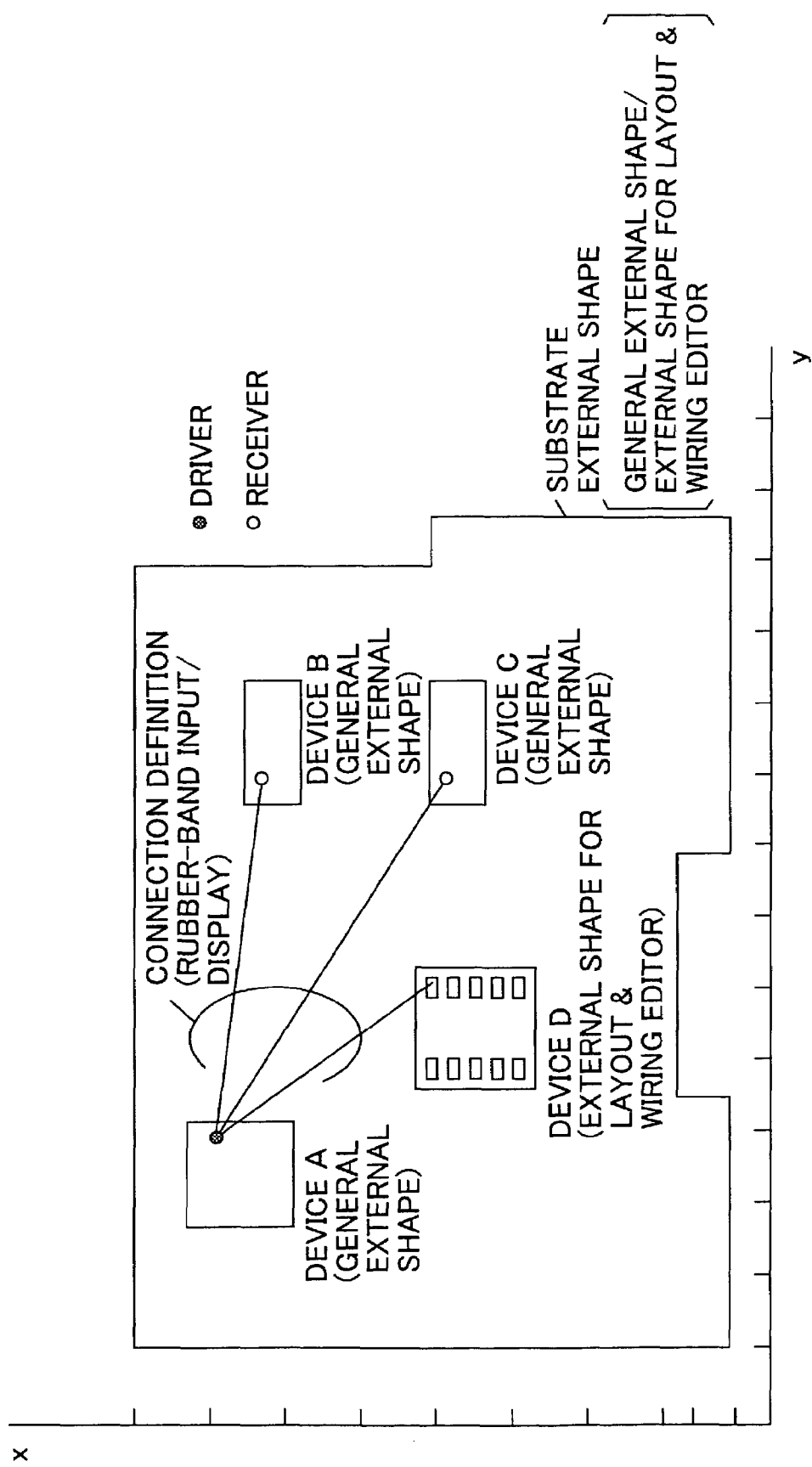
FIG. 4 is a diagram for explaining a screen input of a general floor planner.

FIG. 4 is a diagram for explaining a screen input of the general floor planner 1. FIG. 4 shows an image displayed on the display screen 102a of the display 102, and for example, xy coordinate axes, a substrate external shape indicated by a bold solid line, and devices A through D of an electronic circuit indicated by a thin solid line are shown. The displayed image is input by operating the keyboard 103 and the mouse 104. The substrate external shape includes an external shape dimension definition of the general external shape, and detailed external shape information for the layout and wiring editor 4. The devices A, B and C respectively include the external shape dimension definition of the general external shape. In addition, the device D includes the detailed external shape information for the layout and wiring editor 4. The device A includes a driver indicated by a meshed circular mark, and is connected to the devices B through D by connection definitions. The connection definition is displayed by a rubber-band input by operating the mouse 104. The devices B and C respectively include a receiver indicated by a (white or non-meshed) circular mark, and the device D includes IC pads indicated by rectangular marks. Information of the IC pads is included in the detailed external shape information for the layout and wiring editor 4. Accordingly, the general layout and wiring information including the general external shape of the substrate external shape and the devices A through C, may coexist with the detailed external shape information of the substrate external shape and the device D for the layout and wiring editor 4.

The combined advice function 2 shown in FIG. 3 includes an advice engine group 24 which generates design constraints based on the general layout and wiring information received from the general floor planner 1, using user requirements (conditions) 21, a knowledge know-how database 22, user resources 23 and an analyzing tool 25. The design constraints generated by the advice engine group 24 are output to the circuit editor 3. In addition, the advice engine group 24 of the combined advice function 2 generates design constraints based on the circuit information from the circuit editor 3, the layout and wiring information from the layout and wiring editor 4 and the analysis result from the post analyzing section 5, and outputs the generated design constraints to the layout and wiring editor 4.

The user requirements 21 include performances such as the operation frequency and delay of signals including clocks (hereinafter referred to as "signal integrity and delay"), electromagnetic interference (EMI) and/or electromagnetic compatibility (EMC) limitations, junction temperature, cost, reliability and the like. The knowledge know-how database 22 stores data for generating various kinds of advice related to changes and the like to be notified from the advice engine group 24 to the user. The user requirements 21 are input by the user using the keyboard 103 and/or the mouse 104, and is stored in the memory section 202 or the like, for example. Further, it is possible to prestore the user requirements 21 in the memory section 202 or the like, and have the user select the desired user requirements from the user requirements 21 which are read from the memory section 202 and displayed on the display screen 102a of the display 102.

The knowledge know-how database 22 may be formed by a known knowledge database, and is prestored in the memory section 202 or the like, for example.

The user resources 23 include substrate specifications, device specifications, junction temperatures and the like. The substrate specifications include the substrate technology, number of layers, layer structure, thickness, via and land specifications, minimum line width, minimum pitch and the like. The device specifications include the kind of device, electrical characteristic, power consumption characteristic, device package and method or kind of thermal conduction, kind of heat radiator fins, reliability, cost and the like. The junction temperatures include the ambient temperature, air supplying structure, fan specifications, air flow direction, amount of air flow and the like. The user resources 23 are input by the user using the keyboard 103 and/or the mouse 104, and are stored in the memory section 202, for example. It is possible to prestore the user resources 23 in the memory section 202 or the like, and have the user select the desired user resources from the user resources 23 which are read from the memory section 202 and displayed on the display screen 102a of the display 102.

The analyzing tool 25 carries out various kinds of analysis, including signal integrity analysis, radio wave analysis, thermal analysis, cost analysis and the like. The analyzing tool 25 may be formed by a known analyzing tool.

Figure 5:
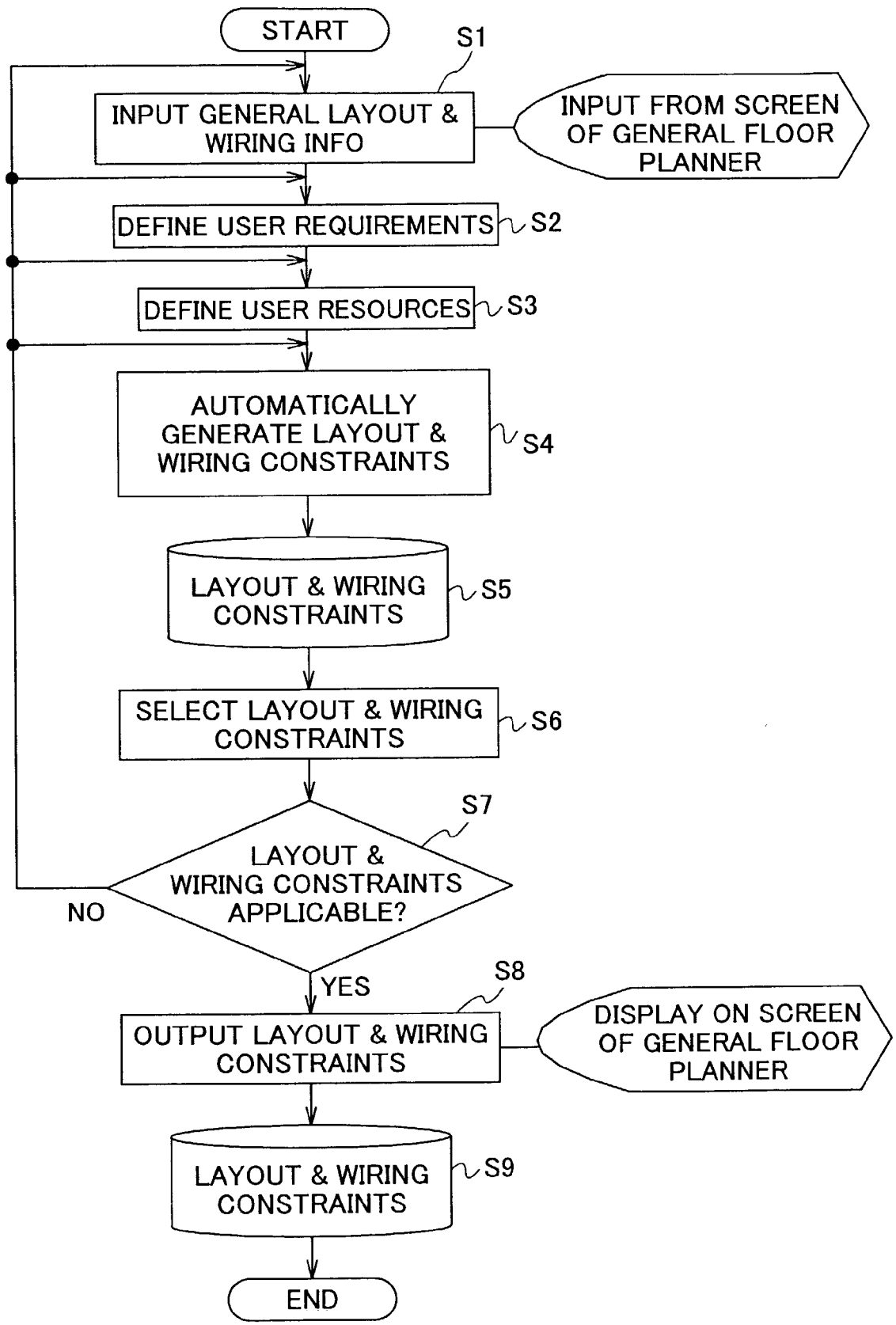
FIG. 5 is a flow chart for explaining a design constraint condition generating process.

FIG. 5 is a flow chart for explaining a design constraint condition generating process of the advice engine group 24 in the combined advice function 2. The process shown in FIG. 5 is carried out by the CPU 201.

In FIG. 5, a step Si inputs the general layout and wiring information, based on the screen input of the general floor planner 1 displayed on the display screen 102a of the display 102. A step S2 defines the user requirements 21, and a step S3 defines the user resources 23.

Figure 6:
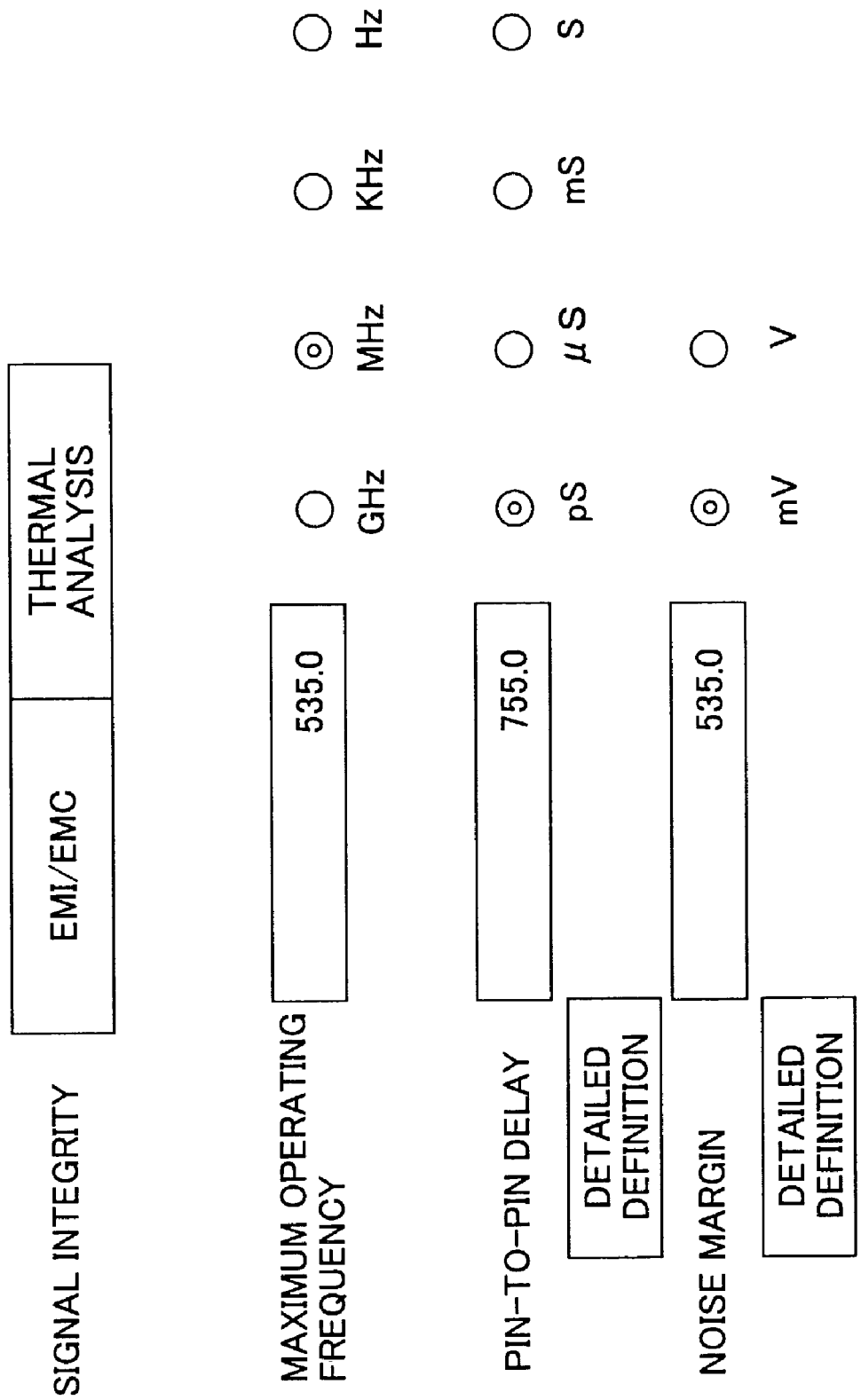
FIG. 6 is a diagram showing a user requirement setting screen.

FIG. 6 is a diagram showing a user requirement setting screen. The user requirement setting screen shown in FIG. 6 is displayed on the display screen 102a of the display 102, and the user requirements 21 are defined in the step S2 based on the spread-form user requirement input from the keyboard 103 and/or the mouse 104. For the sake of convenience, FIG. 6 shows the user requirement setting screen which can set the maximum operation frequency, the pin-to-pin delay and the noise margin with respect to user requirement items which include the signal integrity, the EMI and/or EMC limitations and the thermal analysis (junction temperatures).

FIG. 7 is a diagram showing a user resource setting screen. The user resource setting screen shown in FIG. 7 is displayed on the display screen 102a of the display 102, and the user resources 23 are defined in the step S3 based on the spread-form user resource input from the keyboard 103 and/or the mouse 104. For the sake of convenience, FIG. 7 shows the user resource setting screen which can set the standard multilayer, the IVH multilayer and the build-up together with priority information indicating the respective priorities, with respect to the user resource items which include the substrate technology, the devices used and the junction temperatures. Accordingly, the user resource items can be selected in an order according to priority starting from the user resource item having the highest priority.

A step S4 shown in FIG. 5 automatically generates a plurality of layout and wiring constraints, as the design constraints, based on the input general layout and wiring information, the defined user requirements 21 and the defined user resources 23 (user resource items) selected in the order according to priority starting from the user resource (item) having the highest priority. A step S5 stores the plurality of layout and wiring constraints which are generated into the memory section 202 or the like. A step S6 selects the desired layout and wiring constraint condition or conditions from the plurality of layout and wiring constraints which are read from the memory section 202 or the like and are displayed on the display screen 102a of the display 102.

A step S7 decides whether or not the selected layout and wiring constraints can actually be applied to the design. This decision of the step S7 is made by the user. If the decision result in the step S7 is NO, at least one of the general layout and wiring information input in the step S1, the user requirements 21 defined in the step S2 and the user resources 23 defined in the step S3 is appropriately changed. On the other hand, if the decision result in the step S7 is YES, a step S8 outputs and displays the generated layout and wiring constraints on the display screen 102a of the display 102, so as to urge the user to make an input. A step S9 stores the layout and wiring constraints in the memory section 202 or the like.

Figure 8:
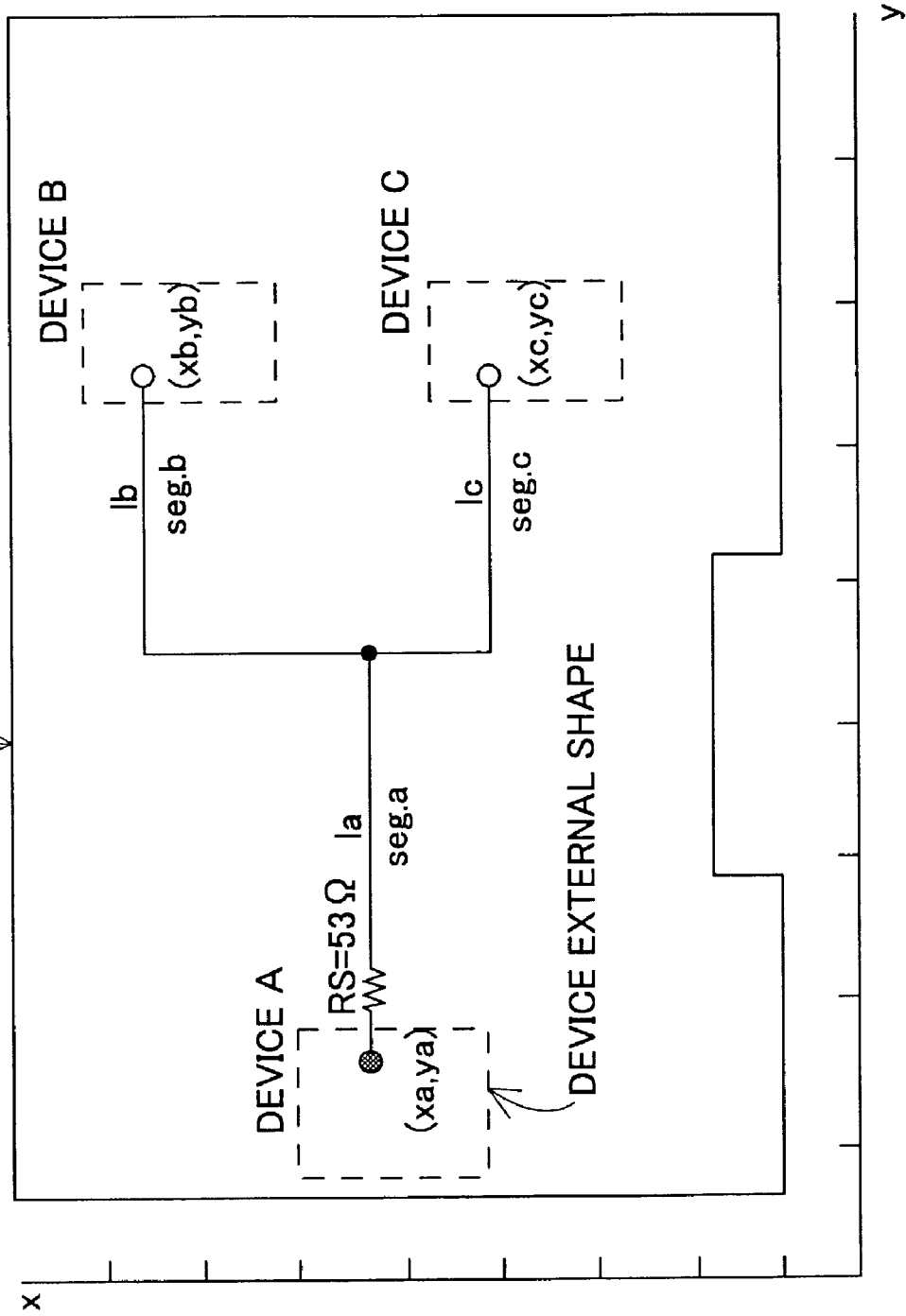
FIG. 8 is a diagram for explaining a description method of design constraints.

FIG. 8 is a diagram for explaining a description method of design constraints. FIG. 8 shows a case where the design constraints are the layout and wiring constraints described above. FIG. 8 shows an image displayed on the display screen 102a of the display 102, and for example, the xy coordinate axes, the substrate external shape indicated by a solid line, the device external shapes of the devices A through C indicated by a dotted solid line, the coordinates (xa, ya) of the driver of the device A, the coordinates (xb, yb) of the receiver of the device B, the coordinates (xc, yc) of the receiver of the device C, a resistor RS connected to the driver of the device A and having the resistance of 53Ω, the wiring segment seg.a and the wiring length $1a$ thereof, the wiring segment seg.b and the wiring length $1a$ thereof, the wiring segment seg.c and the wiring length $1c$ thereof, and the like are displayed as the layout and wiring constraints.

Figures 9, 10:
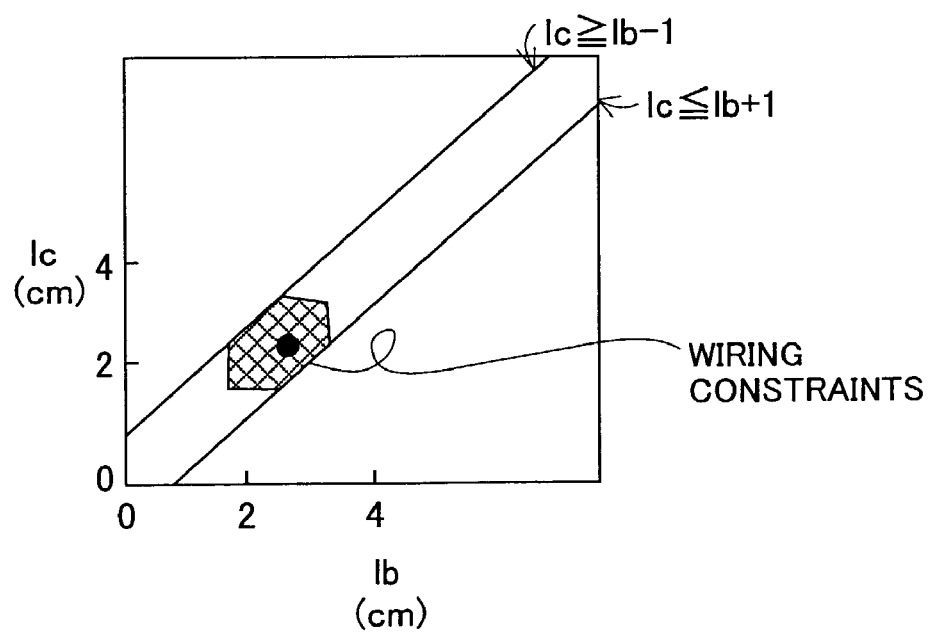
FIG. 9 is a diagram for explaining a mathematical expression of the design constraints.
FIG. 10 is a diagram for explaining a graph representation of the design constraints.

FIG. 9 is a diagram for explaining a mathematical expression of the design constraints. FIG. 9 shows a case where the design constraints are the wiring constraints. As shown in FIG. 9, the resistance RS=53Ω of the resistor RS, the wiring length 3 cm$\leq 1a \leq$10 cm of the wiring segment seg.a, the wiring length 2 cm$\leq 1b \leq$4 cm of the wiring segment seg.b, the wiring length 2 cm$\leq 1c \leq$4 cm of the wiring segment seg.c, and an absolute value $|1b-1c|\leq 1$ cm of the difference of the wiring lengths $1b$ and $1c$ are displayed on the display screen 102a of the display 102 as the design constraints expressed by the mathematical expression. In addition, wiring layers Layer1, Layer2 and Layer3 and wiring widths of 100 μm, 80 μm and 100 μm with respect to the wiring segments seg.a, seg.b and seg.c are respectively displayed as the wiring specifications.

FIG. 10 is a diagram for explaining a graph representation of the design constraints. As shown in FIG. 10, the wiring constraints indicated by the meshed portion are displayed on the display screen 102a of the display 102. In FIG. 10, the ordinate indicates the wiring length $1c$ (cm) of the wiring segment seg.c, and the abscissa indicates the wiring length $1b$ (cm) of the wiring segment seg.b. Sloping solid lines limiting the wiring constraints indicated by the meshed portion respectively indicate $1c \geq 1b-1$ and $1c \leq 1b+1$.

Figure 11:
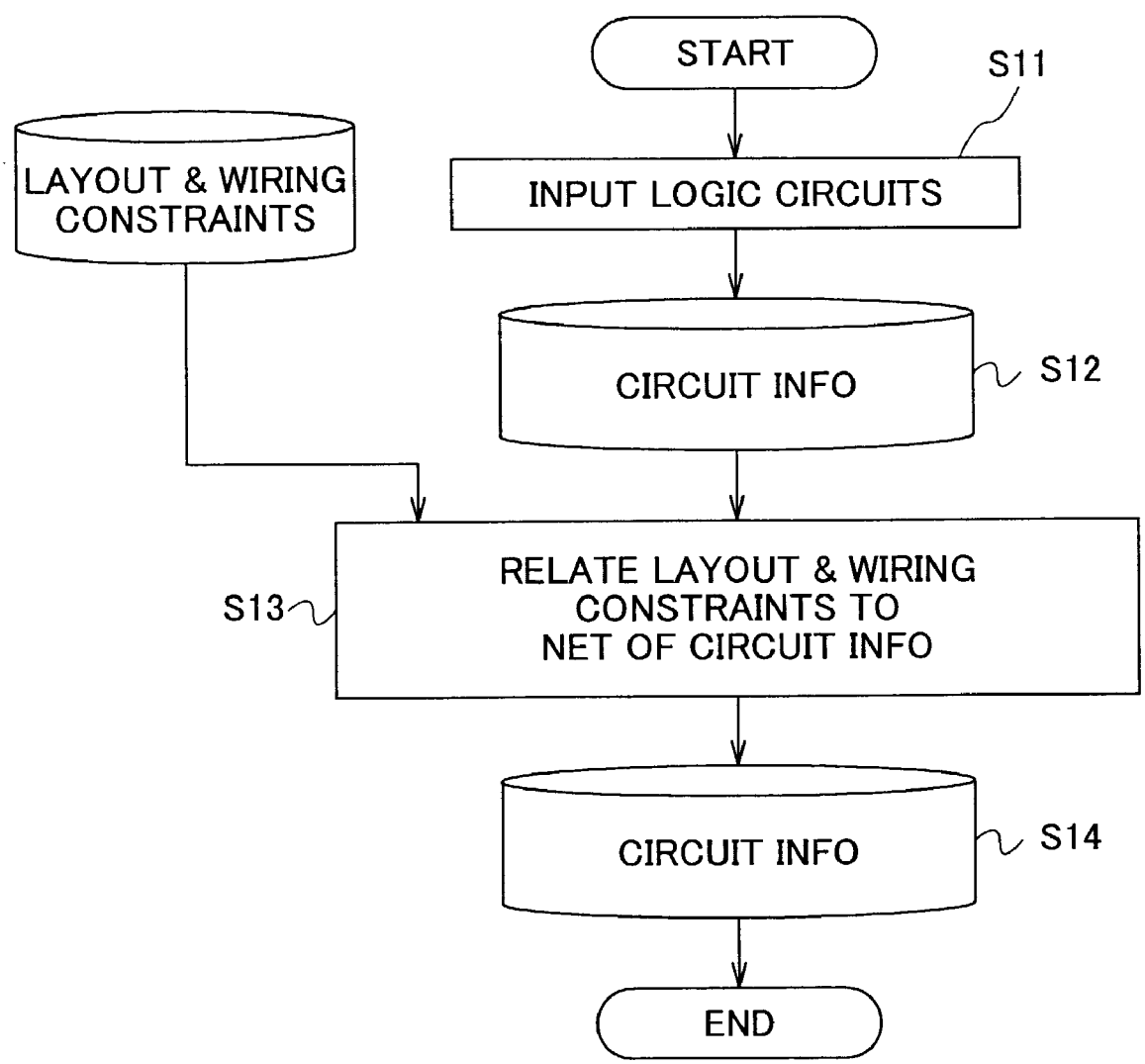
FIG. 11 is a flow chart for explaining a circuit information generating process.

FIG. 11 is a flow chart for explaining a circuit information generating process of the circuit editor 3. The process shown in FIG. 11 is carried out by the CPU 201.

In FIG. 11, a step S11 inputs the logic circuits of the electronic circuit using the keyboard 103 and/or the mouse 104, so as to generate the circuit information. For example, the logic circuits may be input by displaying on the display screen 102a of the display a plurality of logic circuits which are prestored in the memory section 202 or the like, and selecting the desired logic circuits on the display screen 102a. A step S12 stores the generated circuit information in the memory section 202 or the like. A step S13 relates to the generated circuit information the layout and wiring constraints obtained from the advice engine group 24 of the combined advice function 2, that is, the design constraints stored in the memory section 202 or the like. A step S14 stores the circuit information having the design constraints related thereto in the memory section 202 or the like, and also outputs the circuit information having the design constraints related thereto to the layout and wiring editor 4 of the combined advice function 2.

Figure 12:
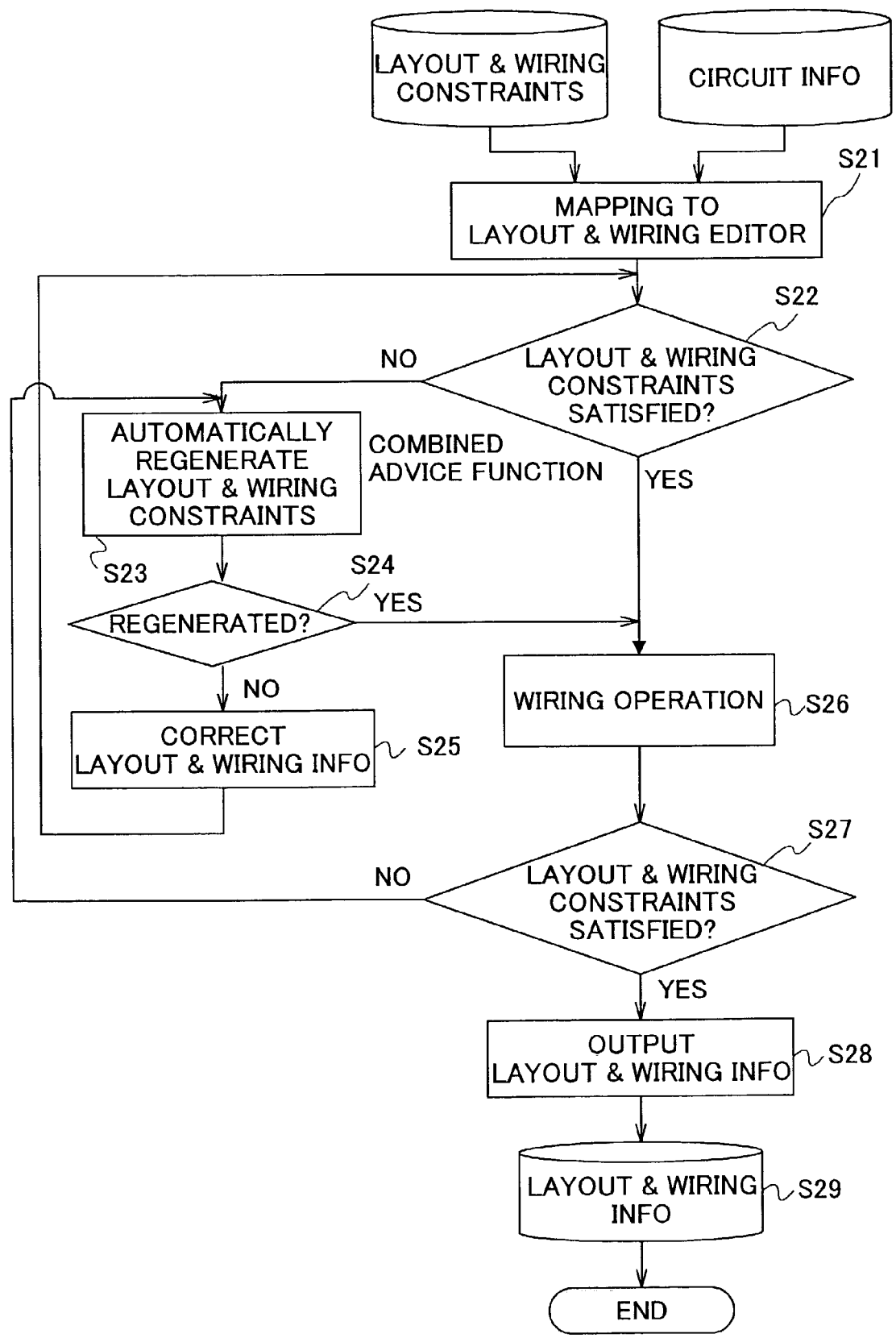
FIG. 12 is a flow chart for explaining a layout and wiring information generating process based on the design constraints.

FIG. 12 is a flow chart for explaining a layout and wiring information generating process of the layout and wiring editor 4 based on the design constraints. The process shown in FIG. 12 is carried out by the CPU 201.

In FIG. 12, a step S21 carries out a mapping of the external shape information and device coordinates to the layout and wiring editor 4, based on the layout and wiring constraints obtained from the advice engine group 24 of the combined advice function 2, that is, the design constraints stored in the memory section 202 or the like, and the circuit information obtained from the circuit editor 3, that is, the circuit information stored in the memory section 202 or the like and having the design constraints related thereto. The mapping itself is carried out automatically, but the user may adjust the layout or the like with respect to the mapped result using the keyboard 103 and/or the mouse 104.

A step S22 decides whether or not the mapped result satisfies the layout and wiring constraints, that is, the design constraints. If the decision result in the step S22 is NO, steps S23 through S25 are carried out by the advice engine group 24 of the combined advice function 2. The step S23 carries out an automatic regeneration process which will be described later to regenerate the design constraints. The step S24 decides whether or not the design constraints are regenerated. If the decision result in the step S24 is NO, the step S25 corrects the design constraints, and the process returns to the step S22.

If the decision result in the step S22 or S24 is YES, a step S26 carries out a wiring operation. The wiring operation includes at least one of the manual wiring which is made manually by the user using the keyboard 103 and/or the mouse 104, the navigation wiring which urges the user to select the wiring, and the automatic wiring which makes the wiring automatically based on the design constraints. Of course, the wiring operation may include an arbitrary combination of the manual wiring, the navigation wiring and the automatic wiring. A step S27 decides whether or not the wiring result satisfies the layout and wiring constraints, that is, the design constraints. The process returns to the step S23 if the decision result in the step S27 is NO. On the other hand, if the decision result in the step S27 is YES, a step S28 outputs the layout and wiring information, including the wiring result, to the post analyzing section 5, and displays the layout and wiring information on the display screen 102a of the display,102 so as to urge the user to make inputs. A step S29 stores the output layout and wiring information in the memory section 202 or the like.

The post analyzing section 5 carries out the signal integrity analysis, radio wave analysis, thermal analysis, cost analysis and the like by a known analyzing method, based on the layout and wiring information obtained from the layout and wiring editor 4. The post analyzing section 5 feeds back the analysis result to the combined advice function 2, so as to optimize the design constraints such as the layout and wiring constraints.

Figure 13:
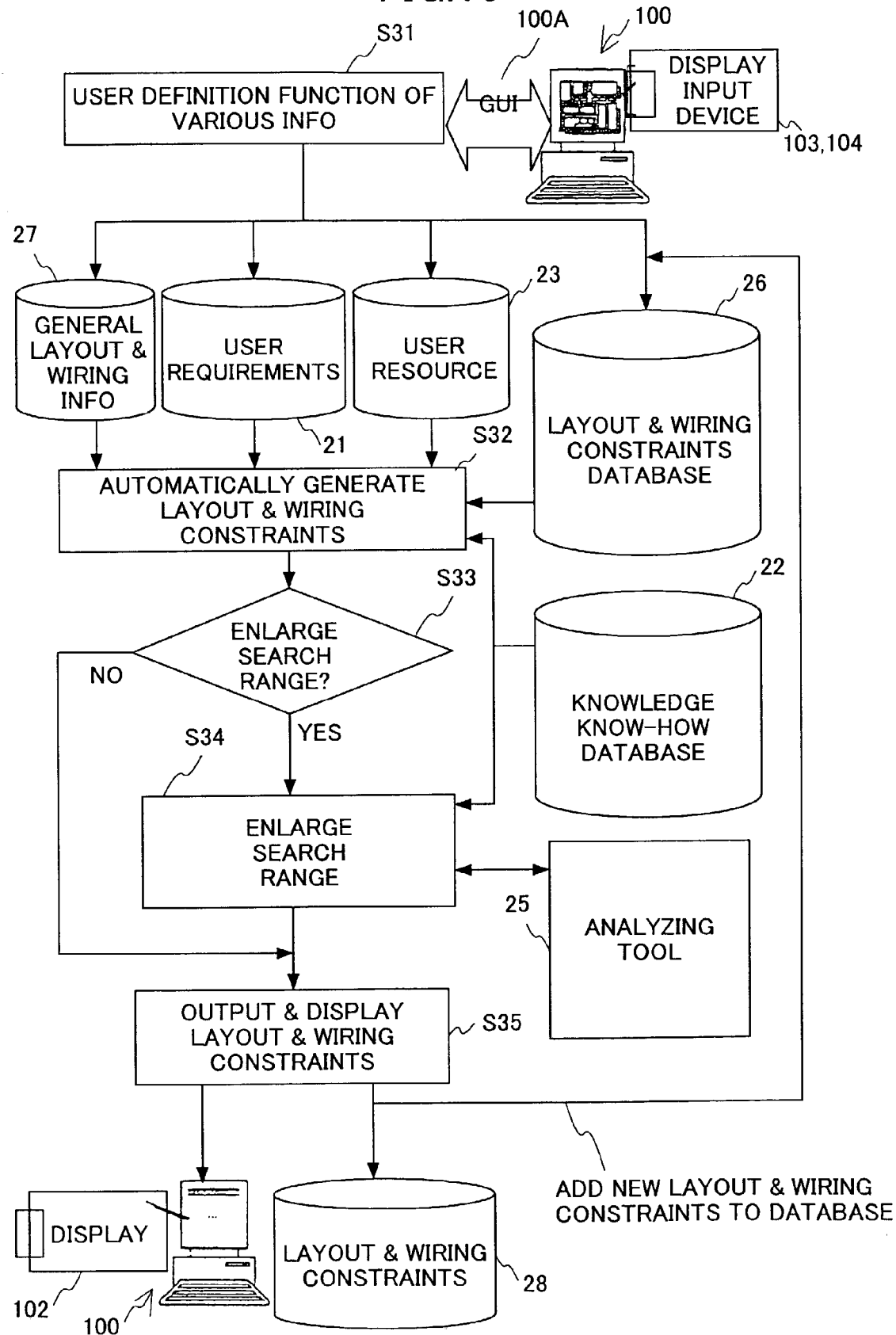
FIG. 13 is a flow chart for explaining an automatic generation and optimization process for the design constraints.

FIG. 13 is a flow chart for explaining an automatic generation and optimization process of the layout and wiring editor 4 for the design constraints. The process shown in FIG. 13 is carried out by the CPU 201. In FIG. 13, those parts which are the same as those corresponding parts in FIG. 3 are designated by the same reference numerals, and a description thereof will be omitted. For the sake of convenience, it is also assumed in FIG. 13 that the layout and wiring constraints are automatically generated and optimized as the design constraints.

When automatically generating and optimizing the layout and wiring constraints, conditions such as (1) the signal integrity and delay including the transmission line, power supply and/or ground bounce, the switching noise generated simultaneously therewith, and the junction temperature, (2) EMI and/or EMC limitations, (3) junction temperature, (4) cost, (5) reliability, and (6) the wiring characteristic are satisfied.

In addition, by representing the layout and wiring constraints by formalization of the solution space thereof, it is possible to facilitate the reading of the layout and wiring constraints in the circuit editor 3, the layout and wiring editor 4 and the like, and to facilitate the application to the automatic design. As described above in conjunction with FIGS. 8 through 10, the layout and wiring constraints can be represented by displaying the image of the nets including the wiring by the combined advice function 2 on the general floor planner screen which is displayed on the display 102 by the general floor planner 1, and further displaying the mathematical representations of the coordinate information of the input/output (I/O) pins and the wiring constraints, displaying the wiring specifications for each segment on the net, and displaying the graph representation of complicated wiring constraints. The net refers to a portion which includes at least one circuit device and is treated as a unit when designing the electronic circuit. The information displayed on the general floor planner screen is supplied from the combined advice function 2 to the layout and wiring editor 4 in this manner.

For example, the layout and wiring constraints may be represented by [1] the representation of the layout constraints, [2] the representation of the design constraints of the nets, and [3] the representation of the conditions related to the junction temperatures. [1] The representation of the layout constraints include information dependent on the junction temperatures, information dependent on the signal integrity and delay, and the like. [2] The representation of the design constraints of the nets includes information dependent on the signal integrity and delay, information dependent on the EMI and/or EMC limitations, information dependent on the wiring characteristics, and the like. The information dependent on the wiring characteristics include the device-specifications, arbitrary net topology representation, wiring region definitions, wiring layer and/or structure definitions, adjacent conditions of power supply and/or ground, vias used, number, pitch and layer switching conditions of the wirings, LSI pad specifications, and the like. [3] The representation of the conditions related to the junction temperatures include the radiator fin specifications, device package, thermal conduction method and/or material of the package, air supplying structure, fan specifications, and the like.

In FIG. 13, a step S31 carries out a user definition function to make user definitions of various kinds of information, using a GUI 100A of the computer system 100. More particularly, general layout and wiring information 27 is generated by the general floor planner 1 and stored in the memory section 202 or the like, the user requirements 21 input by the user using the combined advice function 2 are stored in the memory section 202 or the like, and the user resources 23 input by the user using the combined advice function 2 are stored in the memory section 202 or the like. A step S32 automatically generates the layout and wiring constraints, based on a known layout and wiring constraint condition database 26, the knowledge know-how database 22, the general layout and wiring information 27, the user requirements 21 and the user resources 23, which are stored in the memory section 202 or the like. A step S33 decides whether or not to enlarge a search range of the solution space, based on user judgement. The process advances to a step S35 which will be described later, if the decision result in the step S33 is NO.

On the other hand, if the decision result in the step S33 is YES, a step S34 makes an analysis using the analyzing tool 25 by changing the parameters forming the automatically generated layout and wiring constraints, so as to enlarge the search range of the solution space of the layout and wiring constraints. The analyzing tool 25 includes known simulator functions for making the above analysis, such as a circuit simulator, an electromagnetic field simulator and a thermal analysis simulator. A step S35 outputs and displays layout and wiring constraints 28 which are generated by the above described process. More particularly, the layout and wiring constraints 28 are displayed on the display screen 102a of the display 102 of the computer system 100, and are stored in the memory section 202 or the like. In addition, the layout and wiring constraints 28 are fed back to the layout and wiring constraint condition database 26, so that new layout and wiring constraints are added to the layout and wiring constraint condition database 26. The automatic generation and optimization of the layout and wiring constraints are made in the above described manner.

Accordingly, the following procedures (a) through (d) are carried out by the process shown in FIG. 13. In a case where the layout and wiring constraints are (1) the signal integrity and delay, the procedure (a) sets the initial values of the wiring constraints or lists candidates of the solution on a rule-base (rule-based solution) on the display screen 102a. The procedure (b) changes the parameter values in a predetermined range and makes an analysis using the analyzing tool 25, so as to search for the solution space satisfying the user requirements 21 and enlarge the search range. Alternatively, in place of the procedure (b), the procedure (c) carries out a simulation using the analyzing tool 25 so as to narrow the solution satisfying the user requirements 21. The procedure (d) generates a plurality of candidates of the wiring constraints, and displays the candidates on the display screen 102a with respect to the user. When carrying out the procedure (b), it is possible to make an analysis by a parameter sweep by taking into consideration the correlation among the parameters prescribed by the rule, but the analysis by the parameter sweep is not essential.

In a case where the layout and wiring constraints are (2) the EMI and/or EMC limitations, the process shown in FIG. 13 carries out the above described procedures (a), (c) and (d) including the wiring constraints, similarly to the case of (1) the signal integrity and delay.

In a case where the layout and wiring constraints are (3) the junction temperature, (4) the cost, (5) the reliability or (6) the wiring characteristic, the process shown in FIG. 13 carries out the above described procedures (a) and (b) or, the procedures (c) and (d), including the wiring constraints, similarly to the case of (1) the signal integrity and delay.

Recently, the operation frequency of the electronic circuit has increased considerably, thereby making the design constraints more severe. As a result, it is becoming more and more difficult to design the layout and wiring of the electronic circuit to satisfy the design constraints. For this reason, in a case where the layout positions of the devices are not sufficiently taken into consideration at the stage where the design constraints are generated, in the third step of the first through fourth steps of the design procedure described above, it becomes impossible to design an electronic circuit which satisfies the design constraints, thereby making it necessary to review and change the design constraints. Such an operation reviewing and changing the design constraints takes time, and increases the design time.

Next, a description will be given of an other embodiment of the electronic circuit designing apparatus according to the present invention, which can eliminate such inconveniences. This other embodiment of the electronic circuit designing apparatus employs an other embodiment of the electronic circuit designing method according to the present invention and an other embodiment of the computer-readable storage medium according to the present invention. In this embodiment, the present invention is applied to a computer system.

For the sake of convenience, it is also assumed in this embodiment that the present invention is applied to the computer system 100 described above.

Figure 14:
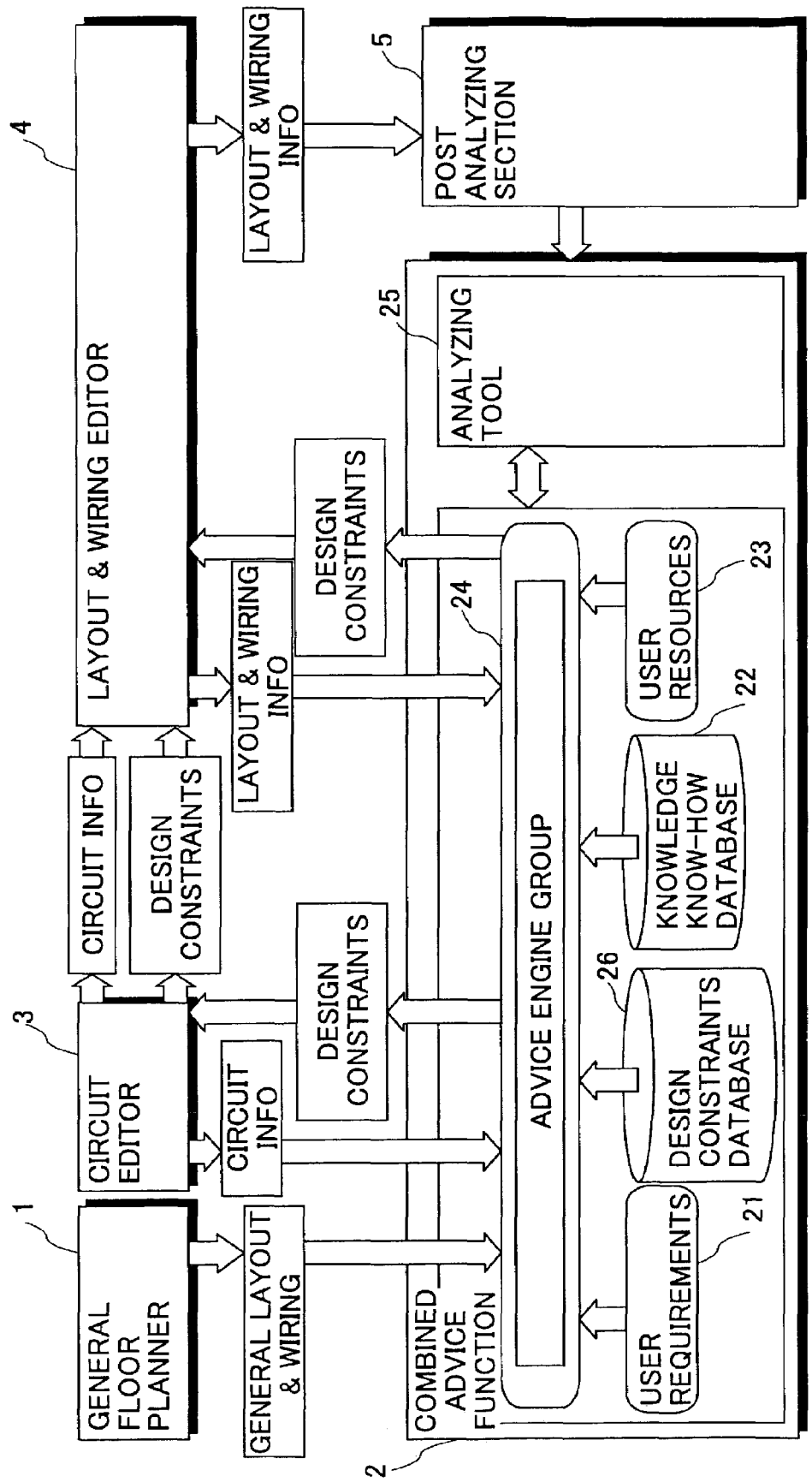
FIG. 14 is a functional block diagram showing an electronic circuit designing apparatus formed by the computer system in another embodiment.

FIG. 14 is a functional block diagram showing an electronic circuit designing apparatus formed by the computer system 100 in this embodiment. In FIG. 14, those parts which are the same as those corresponding parts in FIG. 3 are designated by the same reference numerals, and a description thereof will be omitted.

Figure 15:
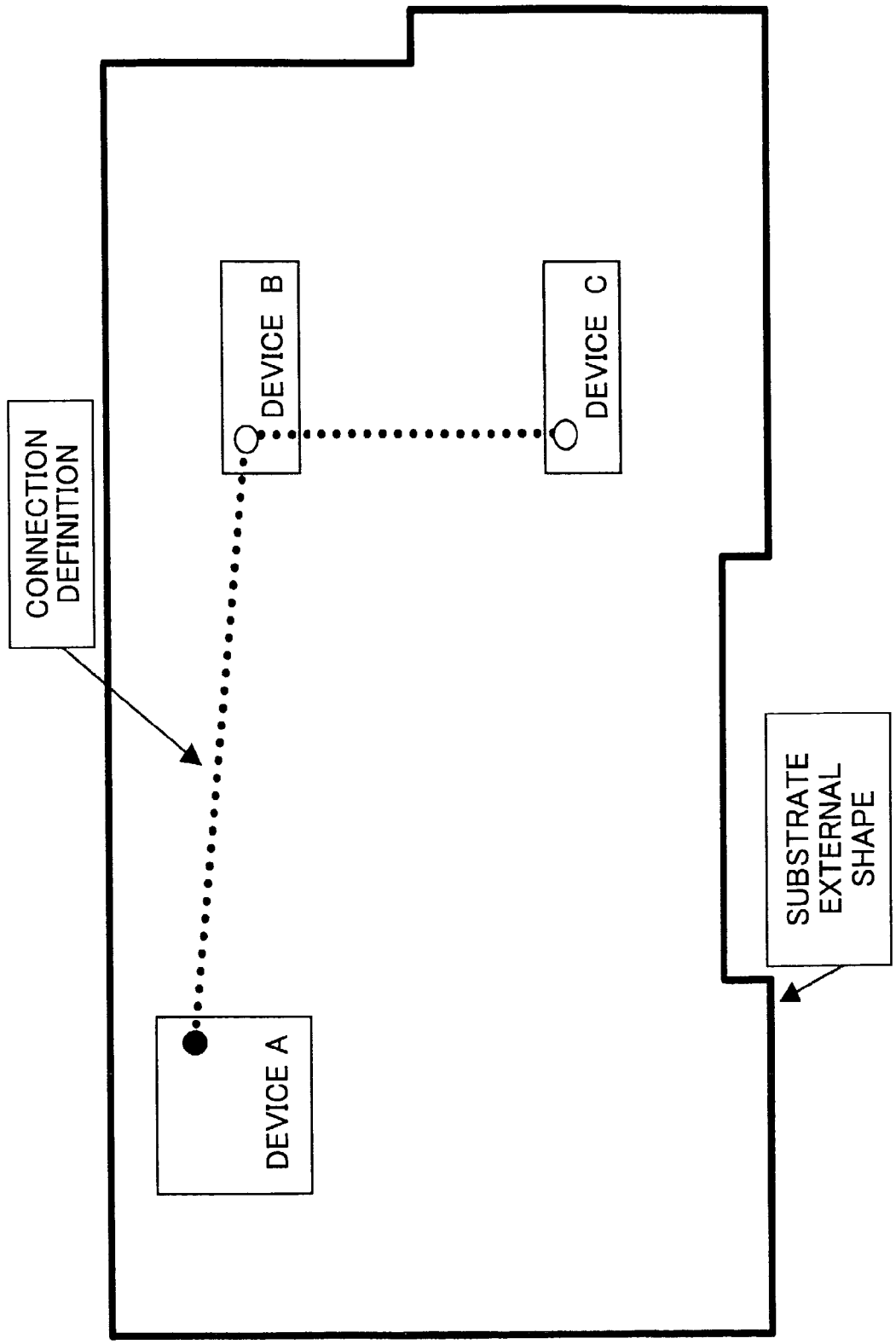
FIG. 15 is a diagram for explaining a screen input of general layout and wiring information by the general floor planner.

FIG. 15 is a diagram for explaining a screen input of the general layout and wiring information 27 by the general floor planner 1 of this embodiment. FIG. 15 shows an image which is displayed on the display screen 102a of the display 102. The general layout and wiring information 27 which is displayed is input by using the keyboard 103 and/or the mouse 104. For example, FIG. 15 shows the substrate external shape of the electronic circuit by a bold solid line, and the devices A through C which are parts of the electronic circuit are indicated by a thin solid line. The device A includes a driver pin indicated by a black circular mark, and is connected to the devices B and C by connection definitions indicated by bold dotted lines. The devices B and C respectively include a receiver pin indicated by a white circular mark.

The combined advice function 2 shown in FIG. 14 includes the advice engine group 24 which generates design constraints based on the layout constraint definitions and the general layout and wiring information received from the general floor planner 1, using the user requirements (conditions) 21, the knowledge know-how database 22, the user resources 23, the design constraint condition (layout and wiring constraint condition) database 26 and the analyzing tool 25. The design constraints generated by the advice engine group 24 are output to the circuit editor 3 and the layout and wiring editor 4.

The design constraint condition database 26 may be formed by an existing database of the design constraints which have been generated in the past, and such a database may be stored in the memory section 202 or the like.

Figure 16:
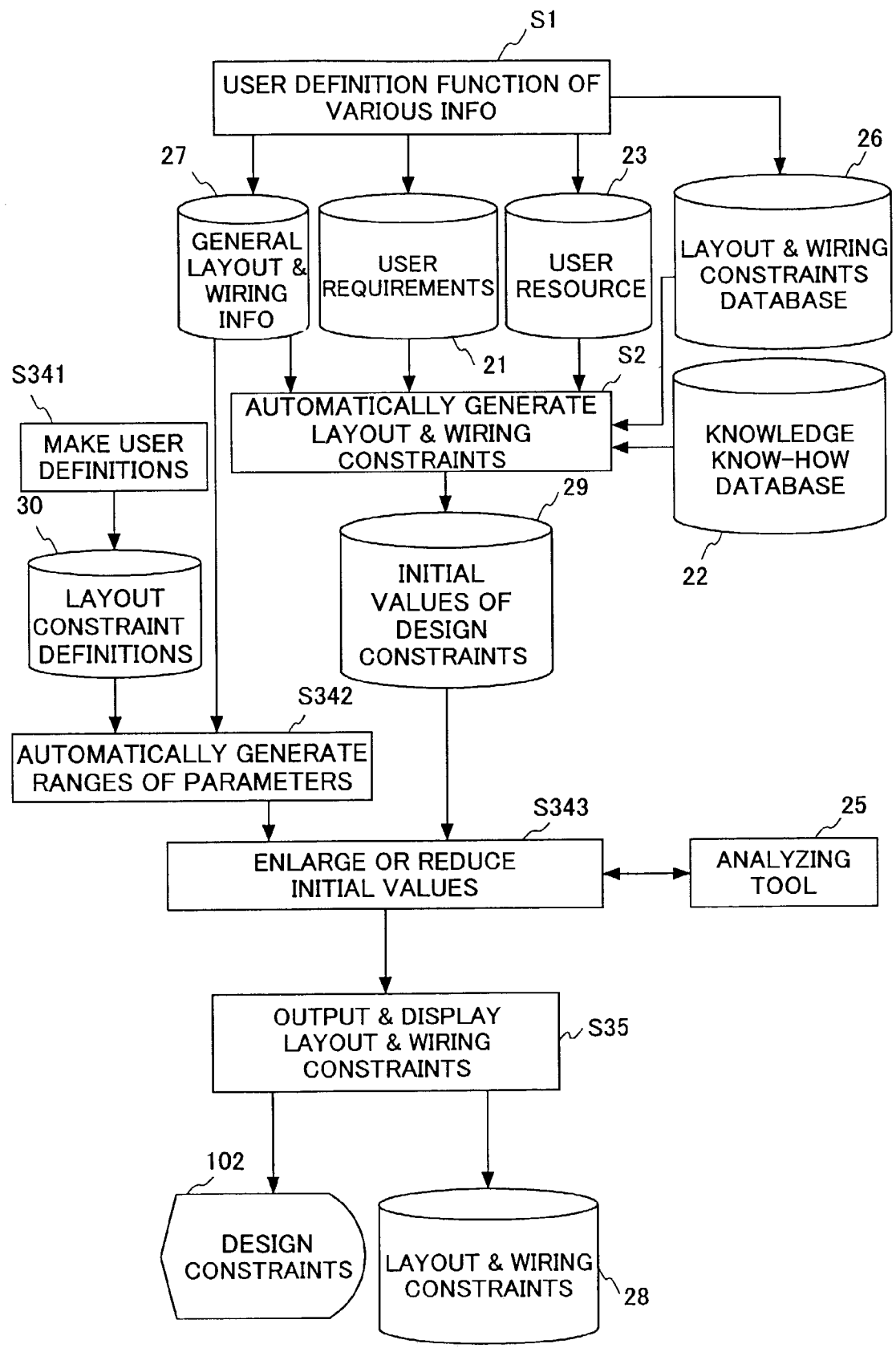
FIG. 16 is a flow chart for explaining a design constraint condition generating process.

FIG. 16 is a flow chart for explaining a design constraint condition generating process of the advice engine group 24 of the combined advice function 2. The process shown in FIG. 16 is carried out by the CPU 201. In FIG. 16, those steps which are the same as those corresponding steps in FIG. 13 are designated by the same reference numerals, and a description thereof will be omitted.

In FIG. 16, the step S31 defines the general layout and wiring information 27, the user requirements 21, the user resources 23 and the layout constraint definitions 30, based on the screen input or the like of the general floor planner 1 displayed on the display screen 102a of the display 102. The step S32 automatically generates initial values 29 of the design constraints (layout and wiring conditions) based on the input general layout and wiring information 27, the user requirements 21, the user resources 23, the knowledge know-how database 22 and the design constraint condition database 26.

Figure 17:
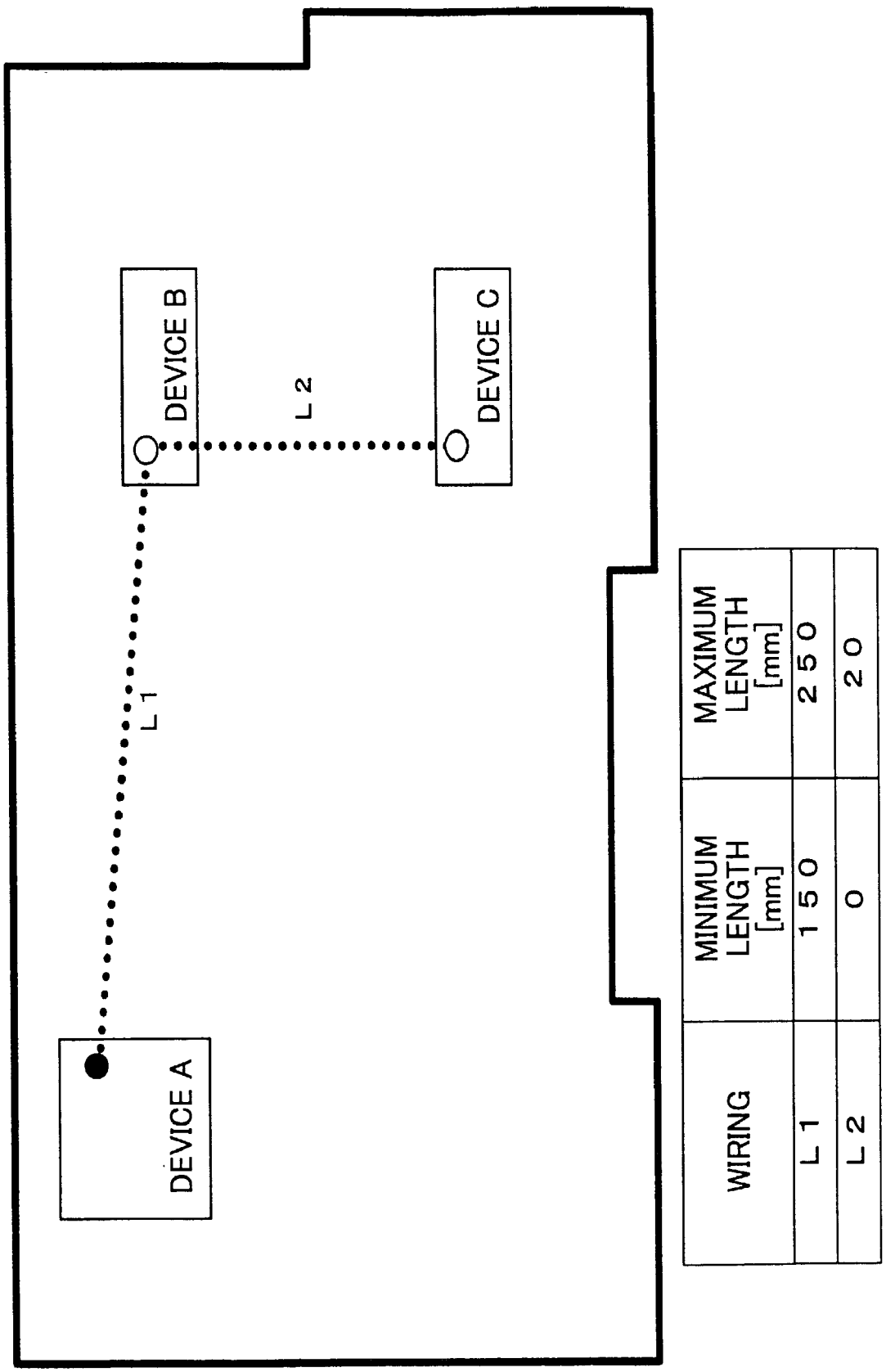
FIG. 17 is a diagram for explaining initial values of the design constraints.

FIG. 17 is a diagram for explaining the initial values 29 of the design constraints automatically generated by the step S32. In the particular case shown in FIG. 17, the wiring length between the devices A and B is displayed as L1, and the wiring length between the devices B and C is displayed as L2. In addition, 150 mm$\leq$L1<250 mm and L2$\leq$20 mm are generated as the design constraints with respect to the wiring lengths L1 and L2.

A step S341 shown in FIG. 16 makes the user definitions of the layout constraints, based on the screen input or the like of the general floor planner 1 displayed on the display screen 102a of the display 102.

Figure 18:
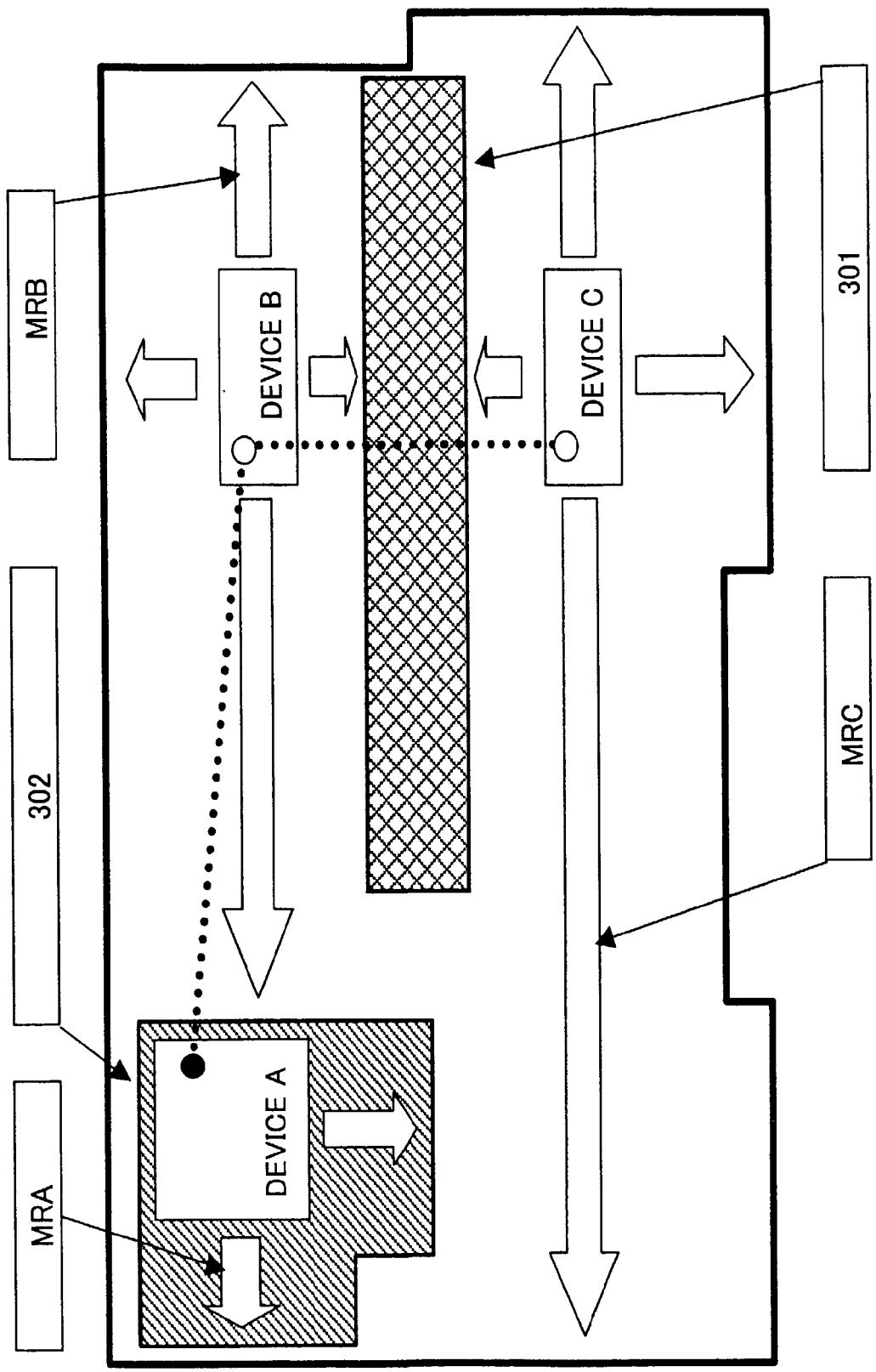
FIG. 18 is a diagram for explaining layout constraint definitions.

FIG. 18 is a diagram for explaining layout constraint definitions, that is, a screen input of layout constraint definitions 30 of the general floor planner 1. FIG. 18 shows an image which is displayed on the display screen 102a of the display 102. In this particular case, the layout constraint definitions 30 include, in addition to the general layout and wiring information 27, a layout prohibited region definition 301 and a movable region definition 302. The layout prohibited region definition 301 is indicated by cross-hatching to define a region where the layout of the device is prohibited. The movable region definition 302 is indicated by hatching to define a movable region of the device A. The layout constraint definitions 30 are input by using the keyboard 103 and/or the mouse 104. Movable regions MRA through MRC of the devices A through C, which are indicated by bold white arrows, are automatically determined by the general layout and wiring information 27 and the layout constraint definitions 30.

A step S342 shown in FIG. 16 automatically generates ranges of the parameters (parameter ranges) which are changed when making the analysis using the analyzing tool 25 based on the general layout and wiring information 27 input by the step S31 and the layout constraint definitions 30 input by the step S341.

Figure 19B:
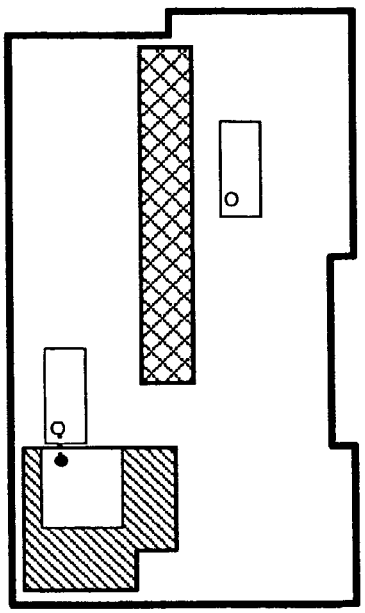
FIGS. 19A through 19D are diagrams for explaining automatic generation of parameter ranges.
Figure 19D:
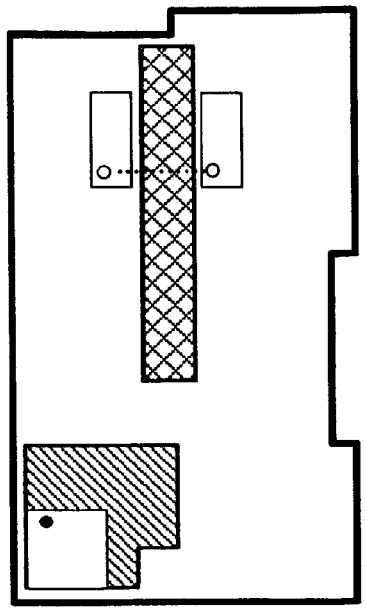
Figure 19A:
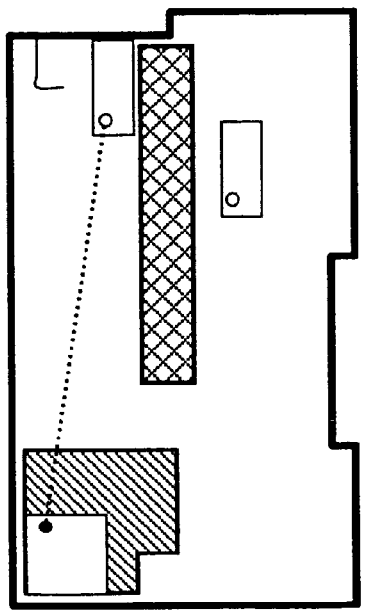
Figure 19C:
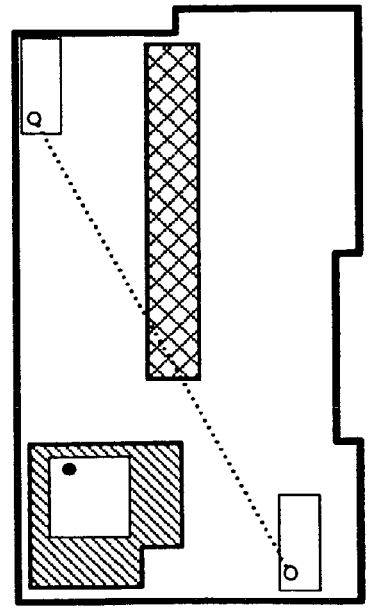

FIGS. 19A through 19D are diagrams for explaining automatic generation of the parameter ranges. In FIGS. 19A through 19D, the parameter ranges are generated as 10 mm to 250 mm for the wiring length L1, and as 25 mm to 280 mm for the wiring length L2, based on the general layout and wiring information 27 and the layout constraint definitions 30. FIG. 19A shows a case where L1=250 mm and the distance between the devices A and B is a maximum, and FIG. 19B shows a case where L1=10 mm and the distance between the devices A and B is a minimum. In addition, FIG. 19C shows a case where L2=280 mm and the distance between the devices B and C is a maximum, and FIG. 19D shows a case where L2=25 mm and the distance between the devices B and C is a minimum.

A step S343 shown in FIG. 16 makes an analysis using the analyzing tool 25 by changing the parameter values in the parameter ranges generated by the step S342, so as to enlarge or reduce the initial values of the design constraints. For example, when the parameters are changed and the transmission waveform obtained as a result of making the signal integrity analysis is observed, the initial value of the design constraint condition for the wiring length L1 is reduced from 150 mm$\leq$L1$\leq$250 mm to 150 mm$\leq$L1$\leq$200 mm in a case where the waveform distortion and delay are within tolerable ranges for 150 mm$\leq$L1$\leq$200 mm. In addition, in a case where the waveform distortion and delay are within tolerable ranges for L2$\leq$30 mm, since the minimum value of the distance between the devices B and C is 25 mm because the device layout prohibited region exists between the devices B and C, the initial value of the design constraint condition for the wiring length L2 is enlarged from L2$\leq$20 mm to L2$\leq$30 mm.

The step S35 shown in FIG. 16 outputs and displays the design constraints 28 which are generated by the above described process. FIG. 20 is a diagram for explaining generated design constraints 28.

When the layout constraint definitions 30 are added after generation of the design constraints 28, the step S342 is carried out by using the general layout and wiring information 27 and the added layout constraint definitions 30 as the inputs. In addition, the step S343 and the subsequent steps are carried out using the design constraints 28 after the generation as the inputs, in place of the initial values 29 of the design constraints. Hence, the enlargement or reduction of the initial values of the design constraints 28 is automatically made again, based on the added layout constraint definitions 30 after generation of the design constraints 28, so as to regenerate the design constraints 28.

Therefore, this embodiment obtains the initial values of the design constraints with respect to the electronic circuit, makes the analysis by changing the parameter values in a predetermined range, and enlarges or reduces the initial values of the design constraints. Moreover, the initial values of the design constraints are automatically enlarged or reduced by automatically changing the parameters based on the layout constraint definitions formed by at least one of the definitions of the device layout prohibited region and the movable region for each device, so as to generate the design constraints. As a result, it is possible to generate the design constraints in a range where the circuit layout and wiring are possible, by taking into consideration the device layout prohibited region and the movable region for each device. Furthermore, it is unnecessary to carry out the operation of reviewing and changing the design constraints in the step which edits the circuit,layout and wiring, thereby preventing the design time from increasing considerably.

In addition, it is possible to automatically enlarge or reduce the design constraints again based on the layout constraint definitions added after generation of the design constraints, so as to regenerate the design constraints. In this case, it is possible to regenerate the design constraints in the range where the circuit layout and wiring are possible, by taking into consideration the device layout prohibited region and the movable region for each device which are added after generation of the design constraints. Hence, it is unnecessary to carry out the operation of reviewing and changing the design constraints in the step which edits the circuit layout and wiring, thereby preventing the design time from increasing considerably.

When designing the electronic circuit, it is necessary to create the design constraints. In order to create the design constraints, it is necessary to carry out an inspecting operation, such as inspection of layout positions of the parts by taking into consideration the occupying areas of bus lines, and inspection of wiring routes by taking into consideration the layout positions and electrical characteristics of the pins of the parts (part pins). Accordingly, physical information related to the layout positions of the parts, the wiring routes and the like is necessary when carrying out the inspecting operation with respect to the design constraints.

Conventionally, the layout and wiring are made and inspected using a designing tool corresponding to an assemble designing system. Furthermore, the electrical characteristic is inspected by making an analysis using an analyzing tool, based on the designed layout and wiring information.

Originally, the assemble designing system is intended to design the manufacturing data of the electronic circuit. For this reason, when making the layout and wiring design on the assemble designing system, it is necessary to create the detailed shapes of the parts such as the external shapes of the parts, the shapes of the pins and the layout of the pins, and to arrange all of the wiring patterns and the vias connected to the patterns.

However, when inspecting the design constraints at an upstream stage of the circuit design, it is unnecessary to design the actual manufacturing data. Consequently, when the assemble designing system is used, it becomes necessary to create data which are actually unnecessary for the inspection, and there is an inconvenience in that the design time is thereby increased considerably. Moreover, since the data created when using the assemble designing system include all data necessary for the manufacturing, there is an inconvenience in that the amount of data which must be processed becomes large.

Accordingly, a description will now be given of a further embodiment of the electronic circuit designing apparatus according to the present invention, which can eliminate the inconveniences described above. This further embodiment of the electronic circuit designing apparatus employs a further embodiment of the electronic circuit designing method according to the present invention and a further embodiment of the computer-readable storage medium according to the present invention. In this embodiment, the present invention is applied to a computer system.

For the sake of convenience, it is also assumed in this embodiment that the present invention is applied to the computer system 100 described above.

In this embodiment, the design time of the layout and wiring data required for the inspection of the design constraints is reduced and the amount of design data is reduced, by making it possible to simplify, using regions, the shapes of the pins of the parts connecting to the bus lines, the wiring shapes of the buses, the shapes of the vias arranged within the bus lines, and the shapes of the parts inserted into the bus lines. The bus lines refer to wirings made up of a plurality of signal lines, data lines and/or control lines. For example, the wirings in the wiring pattern forming the bus line may be regularly arranged at equal intervals (or pitch).

In addition, a representative pin, a representative pattern, a representative net, a representative via and a representative part may be defined within each of the regions of the pins of the parts, buses, vias and interconnecting parts. Hence, an analysis may be made using an analyzing tool, based on information related to the representative pin, the representative pattern, the representative net, the representative via and the representative part, and information related to the wiring pitch, and it is possible to inspect the electrical characteristic of the net forming the bus.

Therefore, in the case of the bus line which is designed using the regions, it is possible to create the design constraints which takes into consideration the electrical characteristic of the net forming the bus.

In this embodiment, the electronic circuit designing apparatus which is formed by the computer system 100 may have the functional block structure shown in FIG. 3 or FIG. 14, as long as the general floor planner 1 has the following functions.

FIG. 21 is a diagram showing a state where the substrate external shape and the part external shape are created by the general floor planner 1. Only the external shapes of the parts (part external shapes) are created for the devices A, B and C, and the detailed shape of the part, including the pin layout, is created for the device D. In order to connect these devices A through D by bus lines, a pin region and a representative pin within the pin region are defined with respect to each of the devices A through D (parts). When defining the pin region, the user can define the pin region by specifying the region with respect to the part shapes for which only the external shapes are created, as in the case of the devices A, B and C shown in FIG. 21. In this state, a pin layout type of each of the parts is specified, so that the computer system 100 can judge the ranges definable as the pin region.

Figure 22:
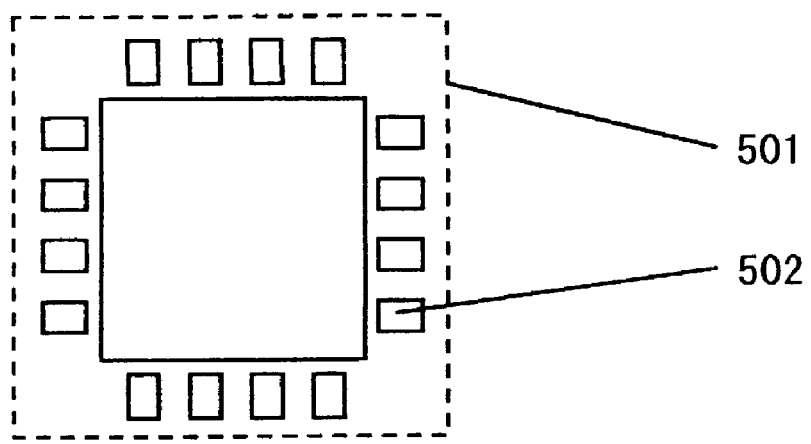
FIG. 22 is a diagram showing a first pin layout type.
Figure 23:
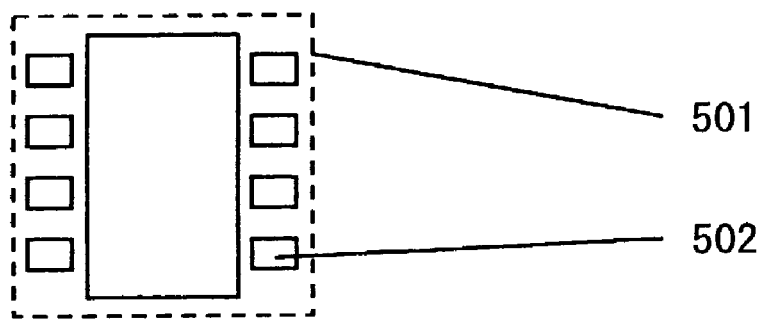
FIG. 23 is a diagram showing a second pin layout type.
Figure 24:
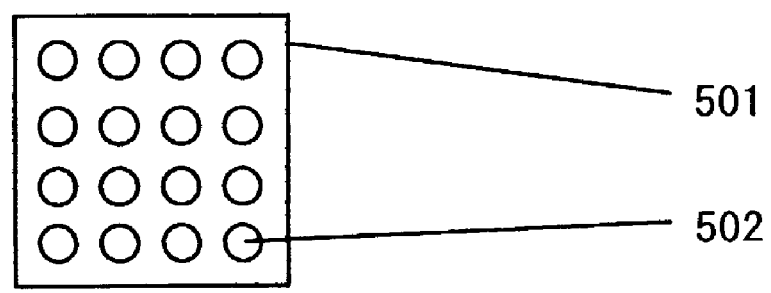
FIG. 24 is a diagram showing a third pin layout type.

The pin layout type of the parts is specified from the following three types {1} through {3}. A first pin layout type {1} has the pin arranged on the four sides of the part, and the pin region is created along the outer periphery of the part. FIG. 22 is a diagram showing the first pin layout type {1}. FIG. 22 shows a quad flat-leaded package (QFP) as an example of the first pin layout type {1}. A second pin layout type {2} has the pins arranged on the two confronting sides of the part, and the pin region is created along the outer periphery of the part and along the two confronting sides of the part. FIG. 23 is a diagram showing the second pin layout type {2}. FIG. 23 shows a small out-line package (SOP) as an example of the second pin layout type {2}. A third pin layout type {3} has the pins arranged in an array immediately under the part, and the pin region is created in an arbitrary range within the part external shape. FIG. 24 is a diagram showing the third pin layout type {3}. FIG. 24 shows a ball grid array (BGA) as an example of the third pin layout type {3}. In FIGS. 22 through 24, a reference numeral 501 indicates the part external shape, and a reference numeral 502 indicates the pin of the part (part pin).

Figure 25:
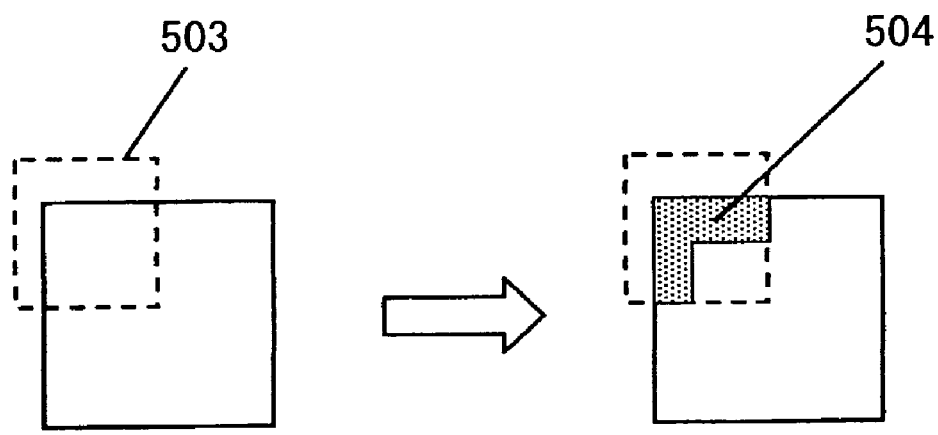
FIG. 25 is a diagram for explaining a pin region which is formed in the case of the first pin layout type.
Figure 26:
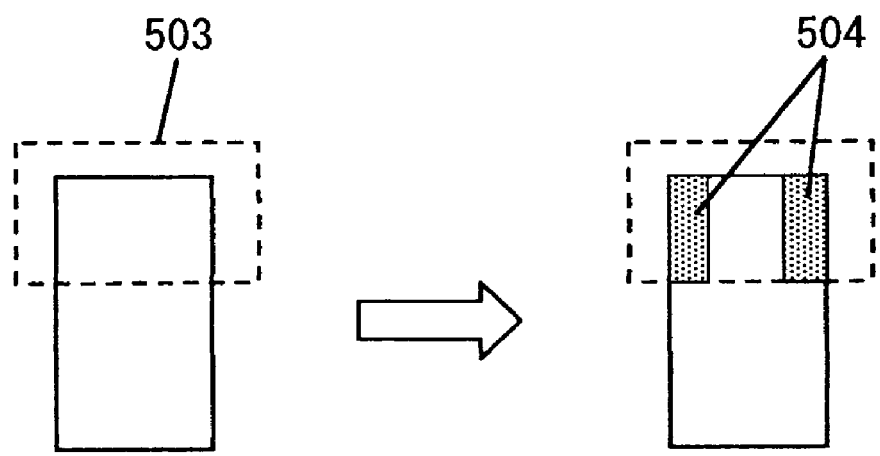
FIG. 26 is a diagram for explaining a pin region which is formed in the case of the second pin layout type.
Figure 27:
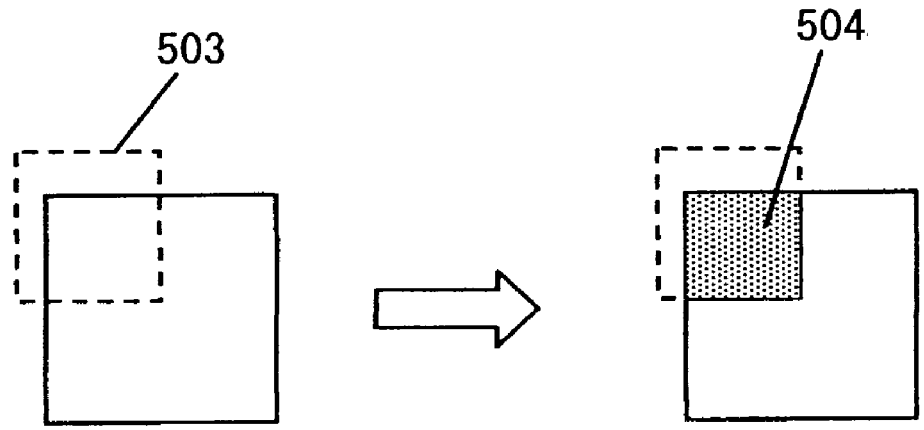
FIG. 27 is a diagram for explaining a pin region which is formed in the case of the third pin layout type.

When a region 503 is specified with respect to the part external shape 501, a pin region 504 is created within the specified region 503 in a range where the pin layout is possible. FIG. 25 is a diagram for explaining the pin region 504 which is formed in the case of the first pin layout type {1} having the pins arranged on the four sides. FIG. 26 is a diagram for explaining the pin region 504 which is formed in the case of the second pin layout type {2} having the pins arranged on the two confronting sides. In addition, FIG. 27 is a diagram for explaining the pin region 504 which is formed in the case of the third pin layout type {3} having the pins arranged in an array immediately under the part. In FIGS. 25 through 27, the left part shows the specified region 503, and the right part shows the pin region 504.

Figure 28:
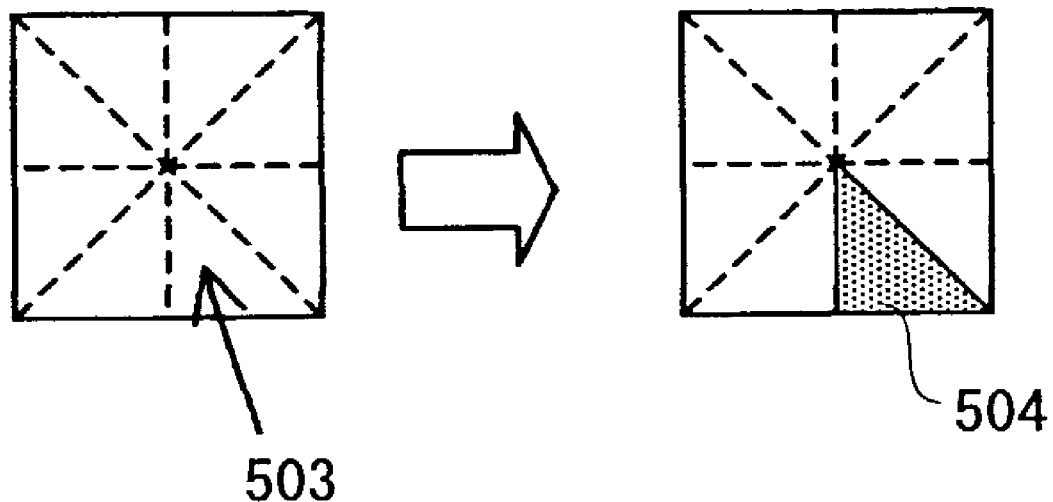
FIG. 28 is a diagram showing a case where a pin layout type having pins immediately under a part is sectioned into eight regions.

According to another specifying method, the region may be defined by specifying one of a plurality of regions which section the part in advance. FIG. 28 is a diagram showing a case where a pin layout type having pins immediately under a part is sectioned into eight regions. In FIG. 28, the left part shows the specified region 503, and right part shows the pin region 504 within the specified region 503 in a range where the pin layout is possible.

Figure 29:
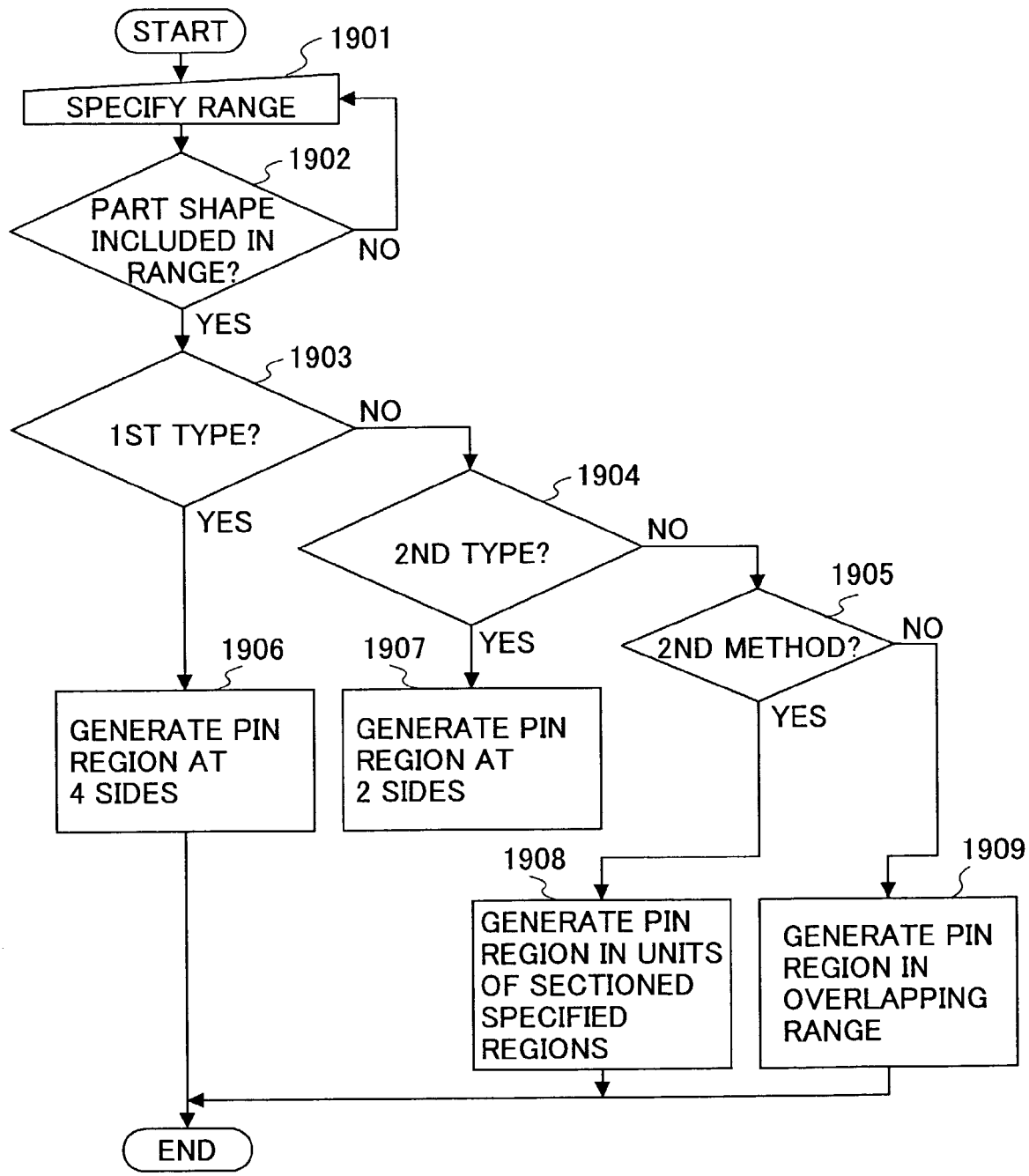
FIG. 29 is a flow chart for explaining a pin region generating process.

FIG. 29 is a flow chart for explaining a pin region generating process of the general floor planner 1 described above in conjunction with FIGS. 25 through 28. The process shown in FIG. 29 is carried out by the CPU 201.

In FIG. 29, a step 1901 specifies a range in which the region is to be generated, using the mouse 104 or the like, and a step 1902 decides whether or not a part shape is included in the specified range. If no part shape is included in the specified range and the decision result in the step 1902 is NO, the process returns to the step 1901 to specify the range again.

If the part shape is included in the specified range and the decision result in the step 1902 is YES, a step 1903 decides whether or not the pin layout type of the part is the first pin layout type. The pin layout type of the part may be specified by the user after defining the shape of the part. If the decision result in the step 1903 is YES, a step 1906 generates the pin region 504. For example, the step 1906 generates the pin region 504 at the side portion of the part within the region where the specified region 503 and the part shape overlap as shown in FIG. 25.

If the decision result in the step 1903 is NO, a step 1904 decides whether or not the pin layout type of the part is the second pin layout type. If the decision result in the step 1904 is YES, a step 1907 generates the pin region 504. For example, the step 1907 generates the pin region 504 at the two confronting side portions of the part within the region where the specified region 503 and the part shape overlap as shown in FIG. 26. On the other hand, if the decision result in the step 1904 is NO, it is judged that the pin layout type of the part is the third pin layout type. In the case of the third pin layout type, the user can specify the pin region generating method from a first method which generates the region according to the specified range and a second method which generates the region in units of sectioned units by determining in advance the units into which the region within the part is sectioned. If the decision result in the step 1904 is NO, a step 1905 decides whether or not the pin region generating method is the second method which generates the region in units of sectioned units.

If the decision result in the step 1905 is YES, a step 1908 generates the pin region 504. For example, the step 1908 generates the pin region 504 in units of sectioned units, that is, the specified regions 503, as shown in FIG. 28. On the other hand, if the decision result in the step 1905 is NO, a step 1909 generates the pin region 503. For example, the step 1909 generates as the pin region 504 the range where the specified region 503 and the part shape overlap.

The process ends after the step 1906, 1908 or 1909.

Figure 30A:
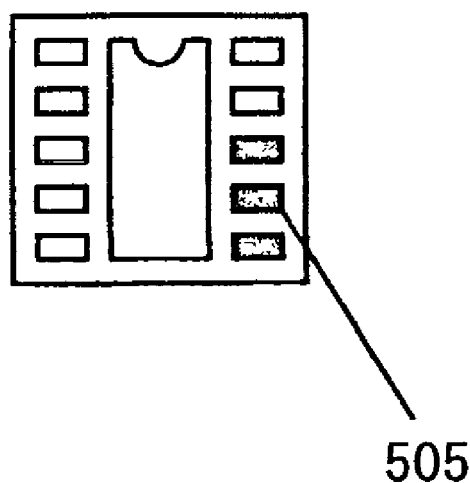
FIGS. 30A and 30B are diagrams showing a case where a pin region is defined by specifying pins which are to be treated as a region, in a part shape in which the pin layout is defined in detail.
Figure 30B:
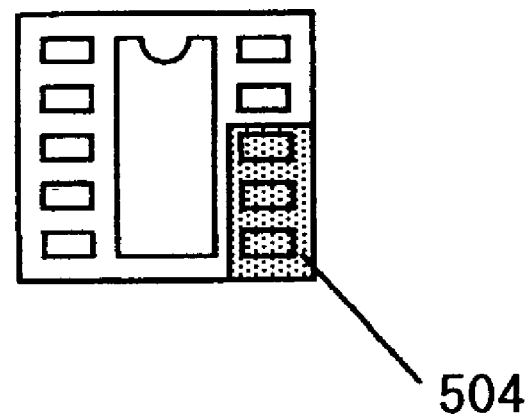

In the case of a part shape for which the pin layout is defined in detail, it is possible to define the pin region by specifying the pins which are to be treated as a region. FIGS. 30A and 30B are diagrams showing a case where the pin region is defined by specifying the pins which are to be treated as a region, in the part shape in which the pin layout is defined in detail. FIG. 30A shows pins 505 which are specified and are to be treated as a region, and FIG. 30B shows a pin region 504 which is defined depending on the pins 505 which are to be treated as a region.

Figure 31:
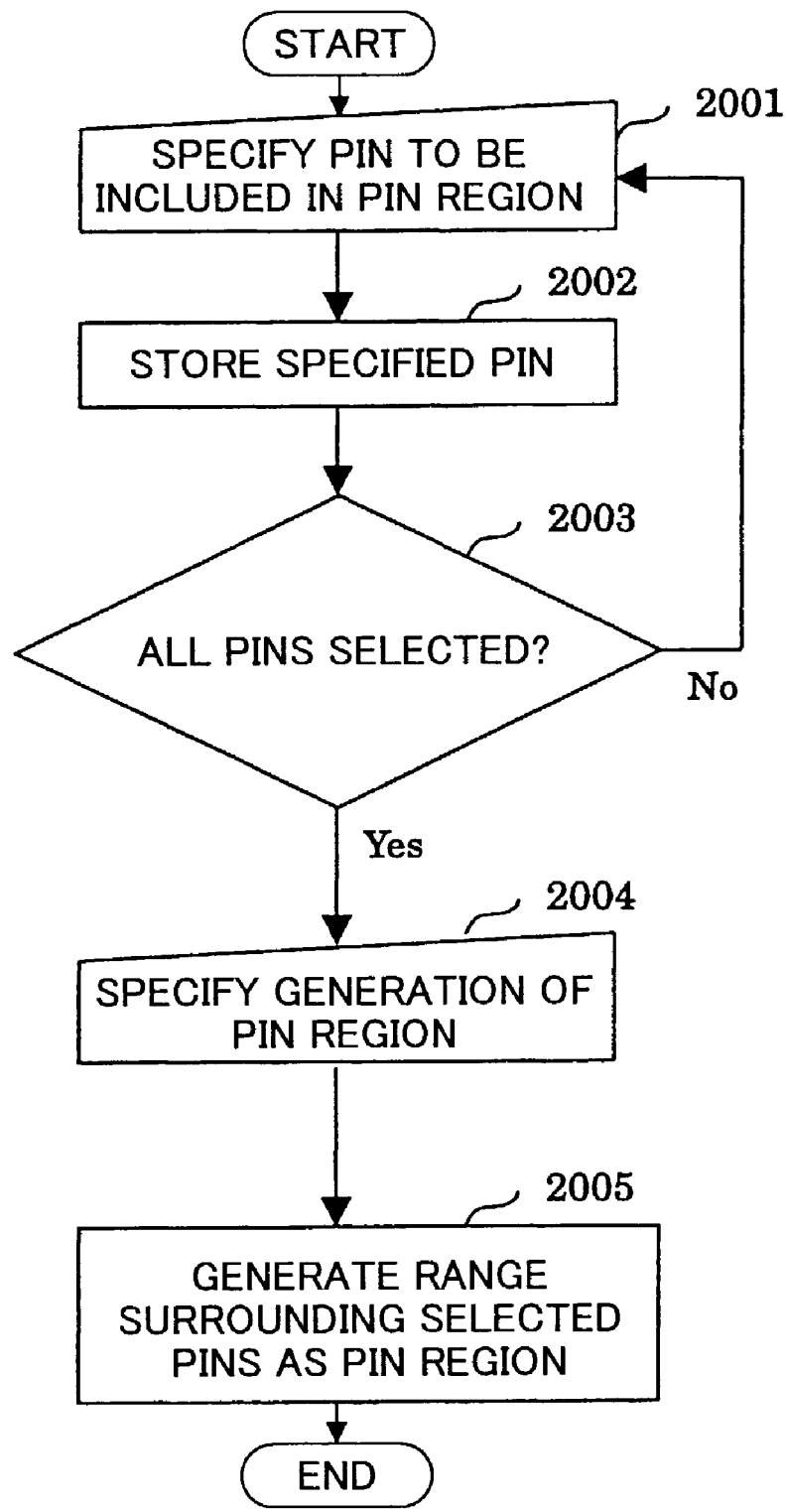
FIG. 31 is a flow chart for explaining a pin region generating process.

FIG. 31 is a flow chart for explaining a pin region generating process of the general floor planner 1 when generating the pin region 504 shown in FIG. 30B. The process shown in FIG. 31 is carried out by the CPU 201.

In FIG. 31, a step 2001 specifies each pin 505 which is to be included in the pin region ,504, using the mouse 104 or the like. A step 2002 stores the specified pins 505 in the memory section 202 or the like. A step 2003 decides whether or not all of the pins 505 which are to be included in the pin region 504 are specified. If the decision result in the step 2003 is NO, the process returns to the step 2001 to repeat the specifying of the pin 505.

On the other hand, if the decision result in the step 2003 is YES, a step 2004 specifies generation of the pin region 504. In addition, a step 2005 generates as the pin region 505 a range which surrounds the specified (selected) pins 505 as shown in FIG. 30B, and the process ends.

Figure 32:
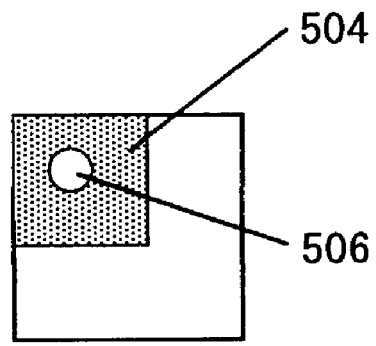
FIG. 32 is a diagram showing a state where a representative pin is arranged within a pin region.
Figure 33:
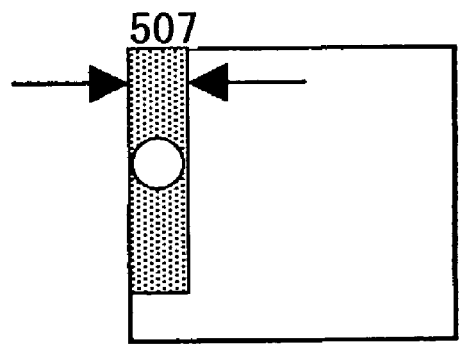
FIG. 33 is a diagram showing a width of a representative pin which is displayed depending on a pin shape specified by a user.

Next, a representative pin 506 for connecting to a bus region is arranged within the defined pin region 504. FIG. 32 is a diagram showing a state where the representative pin 506 is arranged within the pin region 504. The representative pin 506 may be arranged within the defined pin region 504, and a width 507 of the representative pin 506 is displayed as shown in FIG. 33 depending on the shape of the pin specified by the user, in the case of the first pin layout type having the pins arranged on the four sides of the part and the second pin layout type having the pins arranged on the two confronting sides of the part. FIG. 33 is a diagram showing the width 507 of the representative pin 506 which is displayed depending on the pin shape specified by the user.

Figure 34A:
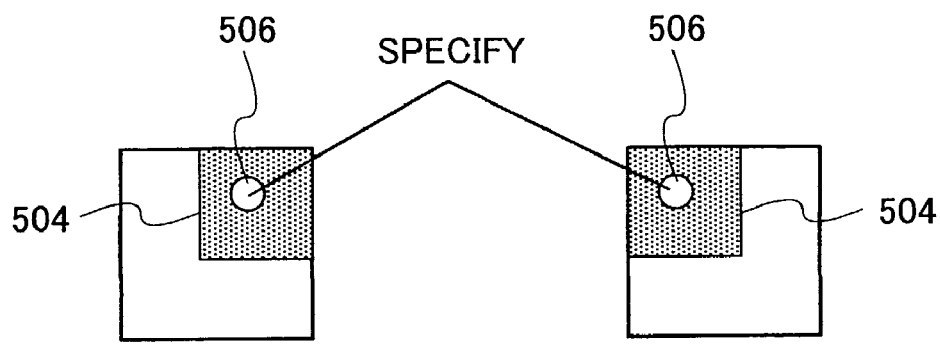
FIGS. 34A and 34B are diagrams for explaining a net connection.
Figure 34B:
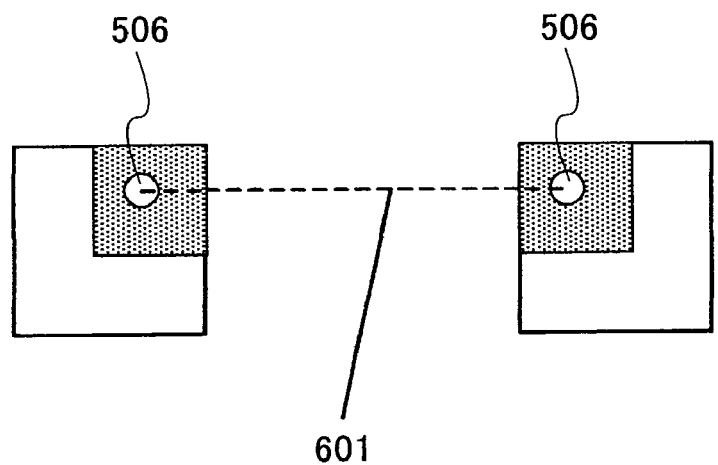

When making a net connection of the pin region 504 of the part with respect to which the bus line is to be made, the pin region 504 which is to be connected is specified as shown in FIG. 34A. A line which connects the representative pins 506 by the net connection becomes a representative net 601 as shown in FIG. 34B. FIGS. 34A and 34B are diagrams for explaining the net connection.

Figure 35A:
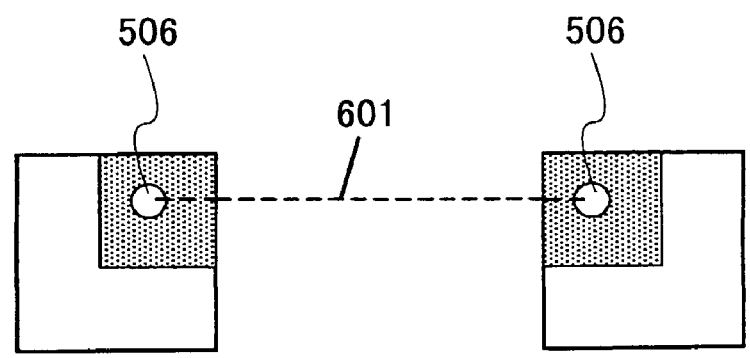
FIGS. 35A and 35B are diagrams for explaining a bus width display.
Figure 35B:
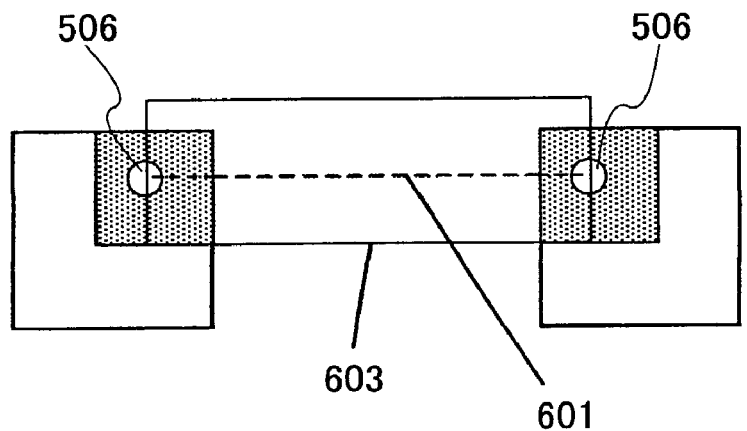

The net connection merely represents a logical connection, and originally does not have a physical width. However, when inspecting the design constraints, it would be effective to inspect the layout of the parts by taking into consideration the width of the bus. Accordingly, this embodiment specifies the number and pitch of the patterns forming the bus, after making the net connection shown in FIG. 35A, so as to display a bus width 603 as shown in FIG. 35B. FIGS. 35A and 35B are diagrams for explaining the bus width display.

Figure 36:
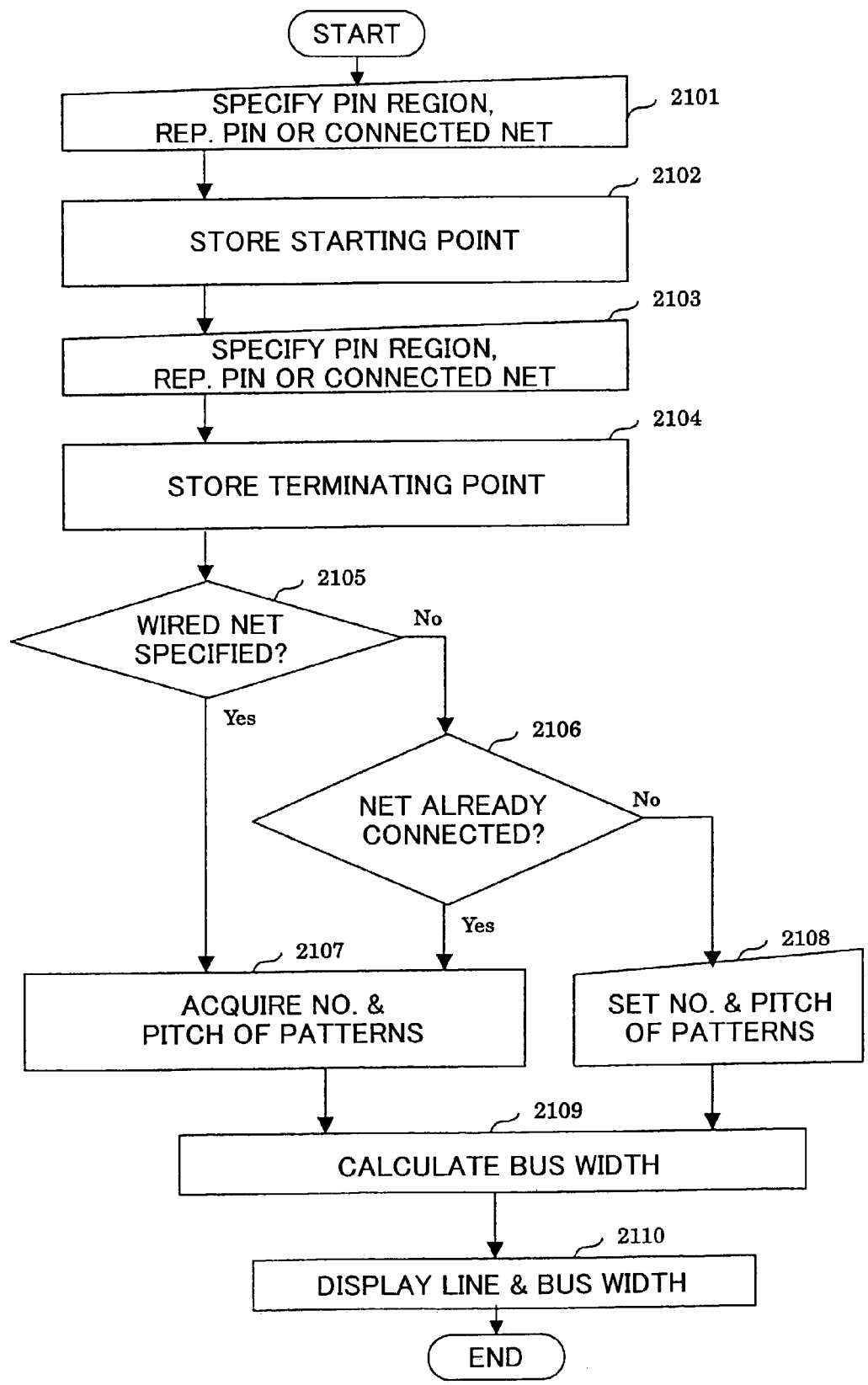
FIG. 36 is a flow chart for explaining a net connection process.

FIG. 36 is a flow chart for explaining a net connection process of the general floor planner 1. The process shown in FIG. 36 is carried out by the CPU 201.

In FIG. 36, a step 2101 specifies the pin region 504 or the representative pin 506 with respect to which a net connection is to be made or, specifies a connected net 601, using the mouse 104 or the like. A step S2102 stores the specified pin region 504, representative pin 506 or connected net 601, as a starting point, in the memory section 202 or the like. When the pin region 504 is specified, the representative pin 506 belonging to the specified pin region 504 is acquired and stored in the memory section 202 or the like. On the other hand, when the connected net 601 is specified, the specified coordinates on the connected net 601 are stored in the memory section 202 or the like.

A step 2103 specifies the pin region 504 or the representative pin 506 with respect to which a net connection is to be made or, specifies a connected net 601, using the mouse 104 or the like, similarly to the step 2101. A step 2104 stores the specified pin region 504, representative pin 506 or connected net 601, as a terminating point, in the memory section 202 or the like.

A step 2105 decides whether or not a wired net 601 is included in the specified net connection target. If the decision result in the step 2105 is YES, a step 2107 acquires the number and pitch of the patterns forming the bus, from net information of the wired net 601 included in the specified net connection.

On the other hand, if the decision result in the step 2105 is NO, a step 2106 decides whether or not the representative pin 506 at the starting point or the terminating point is a pin for which the net connection is already made. If the decision result in the step 2106 is YES, a step 2107 acquires the number and pitch of the patterns forming the bus, from net information of the net 601 which is connected to the specified pin. If the decision result in the step 2106 is NO, a step 2108 sets the number and pitch of the patterns forming the bus, as information related to the net 601 to be connected.

After the step 2107 or 2108, a step 2109 calculates the bus width 603 based on the number and pitch of the patterns acquired in the step 2107 or the number and pitch of the patterns set in the step 2108. A step 2110 displays a line connecting the starting pin and the terminating pin, as the representative pin 601, as shown in FIG. 35B. The step 2110 further displays a region of the bus width 603 using the bus width 603 calculated in the step 2109, and the process ends.

Figure 37A:
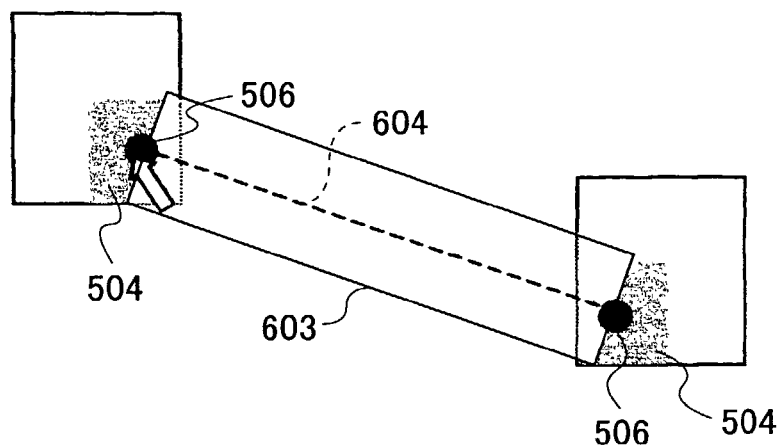
FIGS. 37A through 37C are diagrams for explaining a wiring between pin regions which are subjected to the net connection.
Figure 37B:
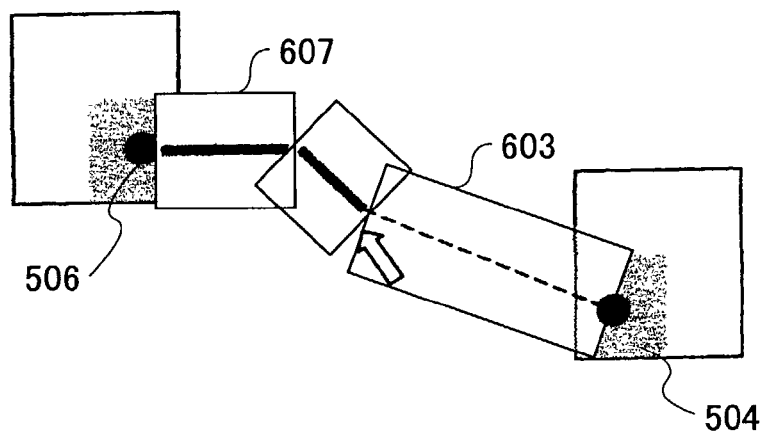
Figure 37C:
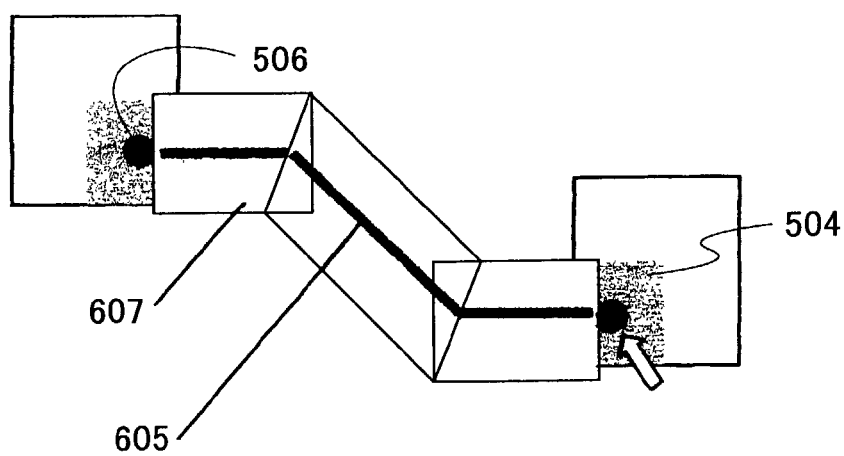

FIGS. 37A through 37C are diagrams for explaining the wiring between the pin regions which are subjected to the net connection.

When forming the bus line by specifying the actual wiring route, the defined net 601, the pin region 504 from which the wiring is to start, and the wiring route are specified in sequence. In this case, when the net connection is already made, the bus width 603 is displayed based on the number and pitch of the patterns which are specified at the time of the net connection. A line connecting the representative pins 506 along the wiring route is displayed as a representative pattern 605. In this state, the width of the representative pattern 605 is displayed with the actual wiring width, by specifying the width of the wiring pattern. FIGS. 37A through 37C show the wiring between the pin regions 504 subjected to the net connection. FIG. 37A shows the display that is made after the pattern width and the pin region are specified. FIG. 37B shows the display that is made after specifying the wiring route. In addition, FIG. 37C shows the display that is made after the specifying of the wiring route ends. In FIGS. 37A through 37C, white arrows indicate a device which is being specified, and more particularly, FIG. 37A shows the starting pin, FIG. 37B shows the wiring route and FIG. 37C shows the terminating pin.

Figure 38:
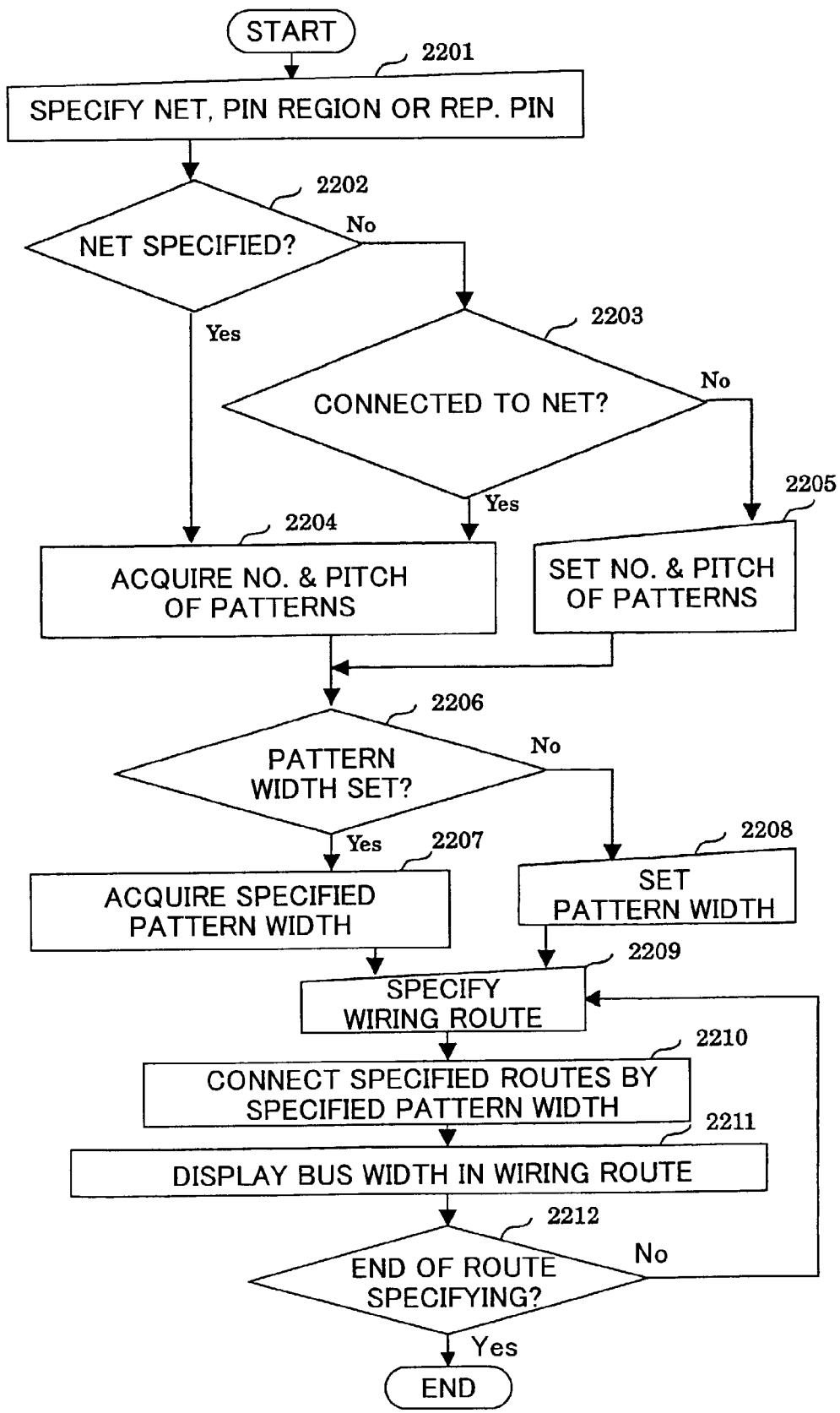
FIG. 38 is a flow chart for explaining a bus wiring process.

FIG. 38 is a flow chart for explaining a bus wiring process of the general floor planner 1. The process shown in FIG. 38 is carried out by the CPU 201.

In FIG. 38, a step 2201 specifies the pin region 504, the representative pin 506 or the net 601 which is to be subjected to the wiring. A step 2202 decides whether or not the net 601 is specified to be wired. If the decision result in the step 2202 is YES, a step 2204 acquires the number and pitch of the patterns forming the bus, from the information of the specified net 601. On the other hand, if the decision result in the step 2202 is NO, a step 2203 decides whether or not the specified pin region 504 or representative pin 506 is connected to the net 601. If the decision result in the step 2203 is YES, the step 2204 acquires the number and pitch of the patterns forming the bus, from the information of the connected net 601. If the decision result in the step 2203 is NO, a step 2205 sets the number and pitch of the patterns forming the bus to be wired.

After the step 2204 or 2205, a step 2206 decides whether or not the pattern width to be wired is already set. If the decision result in the step 2206 is YES, a step 2207 acquires the set pattern width. On the other hand, if the decision result in the step 2206 is NO, a step 2208 sets the pattern width. After the step 2207 or 2208, the display becomes as shown in FIG. 37A, and a step 2209 specifies the desired wiring route using the mouse 104 or the like. A step 2210 connects the wiring routes specified by the step 2209, and the display becomes as shown in FIG. 37B. In addition, the step 2210 displays the specified wiring route as the representative pattern 605 as shown in FIG. 37C, using the pattern width acquired in the step 2207 or the pattern width set in the step 2208. Furthermore, a step 2211 calculates the bus width from the number and pitch of the patterns, and displays a bus region 607 in the wiring route as shown in FIG. 37C. A step 2212 decides whether or not the specifying of the wiring route has ended. If the decision result in the step 2212 is NO, the process returns to the step 2209 to continue specifying of the wiring route, and the above described operation is repeated until the specifying of the wiring route ends. The process ends if the decision result in the step 2212 is YES.

Figure 39A:
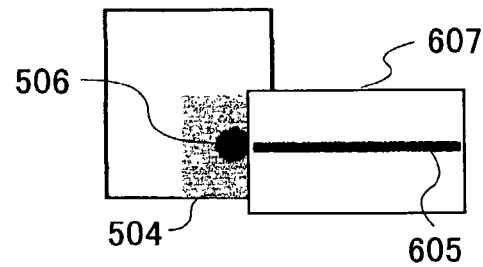
FIGS. 39A through 39C are diagrams for explaining a via region layout.
Figure 39B:
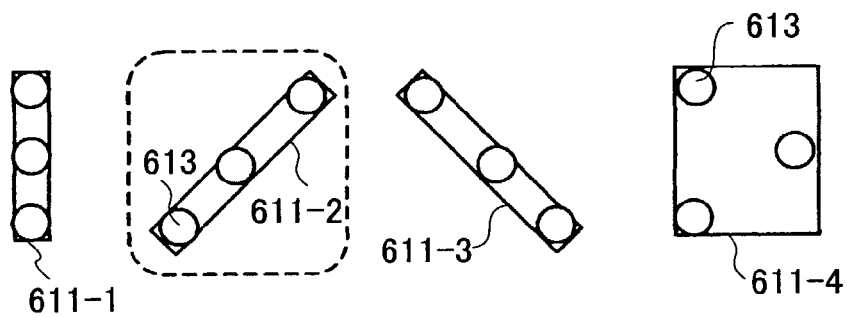
Figure 39C:
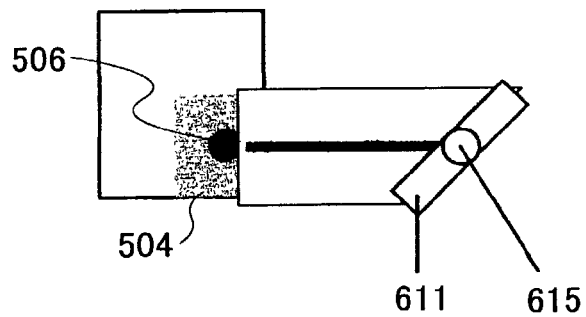

FIGS. 39A through 39C are diagrams for explaining a via region layout.

When arranging vias 613 in the wiring of the bus region 607, the via shape and the via layout pitch (or interval) are specified, so as to specify a region layout position by selecting a layout shape from a plurality of via region layout (or shape) types. In this case, a representative via 615 is displayed at an intersecting portion of the representative pattern 605 and a via region 611, and the representative via 615 is connected to the representative pattern 605. FIG. 39A shows the display when the wiring of the bus region 607 is specified, and FIG. 39B shows via regions 611-1 through 611-4 of different via region layout types. For example, when the via region layout type of the via region 611-2 shown in FIG. 39B is specified, the representative via 615 is displayed at the intersecting portion of the representative pattern 605 and the via region 611 (611-2) as shown in FIG. 39C, and the representative via 615 is connected to the representative pattern 605.

Figure 40:
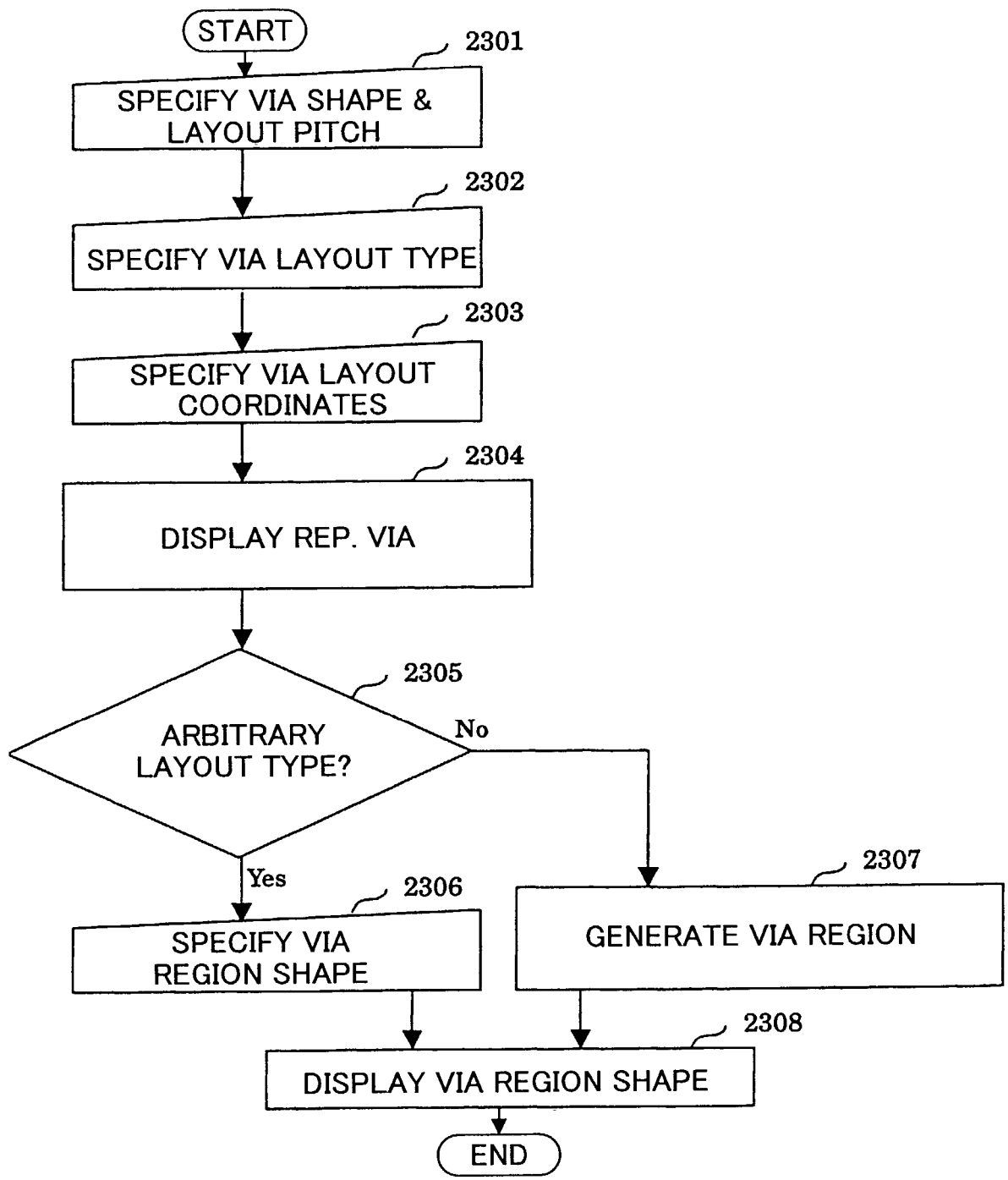
FIG. 40 is a flow chart for explaining a via region layout process.

FIG. 40 is a flow chart for explaining a via region layout process of the general floor planner 1. The process shown in FIG. 40 is carried out by the CPU 201.

In FIG. 40, a step 2301 specifies the shape of the vias 613 to be arranged and the layout pitch of the vias 613, with respect to the bus region 607 shown in FIG. 39A, for example. A step 2302 specifies the via region layout type of the vias 613, by selecting one of the via region layout types shown in FIG. 39B, for example. Accordingly, the via region layout type of the vias 613 may be selected from different types, such as the type (611-1) having the vias 613 aligned vertically with respect to the direction of the bus line and the type (611-2, 611-3) having the vias 613 aligned at a 45-degree angle with respect to the direction of the bus line. Of course, the via region layout types are not limited to those shown in FIG. 39B, and the vias 613 need not be aligned. In other words, the via region layout types include arbitrary layout types having the vias 613 which are not aligned and are arranged at arbitrary positional relationships to each other.

A step 2303 species the coordinates where the vias 613 are to be arranged, using the mouse 104 or the like. A step 2304 displays the vias 613 at the coordinates specified by the step 2303, with the layout (or shape) of the via region layout type specified by the step 2301. A step 2305 decides whether or not the via region layout type of the vias 613 specified by the step 2302 is the arbitrary layout type. If the decision result in the step 2305 is YES, a step 2306 specifies the layout (or shape) of the vias 613 within the via region 611. On the other hand, if the decision result in the step 2305 is NO, a step 2307 generates the shape of the via region 611, from the specified via layout pitch and via region layout type. After the step 2306 or 2307, a step 2308 displays the shape of the via region 611 specified by the step 2306 or the shape of the via region 611 generated by the step 2307, as shown in FIG. 39C, and the process ends.

Figure 41A:
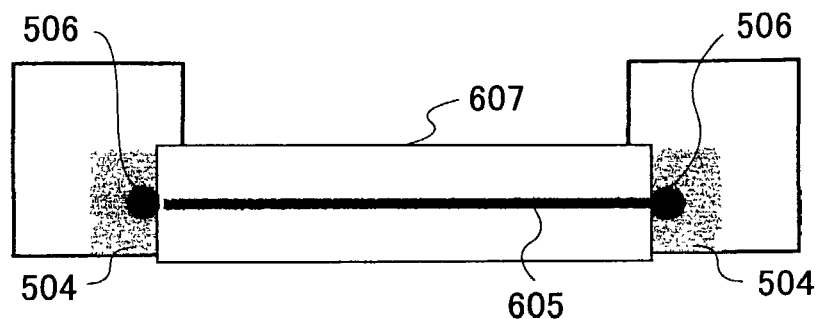
FIGS. 41A through 41C are diagrams for explaining an interconnecting part layout.
Figure 41B:
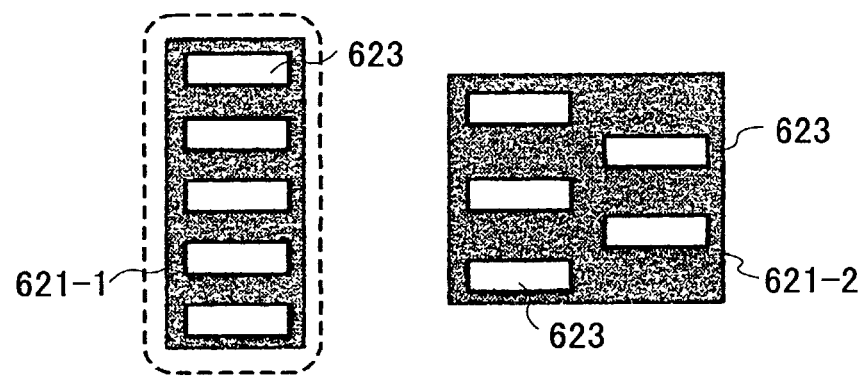
Figure 41C:
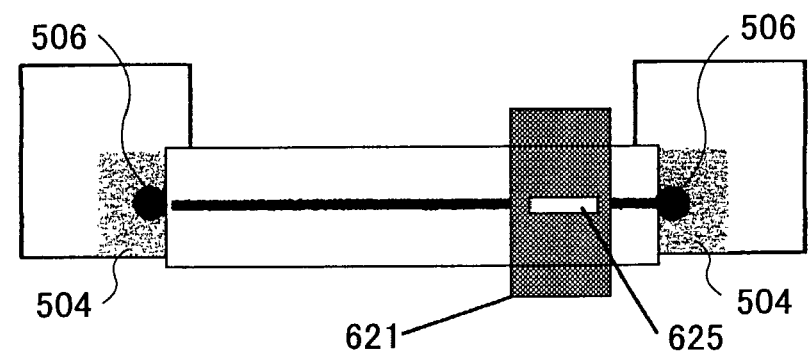

FIGS. 41A through 41C are diagrams for explaining an interconnecting part layout.

When arranging interconnecting parts 623 in the wiring of the bus region 607, the part shape is specified, and the region layout position is specified by selecting the shape in which the interconnecting parts 623 are to be arranged from a plurality of part region layout (or shape) types. In this case, a representative part 625 is displayed at an intersecting portion of the representative pattern 605 and a part region 621, and the representative part 625 is connected to the representative pattern 605. FIG. 41A shows the display when the wiring of the bus region 607 is specified, and FIG. 41B shows part regions 621-1 and 621-2 of different part region layout types. For example, when the part region layout type having one the part region is specified, the representative part 625 is displayed at the intersecting portion of the representative pattern 605 and the part region 621 as shown in FIG. 41C, and the representative part 625 is connected to the representative pattern 605.

Figure 42:
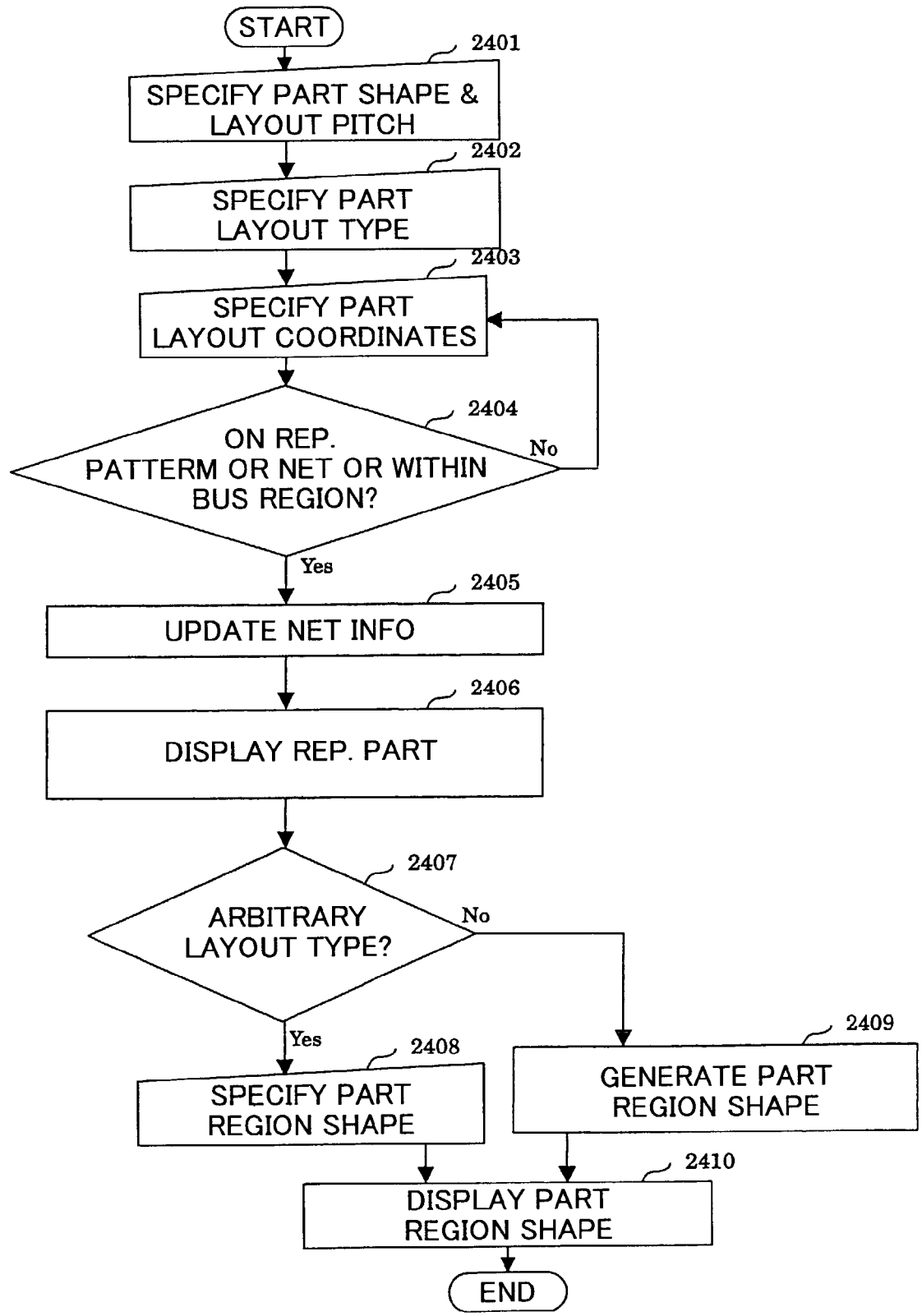
FIG. 42 is a flow chart for explaining an interconnecting part layout process.

FIG. 42 is a flow chart for explaining an interconnecting part layout process of the general floor planner 1. The process shown in FIG. 42 is carried out by the CPU 201.

In FIG. 42, a step 2401 specifies the shape of the interconnecting parts 623 to be arranged and the layout pitch of the interconnecting parts 623, with respect to the bus region 607 shown in FIG. 41A, for example. A step 2402 specifies the part region layout type of the interconnecting parts 623, by selecting one of the part region layout types shown in FIG. 41B, for example. Accordingly, the part region layout type of the interconnecting parts 623 may be selected from different types, such as the type (621-1) having the interconnecting parts 623 arranged in one column and the type (621-2) having the interconnecting parts 623 arranged in an array in two columns. Of course, the part region layout types are not limited to those shown in FIG. 41B, and the interconnecting parts 623 need not be aligned. In other words, the part region layout types include arbitrary layout types having the interconnecting parts 623 which are not aligned and are arranged at arbitrary positional relationships to each other.

A step 2403 specifies the coordinates where the interconnecting parts 623 are to be arranged, using the mouse 104 or the like. A step 2404 decides whether or not the specified coordinates indicate the coordinates within the representative pattern 605, the representative net 601 or the bus region 607. If the decision result in the step 2404 is NO, the process returns to the step 2403 to specify the coordinates again. On the other hand, if the decision result in the step 2404 is YES, a step 2405 updates connection information of the net 601, so as to insert and connect the interconnecting part 623. A step 2406 displays the interconnecting part 623 at the coordinates specified by the step 2403 with the shape specified by the step 2401. In this case, when the coordinates specified by the step 2403 are within the bus region 607 and not within the representative pattern 605 or the representative net 601, the interconnecting part 623 is displayed at coordinates which are closest to the specified coordinates and are within the representative pattern 605 or the representative net 601.

A step 2407 decides whether or not the part region layout type of the interconnecting parts 623 specified by the step 2402 is the arbitrary layout type. If the decision result in the step 2407 is YES, a step 2408 specifies the layout (shape) of the interconnecting parts 623 within the part region 621. On the other hand, if the decision result in the step 2407 is NO, a step 2409 generates the shape of the part region 621 from the specified layout pitch and the part region layout type. After the step 2408 or 2409, a step 2410 displays the shape of the part region 621 specified by the step 2408 or the shape of the part region 621 generated by the step 2409, and the process ends.

Figure 43A:
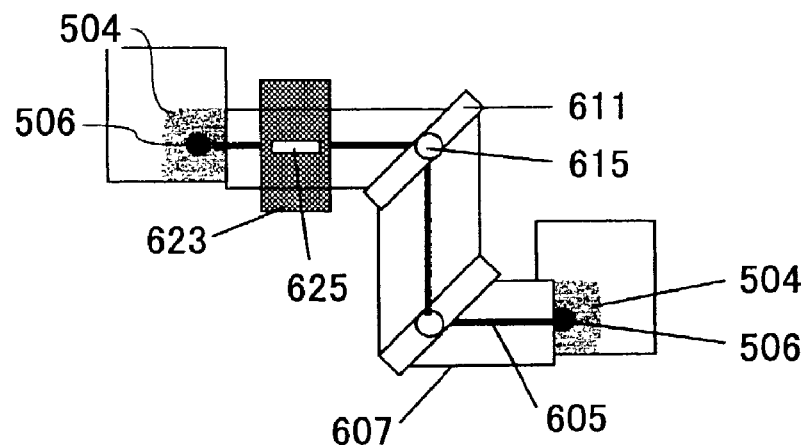
FIGS. 43A through 43C are diagrams for explaining generation of analyzing data for inspecting electrical characteristics of a wiring or net forming a bus.
Figure 43B:
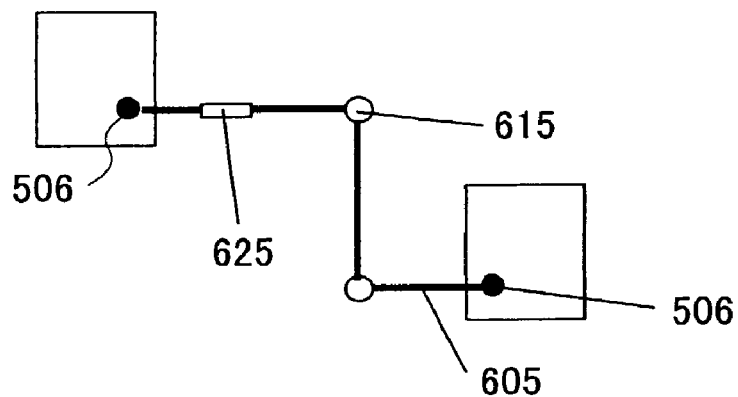
Figure 43C:
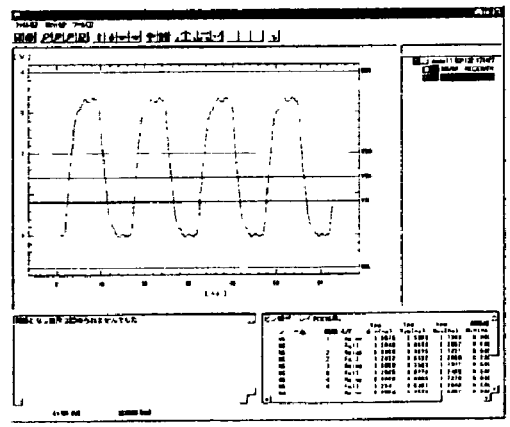

FIGS. 43A through 43C are diagrams for explaining generation of analyzing data for inspecting electrical characteristics of a wiring or net forming a bus.

When the analysis is instructed to inspect the electrical characteristics for creating the design constraints of each wiring within the bus region 607, based on the layout and wiring data designed using the various regions shown in FIG. 43A, information of the representative pin 506, the representative pattern 605 (or representative net 601), the representative via 615 and the representative part 625 is extracted as shown in FIG. 43B. Hence, when the data necessary for the analysis are generated and the analysis is carried out, an analysis result shown in FIG. 43C is displayed, and the design constraints can be created based on this analysis result.

FIG. 44 is a flow chart for explaining an analyzing data generating process of the general floor planner 1. The process shown in FIG. 44 is carried out by the CPU 201.

In FIG. 44, a step 2501 specifies the net 601 or the wiring which is to be analyzed, with respect to the layout and wiring data designed using the various regions shown in FIG. 43A. A step 2502 decides whether or not the wiring is specified in the step 2501. If the decision result in the step 2502 is YES, a step 2503 extracts the shape, layout coordinates and characteristic information of the representative pin 506, the representative via 615 and the representative part 625 connected to the specified wiring, as shown in FIG. 43B. Furthermore, a step 2504 extracts route information of the specified wiring, and a step 2507 generates analyzing data 2508.

If the net 601 is specified and the decision result in the step 2502 is NO, a step 2505 extracts the shape, layout coordinates and characteristic information of the representative pin 506 and the representative part 625 connected to the specified net 601, as shown in FIG. 43B. Further, a step 2506 generates wiring information by calculating a linear distance and a logical length between pins 506 based on the coordinates of the pins 506 connected to the specified net 601$m$, and the step 2507 generates the analyzing data 2508. The generated analyzing data 2508 becomes an input file for the various analyzing tools.

Figure 45A:
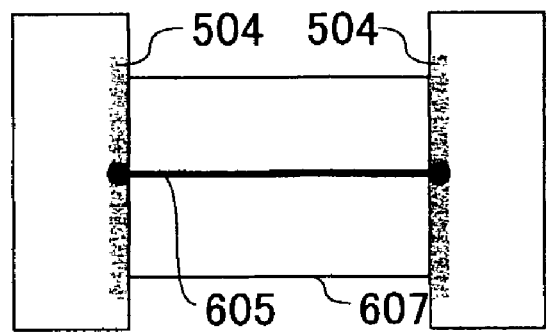
FIGS. 45A through 45C are diagrams for explaining generation of analyzing data for inspecting crosstalk noise between wirings forming a bus.
Figure 45B:
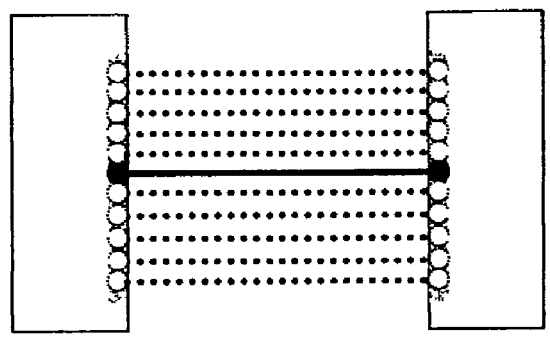
Figure 45C:
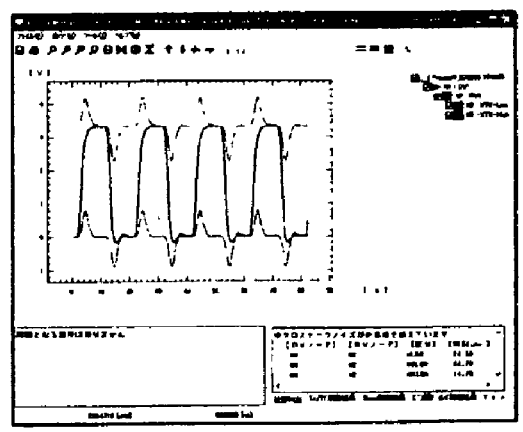

FIGS. 45A through 45C are diagrams for explaining generation of analyzing data for inspecting crosstalk noise between wirings forming a bus.

When the crosstalk noise analysis is instructed to inspect the crosstalk noise for creating the design constraints of each wiring within the bus region 607, based on the layout and wiring data designed using the various regions shown in FIG. 45A, the data necessary for the crosstalk noise analysis are generated from the information of the representative pin 506, the representative pattern 605 (or representative net 601), the representative via 615 and the representative part 625 and the information of the wiring pitch of the pattern, as shown in FIG. 45B. In FIG. 45B, adjacent wirings are indicated by dotted lines. Hence, when the crosstalk noise analysis is carried out with respect to the generated data, an analysis result shown in FIG. 45C is displayed, and the design constraints can be created based on this analysis result.

Figure 46:
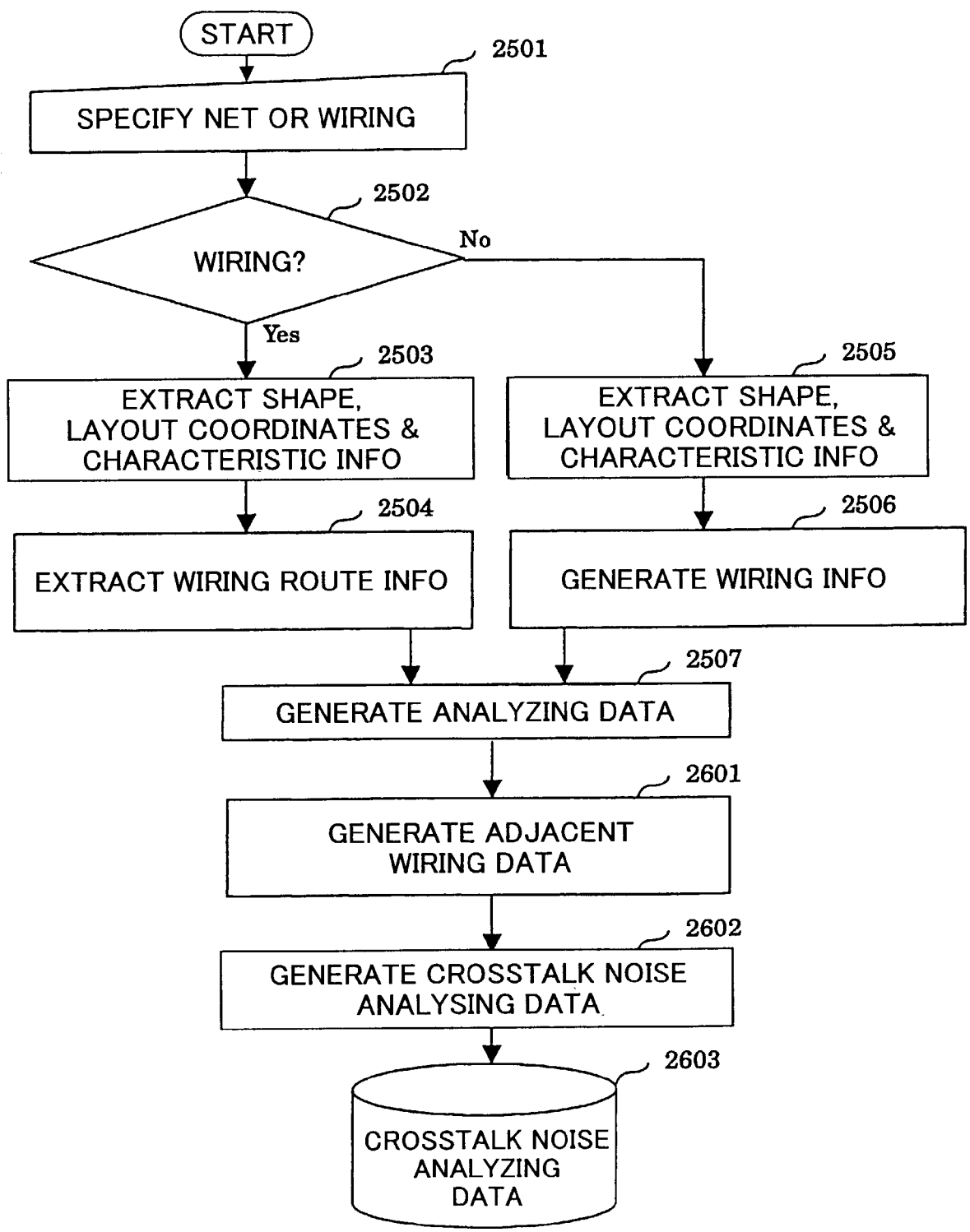
FIG. 46 is a flow chart for explaining a crosstalk noise analyzing data generating process.

FIG. 46 is a flow chart for explaining a crosstalk noise analyzing data generating process of the general floor planner 1. The process shown in FIG. 46 is carried out by the CPU 201. In FIG. 46, those steps which are the same as those corresponding steps in FIG. 44 are designated by the same reference numerals, and a description thereof will be omitted.

In FIG. 46, The steps 2501 through 2507 which are carried out with respect to the designed layout and wiring data using the various regions shown in FIG. 45A, are the same as those corresponding steps shown in FIG. 44. A step 2601 generates the data of the adjacent wirings shown in FIG. 45B, based on information related to the wiring pitch set in the net 601, the layout pitch of the vias 613 set in the via region 613, the layout pitch of the interconnecting parts 623 set in the part region 621, and the like. A step 2602 combines the data generated by the steps 2507 and 2601, and generates crosstalk analyzing data 2603. The generated crosstalk analyzing data 2603 becomes an input file for the various analyzing tools.

Therefore, this embodiment is provided with the functions of creating, editing and displaying the bus line, which is formed by regularly arranging the wiring patterns at equal intervals, as a region, based on information related to the number of patterns and the wiring pitch. For this reason, when forming the bus line for the purposes of inspecting the design constraints at the upstream stage of the circuit design, it is unnecessary to form all of the wiring patterns, to thereby enable reduction in the design time that is required to make the bus line design. In addition, since it is unnecessary to hold the wiring data for each of the wiring patterns, it is possible to reduce the amount of design data. Furthermore, when studying the part layout or the bus line, it is possible to make the inspection by referring to the region on the substrate occupied by the bus line.

In addition, by providing the functions of creating, editing and displaying the net of the bus line, which is formed by regularly arranging the wiring patterns at equal intervals, as a region, based on information related to the number of nets and the wiring pitch, it becomes unnecessary to connect all of the nets when making the net connection for the bus line, and the design time required for the net connection of the bus can be reduced. Moreover, because it is unnecessary to hold the net data for each of the nets, it is possible to reduce the amount of design data. Furthermore, the net may be referred to as the connection strength or intensity between the parts when studying the part layout.

The functions of inputting and editing the number of patterns (or nets) forming the bus and the pattern pitch when displaying the bus region, it is possible to display the region with an appropriate width based on the number of specified patterns (or nets), the pattern width and the pattern pitch. In this case, when designing the bus line using the bus region, the user can input and edit the number of patterns (or nets) forming the bus and the pattern pitch. Moreover, by displaying the bus region based on the information specified by the user, it is possible to display the region with the width intended by the user.

Further, by providing the functions of creating, editing and displaying the part pin, to which a plurality of patterns (or nets) forming the bus are connected, as a region, the pin region may be defined by various methods. For example, the pin region may be defined by specifying an arbitrary closed region, specifying a region which is sectioned in advance, and specifying a group of pins which are arranged in advance. Hence, it is unnecessary to create all of the part pins when forming the bus line for the purpose of inspecting the design constraints at the upstream stage of the circuit design, and the design time required to design the bus line can be reduced Moreover, since the pin region may be defined by various methods, such as specifying an arbitrary closed region, specifying a region which is sectioned in advance, and specifying a group of pins which are arranged in advance, the definition of the pin region can be simplified. In addition, because it is unnecessary to hold the pin data of all of the pins, the amount of design data can be reduced.

In a case where an arbitrary closed region is specified when defining the pin region, it is possible to provide the functions of specifying the pin region layout type of the part in advance to identify the range in which the region can be defined by roughly specifying the region, and generating the region only in the range in which the pin layout is possible. In this case, in the case where the arbitrary closed region is specified when defining the pin region, it is possible to prevent a region from being created erroneously in a range where the pin layout is originally impossible.

It is also possible to provide the functions of creating, editing and displaying the via, which is arranged in a plurality of patterns forming the bus, as a region. The via region may be displayed by obtaining the number of vias based on the number of patterns forming the bus, specifying a diameter, layout interval pitch (interval) and layout position of the via, and determining the shape of the via region based on the specified diameter, layout pitch (interval) and layout position of the via and the number of vias. In addition, frequently used layout position patterns of the vias may be prepared in advance, so that the user may select the desired shape of the via region from the prepared layout position patterns. The via region may be defined to an arbitrary shape. Accordingly, when forming the bus line for the purpose of inspecting the design constraints at the upstream stage of the circuit design, it is unnecessary to arrange all of the vias that are arranged in the patterns forming the bus, and the design time required to design the bus line can be reduced. Moreover, it is possible to simplify the operation of defining the via region by the user, by providing the functions of automatically generating the shape of the via region based on the shape of the via, the number of vias and the layout pitch of the via, and the functions of selecting the desired shape of the via region by the user from the frequently used layout position patterns of the vias which are prepared in advance. In addition, since it is unnecessary to hold the via data of all of the vias, it is possible to reduce the amount of design data.

It is possible to provide the functions of creating, editing and displaying the interconnecting part which is inserted, as a region, when the same part is inserted in each of the patterns (or nets) forming the bus. The part region of the interconnecting part can be displayed by obtaining the number of parts based on the number of patterns (or nets) forming the bus, specifying the external shape, the layout pitch (interval) and the layout position of the part, and determining the shape of the region based on the specified external shape, layout pitch and layout position of the part and the number of parts. The part region may be defined to an arbitrary shape. In this case, when forming the bus line for the purpose of inspecting the design constraints at the upstream stage of the circuit design, it is unnecessary to arrange all of the parts that are inserted in the patterns (or nets) forming the bus, and the design time required to design the bus line can be reduced. Moreover, it is possible to simplify the operation of defining the part region by the user, by providing the functions of automatically generating the shape of the part region based on the shape of the part, the number of parts and the layout pitch of the part, and the functions of selecting the desired shape of the part region by the user from the frequently used layout position patterns of the parts which are prepared in advance. In addition, since it is unnecessary to hold the part data of all of the parts, it is possible to reduce the amount of design data.

The functions of enabling definition of the representative pin, the representative pattern, the representative net, the representative via and the representative part in each of the pin region, the bus region, the via region and the part region, and displaying the defined representative pin, representative pattern, representative net, representative via and representative part may also be provided. The electrical connection between the pair of pin regions, bus regions, via regions and part regions can be made by connecting the corresponding pair of representative pins, representative patterns, representative nets, representative vias and representative parts.

It is possible to set attribute information with respect to the representative pin, the representative pattern, the representative net, the representative via and the representative part, which respectively act as representatives for all pins included in the pin region, all patterns (or nets) included in the bus region, all vias included in the via region, and all parts included in the part region. In this case, it is possible to design the electronic circuit using the regions, since the pair of pin regions, bus regions, via regions and part regions can be connected by the representative pin, the representative pattern, the representative net, the representative via and the representative part. Further, by providing the function of setting the attribute information with respect to the representative pin, the representative pattern, the representative net, the representative via and the representative part, which respectively act as representatives for all pins included in the pin region, all patterns (or nets) included in the bus region, all vias included in the via region, and all parts included in the part region, it is possible to reduce the time required to input the attribute information, and to reduce the design time required to design the bus line.

It is also possible to provide the functions of generating the data required by the analyzing tool based on the shape, coordinates and electrical characteristic of the representative pin, the representative pattern (or representative net), the representative via and the representative part, in the net of the bus line designed using the pin region, the bus region, the via region and the part region and which net is formed by the representative pin, the representative pattern (or representative net), the representative via and the representative part, and creating the design constraints based on the analysis result which is obtained by making the analysis using the generated data. The created design constraints are applicable to other wirings forming the bus. In this case, in the bus line design data using the regions, the analysis can be made by the analyzing tool using the representative pin, the representative pattern (or representative net), the representative via and the representative part, and it is possible to inspect the electrical characteristic for forming the design constraints of each wiring within the bus. In addition, since the created design constraints are applicable to the other wirings forming the bus, it is unnecessary to create the design constraints for each wiring, and the operation time required to create the design constraints of the bus line can be reduced.

With respect to the data obtained by carrying out the layout and wiring design using the pin region, the bus region, the via region and the part region, it is possible to make the crosstalk noise analysis using the information of the representative pin, the representative pattern (or representative net), the representative via and the representative part, and the wiring pitch set for the bus region, so that the design constraints may be created based on the analysis result of the crosstalk noise analysis. In this case, with respect to the design data of the bus line using the regions, the crosstalk noise analysis using the analyzing tool can be made based on the information of the representative pin, the representative pattern (or representative net), the representative via and the representative part, and the wiring pitch set for the bus region, and thus, it is possible to inspect the electrical characteristic for creating the design constraints of the bus. Moreover, the design time can be reduced because it is unnecessary to form the wiring for all of the patterns.

Further, the present invention is not limited to these embodiments, but various variations and modifications may be made without departing from the scope of the present invention.

What is claimed is:

1. An electronic circuit designing method for designing an electronic circuit by CAD, comprising:
    generating design constraints with respect to the electronic circuit based on general layout and wiring information including registration information related to substrate external shapes and device external shapes registered by a user, a device mounting position definition defined by the user, and at least one of user requirements defined by the user, and user resources defined by the user; and
    displaying the design constraints,
    wherein the user requirements include at least one of requirements selected from a group consisting of signal integrity and delay, electromagnetic interference, electromagnetic compatibility limitations, junction temperature, and cost and reliability, and
    the user resources include at least one of resources selected from a group consisting of substrate specifications, device specifications and junction temperatures.

2. The electronic circuit designing method as claimed in claim 1, further comprising:
    mapping external shape information and device coordinates to a layout and wiring editor based on the design constraints and circuit information having the design constraints related thereto.

3. The electronic circuit designing method as claimed in claim 2, further comprising:
    carrying out a wiring operation if a result of the mapping satisfies the design constraints.

4. The electronic circuit designing method as claimed in claim 1, wherein:
    the substrate specifications include at least one factor selected from a group consisting of substrate technology, number of layers, layer structure, thickness, via and land specifications, minimum line width and minimum pitch;
    the device specifications include at least one factor selected from a group consisting of kind of device, electrical characteristic, power consumption characteristic, device package and method or kind of thermal conduction, kind of heat radiator fins, reliability and cost; and
    the junction temperatures include at least one factor selected from a group consisting of ambient temperature, air supplying structure, fan specifications, air flow direction and amount of air flow.

5. The electronic circuit designing method as claimed in claim 1, further comprising:
    inputting at least one of the general layout and wiring information, the user requirements and the user resources.

6. The electronic circuit designing method as claimed in claim 1, wherein each of items of the user resources includes priority information indicating respective priorities with which the items of the user resources are to be selected, and said generating generates the design constraints by selecting the items of the user resources in an order according to priority starting from the item having a highest priority.

7. The electronic circuit designing method as claimed in claim 1, wherein said generating includes:
    setting initial values of the design constraints or listing candidates of a rule-based solution on a display;
    making an analysis using an analyzing tool by changing parameter values in a predetermined range, and enlarging a search range by searching a solution space satisfying the user requirements or, carrying out a simulation using the analyzing tool so as to narrow the solution satisfying the user requirements; and
    generating and displaying a plurality of candidates of the design constraints on the display with respect to the user.

8. The electronic circuit designing method as claimed in claim 1, further comprising:
    changing at least one of the user requirements and the user resources based on an input made by the user in response to the design constraints that are displayed.

9. The electronic circuit designing method as claimed in claim 1, wherein the design constraints are represented by at least one of a representation of layout constraints, a representation of design constraints of nets, and a representation of conditions related to junction temperatures.

10. An electronic circuit designing apparatus for designing an electronic circuit by CAD, comprising:
    generating means for generating design constraints with respect to the electronic circuit based on general layout and wiring information including registration information related to substrate external shapes and device external shapes registered by a user, a device mounting position definition defined by the user, and at least one of user requirements defined by the user and user resources defined by the user; and
    display means for displaying the design constraints,
    wherein the user requirements include at least one of requirements selected from a group consisting of signal integrity and delay, electromagnetic interference, electromagnetic compatibility limitations, junction temperature, and cost and reliability, and
    the user resources include at least one of resources selected from a group consisting of substrate specifications, device specifications and junction temperatures.

11. The electronic circuit designing apparatus as claimed in claim 10, wherein:

the substrate specifications include at least one factor selected from a group consisting of substrate technology, number of layers, layer structure, thickness, via and land specifications, minimum line width and minimum pitch;

the device specifications include at least one factor selected from a group consisting of kind of device, electrical characteristic, power consumption characteristic, device package and apparatus or kind of thermal conduction, kind of heat radiator fins, reliability and cost; and the junction temperatures include at least one factor selected from a group consisting of ambient temperature, air supplying structure, fan specifications, air flow direction and amount of air flow.

12. The electronic circuit designing apparatus as claimed in claim 10, further comprising:

means for inputting at least one of the general layout and wiring information, the user requirements and the user resources.

13. The electronic circuit designing apparatus as claimed in claim 10, wherein each of items of the user resources includes priority information indicating respective priorities with which the items of the user resources are to be selected, and said generating means generates the design constraints by selecting the items of the user resources in an order according to priority starting from the item having a highest priority.

14. The electronic circuit designing apparatus as claimed in claim 10, wherein said generating means includes:

means for setting initial values of the design constraints or listing candidates of a rule-based solution on a display;

means for making an analysis using an analyzing tool by changing parameter values in a predetermined range, and enlarging a search range by searching a solution space satisfying the user requirements or, carrying out a simulation using the analyzing tool so as to narrow the solution satisfying the user requirements; and means for generating and displaying a plurality of candidates of the design constraints on the display with respect to the user.

15. A computer-readable storage medium which stores a program for causing a computer to design an electronic circuit by CAD, said program comprising:

a generating procedure causing the computer to generate design constraints with respect to the electronic circuit based on general layout and wiring information including registration information related to substrate external shapes and device external shapes registered by a user, a device mounting position definition defined by the user, and at least one of user requirements defined by the user and user resources defined by the user; and a displaying procedure causing the computer to display the design constraints, wherein the user requirements include at least one of requirements selected from a group consisting of signal integrity and delay, electromagnetic interference, electromagnetic compatibility limitations, junction temperature, and cost and reliability, and the user resources include at least one of resources selected from a group consisting of substrate specifications, device specifications and junction temperatures.

16. The computer-readable storage medium as claimed in claim 15, wherein:

the substrate specifications include at least one factor selected from a group consisting of substrate technology, number of layers, layer structure, thickness, via and land specifications, minimum line width and minimum pitch;

the device specifications include at least one factor selected from a group consisting of kind of device, electrical characteristic, power consumption characteristic, device package and method or kind of thermal conduction, kind of heat radiator fins, reliability and cost; and the junction temperatures include at least one factor selected from a group consisting of ambient temperature, air supplying structure, fan specifications, air flow direction and amount of air flow.

17. The computer-readable storage medium as claimed in claim 15, said program further comprising:

an inputting procedure causing the computer to input at least one of the general layout and wiring information, the user requirements and the user resources.

18. The computer-readable storage medium as claimed in claim 15, wherein each of items of the user resources includes priority information indicating respective priorities with which the items of the user recourses are to be selected, and said generating procedure causes the computer to generate the design constraints by selecting the items of the user resources in an order according to priority starting from the item having a highest priority.

19. The computer-readable storage medium as claimed in claim 15, wherein said generating procedure causes the computer to:

set initial values of the design constraints or listing candidates of a rule-based solution on a display;

make an analysis using an analyzing tool by changing parameter values in a predetermined range, and enlarging a search range by searching a solution space satisfying the user requirements or, carrying out a simulation using the analyzing tool so as to narrow the solution satisfying the user requirements; and generate and display a plurality of candidates of the design constraints on the display with respect to the user.

20. The computer-readable storage medium as claimed in claim 15, wherein said program further comprises:

a procedure causing the computer to change at least one of the user requirements and the user resources based on an input made by the user in response to the design constraints that are displayed by the displaying procedure.

21. The computer-readable storage medium as claimed in claim 20, wherein the design constraints are represented by at least one of a representation of layout constraints, a representation of design constraints of nets, and a representation of conditions related to junction temperatures.

22. An electronic circuit designing apparatus for designing an electronic circuit by CAD, comprising:

a generating part configured to generate design constraints with respect to the electronic circuit based on general layout and wiring information including registration information related to substrate external shapes and device external shapes registered by a user, a device mounting position definition defined by the user, and at least one of user requirements defined by the user and user resources defined by the user; and a displaying part configured to display the design constraints, wherein the user requirements include at least one of requirements selected from a group consisting of signal integrity and delay, electromagnetic interference, electromagnetic compatibility limitations, junction temperature, and cost and reliability, and the user resources include at least one of resources selected from a group consisting of substrate specifications, device specifications and junction temperatures.

23. The electronic circuit designing apparatus as claimed in claim 22, further comprising:

a changing part configured to change at least one of the user requirements and the user resources based on an input made by the user in response to the design constraints that are displayed by said displaying part.

24. The electronic circuit designing apparatus as claimed in claim 22, wherein the design constraints are represented by at least one of a representation of layout constraints, a representation of design constraints of nets, and a representation of conditions related to junction temperatures.

* * * * *